US012032290B2

(12) United States Patent
Asakawa et al.

(10) Patent No.: US 12,032,290 B2
(45) Date of Patent: Jul. 9, 2024

(54) ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Daisuke Asakawa, Shizuoka (JP); Takashi Kawashima, Shizuoka (JP); Akiyoshi Goto, Shizuoka (JP); Michihiro Shirakawa, Shizuoka (JP); Kei Yamamoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 489 days.

(21) Appl. No.: 17/344,967

(22) Filed: Jun. 11, 2021

(65) Prior Publication Data

US 2021/0318616 A1 Oct. 14, 2021

Related U.S. Application Data

(63) Continuation of application No. PCT/JP2019/047718, filed on Dec. 5, 2019.

(30) Foreign Application Priority Data

Dec. 21, 2018 (JP) ................................ 2018-239960

(51) Int. Cl.

| | |
|---|---|
| ***G03F 7/039*** | (2006.01) |
| ***G03F 7/004*** | (2006.01) |
| ***G03F 7/20*** | (2006.01) |
| ***G03F 7/30*** | (2006.01) |
| ***G03F 7/32*** | (2006.01) |
| ***G03F 7/40*** | (2006.01) |

(52) U.S. Cl.

CPC .......... *G03F 7/0397* (2013.01); *G03F 7/0045* (2013.01); *G03F 7/2004* (2013.01); *G03F 7/30* (2013.01); *G03F 7/322* (2013.01); *G03F 7/327* (2013.01); *G03F 7/40* (2013.01)

(58) Field of Classification Search

CPC ......... G03F 7/0397; G03F 7/30; G03F 7/0045

See application file for complete search history.

(56) References Cited

U.S. PATENT DOCUMENTS

| | | | | |
|---|---|---|---|---|
| 8,999,621 | B2 * | 4/2015 | Enomoto | G03F 7/0382 430/905 |
| 2012/0082939 | A1 | 4/2012 | Kawabata et al. | |
| 2012/0148957 | A1 | 6/2012 | Enomoto et al. | |
| 2019/0294043 | A1 | 9/2019 | Asakawa et al. | |

FOREIGN PATENT DOCUMENTS

| | | | | |
|---|---|---|---|---|
| JP | 2000131847 | * | 5/2000 | G03F 7/039 |
| JP | 2006091579 | | 4/2006 | |
| JP | 2006227180 | * | 8/2006 | G03F 7/039 |
| JP | 2011100089 | | 5/2011 | |
| JP | 2012078723 | | 4/2012 | |
| JP | 2012255845 | | 12/2012 | |
| JP | 2014174428 | | 9/2014 | |
| JP | 2016057415 | | 4/2016 | |
| KR | 1020120093179 | | 8/2012 | |
| WO | 2014034190 | | 3/2014 | |
| WO | 2018116916 | | 6/2018 | |

OTHER PUBLICATIONS

"International Search Report (Form PCT/ISA/210) of PCT/JP2019/047718," mailed on Feb. 18, 2020, with English translation thereof, pp. 1-7.

"Written Opinion of the International Searching Authority (Form PCT/ISA/237)" of PCT/JP2019/047718, mailed on Feb. 18, 2020, with English translation thereof, pp. 1-10.

"Office Action of Japan Counterpart Application" with English translation thereof, issued on Sep. 20, 2022, p. 1-p. 6.

"Office Action of Korea Counterpart Application" with English translation thereof, issued on May 10, 2023, p. 1-p. 15.

Office Action of Japan Counterpart Application, with English translation thereof, issued on Mar. 29, 2022, pp. 1-6.

Office Action of Korean Counterpart Application, with English translation thereof, issued on Sep. 27, 2023, pp. 1-9.

* cited by examiner

*Primary Examiner* — John S Chu

(74) *Attorney, Agent, or Firm* — JCIPRNET

(57) ABSTRACT

According to the present invention, an actinic ray-sensitive or radiation-sensitive resin composition including a resin P having a repeating unit represented by General Formula (P1) and a compound that generates an acid having a pKa of −1.40 or more upon irradiation with actinic rays or radiation; and a resist film, a pattern forming method, and a method for manufacturing an electronic device, each using the composition, are provided.

(P1)

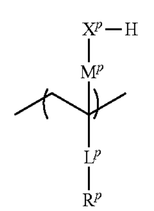

$M^P$ represents a single bond or a divalent linking group.
$L^P$ represents a divalent linking group.
$X^P$ represents O, S, or $NR^{N1}$. $R^{N1}$ represents a hydrogen atom or a monovalent organic group.
$R^P$ represents a monovalent organic group.

13 Claims, No Drawings

ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

CROSS REFERENCE TO RELATED APPLICATIONS

This is a continuation of International Application No. PCT/JP2019/047718 filed on Dec. 5, 2019, and claims priority from Japanese Patent Application No. 2018-239960 filed on Dec. 21, 2018, the entire content of which is incorporated herein by reference.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

In processes for manufacturing semiconductor devices such as an integrated circuit (IC) and a large scale integrated circuit (LSI) in the related art, microfabrication by lithography using a chemically amplified resist composition has been performed.

For example, JP2000-131847A describes a resist composition including a resin having an α-hydroxymethyl acrylate skeleton and triphenylsulfonium hexafluoroantimonate.

In addition, WO2014/034190A describes a resist composition containing a specific photoacid generator.

SUMMARY OF THE INVENTION

In recent years, further miniaturization of a pattern obtained by lithography has been required, along which it has been required to form a pattern having a small line width roughness (LWR), a small line edge roughness (LER), and an excellent critical dimension roughness (CDU) even in the formation of an ultrafine pattern whose pattern size typified by a line width, a hole diameter, and the like of a pattern is, for example, 45 nm or less. In addition, it has also been required to improve an exposure latitude (EL).

An object of the present invention is to provide an actinic ray-sensitive or radiation-sensitive resin composition which has an excellent EL, a small LWR, a small LER, and an excellent CDU in the formation of an ultrafine pattern (for example, a line-and-space pattern with a line width of 45 nm or a hole pattern with a hole size of 45 nm or less); and a resist film, a pattern forming method, and a method for manufacturing an electronic device, each using the actinic ray-sensitive or radiation-sensitive resin composition.

The present inventors have conducted intensive studies to solve the problems, and as a result, they have found that the object can be accomplished by the following configurations, thereby completing the present invention. That is, the present invention is as follows.

<1> An actinic ray-sensitive or radiation-sensitive resin composition comprising:

a resin P having a repeating unit represented by General Formula (P1); and a photoacid generator Aw, in which the photoacid generator Aw is a compound that generates an acid having a pKa of −1.40 or more upon irradiation with actinic rays or radiation.

(P1)

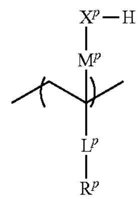

In General Formula (P1), $M^p$ represents a single bond or a divalent linking group.

$L^p$ represents a divalent linking group.

$X^p$ represents O, S, or $NR^{N1}$. $R^{N1}$ represents a hydrogen atom or a monovalent organic group.

$R^p$ represents a monovalent organic group.

<2> The actinic ray-sensitive or radiation-sensitive resin composition as described in <1>, in which the acid having a pKa of −1.40 or more is a sulfonic acid.

<3> The actinic ray-sensitive or radiation-sensitive resin composition as described in <1> or <2>, in which the acid having a pKa of −1.40 or more is a sulfonic acid represented by any of General Formulae (Aw-1), (Aw-2), and (I) to (V).

(Aw-1)

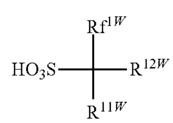

(Aw-2)

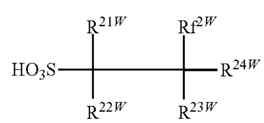

(I)

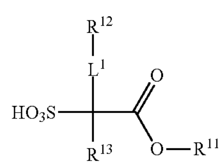

(II)

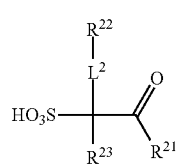

(III)

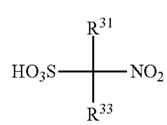

(IV)

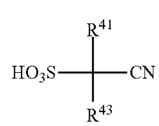

-continued (V)

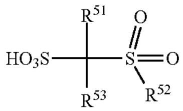

In General Formula (Aw-1), $R^{11W}$ represents a hydrogen atom or a monovalent organic group. $R^{12W}$ represents a monovalent organic group. $Rf^{1W}$ represents a hydrogen atom, a fluorine atom, or a monovalent organic group.

In General Formula (Aw-2), $R^{21W}$, $R^{22W}$, and $R^{23W}$ each independently represent a hydrogen atom, a fluorine atom, or a monovalent organic group. $R^{24W}$ represents a monovalent organic group. $Rf^{2W}$ represents a fluorine atom or a monovalent organic group including a fluorine atom.

In General Formula (I), $R^{11}$ and $R^{12}$ each independently represent a monovalent organic group. $R^{13}$ represents a hydrogen atom or a monovalent organic group. $L^1$ represents a group represented by —CO—O—, —CO—, —O—, —S—, —O—CO—, —S—CO—, or —CO—S—. Two selected from $R^{11}$, $R^{12}$, and $R^{13}$ may be bonded to each other to form a ring.

In General Formula (II), $R^{21}$ and $R^{22}$ each independently represent a monovalent organic group. $R^{23}$ represents a hydrogen atom or a monovalent organic group. $L^2$ represents a group represented by —CO—, —O—, —S—, —O—CO—, —S—CO—, or —CO—S—. Two selected from $R^{21}$, $R^{22}$, and $R^{23}$ may be bonded to each other to form a ring.

In General Formula (III), $R^{31}$ and $R^{33}$ each independently represent a hydrogen atom or a monovalent organic group. $R^{31}$ and $R^{33}$ may be bonded to each other to form a ring.

In General Formula (IV), $R^{41}$ and $R^{43}$ each independently represent a hydrogen atom or a monovalent organic group. $R^{41}$ and $R^{43}$ may be bonded to each other to form a ring.

In General Formula (V), $R^{51}$, $R^{52}$, and $R^{53}$ each independently represent a hydrogen atom or a monovalent organic group. Two selected from $R^{51}$, $R^{52}$, and $R^{53}$ may be bonded to each other to form a ring.

<4> The actinic ray-sensitive or radiation-sensitive resin composition as described in any one of <1> to <3>, in which the acid having a pKa of −1.40 or more is an alkylsulfonic acid, the alkylsulfonic acid is:

an alkylsulfonic acid including no fluorine atom or an alkylsulfonic acid having a fluorine atom or a fluoroalkyl group bonded to a carbon atom at an α-position of a sulfonic acid group, in which a total of the number of the fluorine atoms bonded to the carbon atom at the α-position of the sulfonic acid group and the number of the fluoroalkyl groups bonded to the carbon atom at the α-position of the sulfonic acid group is 1.

<5> The actinic ray-sensitive or radiation-sensitive resin composition as described in any one of <1> to <4>, in which a group represented by $L^P$-$R^P$ in General formula (P1) includes an acid-decomposable group.

<6> The actinic ray-sensitive or radiation-sensitive resin composition as described in any one of <1> to <4>, in which a group represented by $L^P$-$R^P$ in General formula (P1) includes a polar group, and the polar group is at least one group selected from the group consisting of an ester group, a sulfonate group, a sulfonamide group, a carboxylic acid group, a sulfonic acid group, a carbonate group, a carbamate group, a hydroxy group, a sulfoxide group, a sulfonyl group, a ketone group, an imide group, an amide group, a sulfonimide group, a cyano group, a nitro group, and an ether group.

<7> The actinic ray-sensitive or radiation-sensitive resin composition as described in any one of <1> to <6>, in which $L^P$ represents —CO—O—, —CO—, —$NR^{L1}$—, a divalent aromatic group, or a divalent linking group formed by combination thereof, provided that $R^{L1}$ represents a hydrogen atom or a monovalent organic group.

<8> The actinic ray-sensitive or radiation-sensitive resin composition as described in any one of <1> to <7>, in which $M^P$ represents a single bond or an alkylene group having 1 to 5 carbon atoms.

<9> The actinic ray-sensitive or radiation-sensitive resin composition as described in any one of <1> to <8>, in which the repeating unit represented by General Formula (P1) is a repeating unit represented by General Formula (P2) or (P3).

(P2)

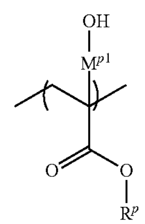

In General Formula (P2), $M^{P1}$ represents a single bond or an alkylene group having 1 to 5 carbon atoms.

$R^P$ represents a monovalent organic group.

(P3)

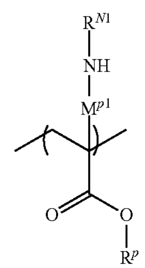

In General Formula (P3), $M^{P1}$ represents a single bond or an alkylene group having 1 to 5 carbon atoms.

$R^P$ represents a monovalent organic group.

$R^{N1}$ represents a hydrogen atom or a monovalent organic group.

<10> The actinic ray-sensitive or radiation-sensitive resin composition as described in <9>, in which $R^P$ is represented by General Formula (RP-1) or (RP-2).

(RP-1)

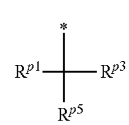

In General Formula (RP-1), $R^{p1}$ to $R^{p3}$ each independently represent an alkyl group, a cycloalkyl group, or an aryl group.

Any two of $R^{p1}$, $R^{p2}$, or $R^{p3}$ may be bonded to each other to form a ring structure.

* represents a bonding site to the oxygen atom to which $R^p$ is bonded.

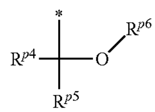

(RP-2)

In General Formula (RP-2), $R^{p4}$ and $R^{p5}$ each independently represent a hydrogen atom, an alkyl group, or a cycloalkyl group.

$R^{p6}$ represents an alkyl group or a cycloalkyl group.

Any two of $R^{p4}$, $R^{p5}$, or $R^{p6}$ may be bonded to each other to form a ring structure.

* represents a bonding site to the oxygen atom to which $R^p$ is bonded.

<11> The actinic ray-sensitive or radiation-sensitive resin composition as described in any one of <1> to <10>, in which the resin P further includes a repeating unit K1 having an acid-decomposable group, which is different from the repeating unit represented by General Formula (P1).

<12> The actinic ray-sensitive or radiation-sensitive resin composition as described in any one of <1> to <11>, in which the resin P further includes a repeating unit K2 having a polar group, which is different from the repeating unit represented by General Formula (P1).

<13> The actinic ray-sensitive or radiation-sensitive resin composition as described in any one of <1> to <12>, further comprising at least one of:

a basic compound (DA);

a basic compound (DB) having basicity that is reduced or lost upon irradiation with actinic rays or radiation;

a compound (DC) that generates an acid having a pKa of 1.00 or more higher than the acid generated from the photoacid generator Aw;

a compound (DD) having a nitrogen atom and having a group that is eliminated by an action of an acid; or an onium salt compound (DE) having a nitrogen atom in a cationic moiety.

<14> A resist film formed of the actinic ray-sensitive or radiation-sensitive resin composition as described in any one of <1> to <13>.

<15> A pattern forming method using the actinic ray-sensitive or radiation-sensitive resin composition as described in any one of <1> to <13>.

<16> A method for manufacturing an electronic device, the method comprising the pattern forming method as described in <15>.

A mechanism by which the object can be accomplished by the present invention is not clear in detail, but is presumed as follows by the present inventors.

That is, since the resin P in the present invention has a repeating unit represented by General Formula (P1) and the repeating unit has a protic group represented by —$X^p$H, it thus considered that the repeating unit interacts with an acid (generated acid) generated from a photoacid generator, and thus, the diffusion of the generated acid can be suppressed. In addition, in the present invention, a photoacid generator Aw that generates an acid having a pKa of −1.40 or more is used. Since an acid generated from the photoacid generator Aw is a weak acid having a pKa of −1.40 or more, it is considered that the electron density of an atom (typically a heteroatom) bonded to a proton of the generated acid is high, the interaction of the resin P with the protic group represented by —$X^p$H is stronger than that of a strong acid, and the diffusion of the generated acid is more effectively suppressed.

According to the present invention, it is possible to provide an actinic ray-sensitive or radiation-sensitive resin composition which has an excellent EL, a small LWR, a small LER, and an excellent CDU in the formation of an ultrafine pattern (for example, a line-and-space pattern with a line width of 45 nm or a hole pattern with a hole size of 45 nm or less); and a resist film, a pattern forming method, and a method for manufacturing an electronic device, each using the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV light), X-rays, electron beams (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays (EUV), X-rays, or the like, but also lithography by particle rays such as electron beams and ion beams.

In the present specification, a numerical range expressed using "to" is used in a meaning of a range that includes the preceding and succeeding numerical values of "to" as the lower limit value and the upper limit value, respectively.

In the present specification, (meth)acrylate represents acrylate and methacrylate.

In the present specification, the weight-average molecular weight (Mw), the number-average molecular weight (Mn), and the dispersity (also referred to as a molecular weight distribution) (Mw/Mn) of a resin are each defined as a value expressed in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

In the present specification, the acid dissociation constant pKa (pKa) represents an acid dissociation constant pKa in an aqueous solution, and is defined, for example, in Chemical Handbook (I)(Revised 4th Edition, 1993, compiled by the Chemical Society of Japan, Maruzen Company, Ltd.). The lower the value of the acid dissociation constant pKa, the higher the acid strength. The value of the pKa is determined using the following software package 1 by computation from a value based on a Hammett substituent constant and the database of publicly known literature values. Any of the values of pKa described in the present specification indicate values determined by computation using the software package.

Software Package 1: Advanced Chemistry Development (ACD/Labs) Software V 8.14 for Solaris (1994-2007 ACD/Labs).

In citations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, in a case of referring to an expression "a substituent may be contained", the types of substituents, the positions of the substituents, and the number of the substituents are not particularly limited. The number of the substituents may be, for example, one, two, three, or more. Examples of the substituent include a monovalent non-metal atomic group from which a hydrogen atom has been excluded, and the substituent can be selected from the following substituent T, for example.

(Substituent T)

Examples of the substituent T include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; an alkyl group; a cycloalkyl group; an aryl group; a heteroaryl group; a hydroxy group; a carboxyl group; a formyl group; a sulfo group; a cyano group; an alkylaminocarbonyl group; an arylaminocarbonyl group; a sulfonamide group; a silyl group; an amino group; a monoalkylamino group; a dialkylamino group; an arylamino group; and a combination thereof.

[Actinic Ray-Sensitive or Radiation-Sensitive Resin Composition]

The actinic ray-sensitive or radiation-sensitive resin composition of an embodiment of the present invention (hereinafter also referred to as "the composition of an embodiment of the present invention") includes a resin P having a repeating unit represented by General Formula (P1) and a photoacid generator Aw, and the photoacid generator Aw is a compound that generates an acid having a pKa of −1.40 or more upon irradiation with actinic rays or radiation.

The composition of the embodiment of the present invention is a so-called resist composition, and may be either a positive tone resist composition or a negative tone resist composition. In addition, the resist composition may be either a resist composition for alkali development or a resist composition for organic solvent development.

The composition of the embodiment of the present invention is typically a chemically amplified resist composition.

Hereinafter, the components included in the composition of the embodiment of the present invention will be described in detail.

[Resin Having Repeating Unit Represented by General Formula (P1) (Resin P)]

The composition of the embodiment of the present invention includes a resin having a repeating unit represented by General Formula (P1) (also referred to as a "resin P").

(P1)

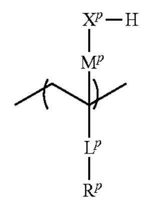

In General Formula (P1), $M^p$ represents a single bond or a divalent linking group.

$L^p$ represents a divalent linking group.

$X^p$ represents O, S, or $NR^{N1}$. $R^{N1}$ represents a hydrogen atom or a monovalent organic group.

$R^p$ represents a monovalent organic group.

In General Formula (P1), $M^p$ represents a single bond or a divalent linking group.

The divalent linking group in a case where $M^p$ represents the divalent linking group is not particularly limited, but examples thereof include —C(═O)—, —O—, —S(═O)$_2$—, an alkylene group (which may be linear or branched, and is preferably an alkylene group having 1 to 10 carbon atoms), a cycloalkylene group (preferably a cycloalkylene group having 3 to 20 carbon atoms), a divalent heterocyclic group, a divalent aromatic group (preferably an arylene group having 6 to 20 carbon atoms, more preferably an arylene group having 6 to 10 carbon atoms, and still more preferably a phenylene group), —$NR^{M1}$—, and a linking group formed by combination thereof. It should be noted that $R^{M1}$ represents a hydrogen atom or a monovalent organic group, and preferably represents the hydrogen atom or an alkyl group (preferably an alkyl group having 1 to 6 carbon atoms, which may have a substituent). The alkylene group, the cycloalkylene group, the divalent heterocyclic group, and the divalent aromatic group may have a substituent. Examples of the substituent include the above-mentioned substituent T, and the alkyl group, the fluorine atom, the fluoroalkyl group, and the like are preferable.

$M^p$ is preferably the single bond or the alkylene group, and more preferably the single bond or an alkylene group having 1 to 5 carbon atoms. In a case where $M^p$ is the single bond or the alkylene group having 1 to 5 carbon atoms, the length of a side chain represented by $M^p$-$X^p$—H of the resin P gets moderately shorter, and thus, a high glass transition point can be maintained with the resin P. This further suppresses acid diffusion compared to a longer side chain.

As $M^p$, an alkylene group having 1 to 4 carbon atoms is more preferable, an alkylene group having 1 to 3 carbon atoms is still more preferable, a methylene group or an ethylene group is particularly preferable, and the methylene group is the most preferable.

In General Formula (P1), $L^p$ represents a divalent linking group.

The divalent linking group represented by $L^p$ is not particularly limited, but is for example, —C(═O)—, —O—, —S(═O)$_2$—, an alkylene group (which may be linear or branched, and is preferably an alkylene group having 1 to 10 carbon atoms), a cycloalkylene group (preferably a cycloalkylene group having 3 to 20 carbon atoms), a divalent heterocyclic group, a divalent aromatic group (preferably an arylene group having 6 to 20 carbon atoms, more preferably an arylene group having 6 to 10 carbon atoms, and still more preferably a phenylene group), —$NR^{M1}$—, and a linking group formed by combination thereof. It should be noted that $R^{L1}$ represents a hydrogen atom or a monovalent organic group, and preferably represents the hydrogen atom or the alkyl group (preferably an alkyl group having 1 to 6 carbon atoms, which may have a substituent). The alkylene group, the cycloalkylene group, the divalent heterocyclic group, and the divalent aromatic group may have a substituent. Examples of the substituent include the above-mentioned substituent T.

$L^p$ preferably represents —CO—O—, —CO—, —$NR^{L1}$—, the divalent aromatic group, or the divalent linking group formed by combination thereof, and more preferably represents —CO—O—. Further, for —CO—O—, it is preferable that a left-side bond (a bond of the carbonyl group) is bonded to the main chain of General Formula (P1), and a right-side bond (a bond of the oxygen atom) is bonded to $R^p$ of General Formula (P1).

In General Formula (P1), $X^p$ represents O, S, or $NR^{N1}$. $R^{N1}$ represents a hydrogen atom or a monovalent organic group.

The monovalent organic group in a case where $R^{N1}$ represents the monovalent organic group is not particularly limited, but examples thereof include an alkylsulfonyl group (preferably an alkylsulfonyl group having 1 to 10 carbon atoms), an alkyl group (which may linear or branched, and is preferably an alkyl group having 1 to 10 carbon atoms), a cycloalkyl group (preferably a cycloalkyl group having 3 to 20 carbon atoms), and an aryl group (preferably an aryl group having 6 to 20 carbon atoms). These groups may each have a substituent. Examples of the substituent include the above-mentioned Substituent T, and include, for example, a halogen atom (preferably a fluorine atom).

As $R^{N1}$, an alkylsulfonyl group having 1 to 6 carbon atoms is preferable, an alkylsulfonyl group having 1 to 6 carbon atoms, which is substituted with a fluorine atom, is more preferable, and a trifluoromethylsulfonyl group is the most preferable.

$X^p$ preferably represents O or $NR^N$, and more preferably represents O.

In General Formula (P1), $R^p$ represents a monovalent organic group.

The monovalent organic group represented by $R^p$ is not particularly limited, but examples thereof include an alkyl group (which may linear or branched, and is preferably an alkyl group having 1 to 10 carbon atoms), a cycloalkyl group (preferably a cycloalkyl group having 3 to 20 carbon atoms), an aryl group (preferably an aryl group having 6 to 20 carbon atoms), a cyano group, a lactone group, and a sultone group. The alkyl group and the cycloalkyl group may have a heteroatom (for example, an oxygen atom, a sulfur atom, and a nitrogen atom) between carbon-carbon bonds. The group mentioned as an example of $R^p$ may have a substituent. Examples of the substituent include the above-mentioned substituent T, and the alkyl group, the hydroxy group, or the like is preferable.

Preferred aspects of the group represented by $L^p$-$R^p$ in General Formula (P1) include the following two aspects.

Aspect 1: An aspect in which the group represented by $L^p$-$R^p$ includes an acid-decomposable group Aspect 2: An aspect in which the group represented by $L^p$-$R^p$ includes a polar group The aspect 1 (aspect in which the group represented by $L^p$-$R^p$ includes an acid-decomposable group) will be described.

The acid-decomposable group is a group having a polarity that increases through decomposition by the action of an acid.

In a case where the group represented by $L^p$-$R^p$ includes an acid-decomposable group, the resin P serves as an acid-decomposable resin.

In a case where the resin P is the acid-decomposable resin, typically, a positive tone pattern is suitably formed in a case where an alkaline developer is adopted as a developer, and a negative tone pattern is suitably formed in a case where an organic developer is adopted as a developer, in a pattern forming method using the composition of the embodiment of the present invention.

The acid-decomposable group preferably includes a structure in which a polar group is protected with a group (eliminable group) that is eliminated through decomposition by the action of an acid.

Examples of the polar group include an acidic group (a group which dissociates in a 2.38%-by-mass aqueous tetramethylammonium hydroxide solution), such as a carboxyl group, a phenolic hydroxy group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxy group.

Moreover, the alcoholic hydroxy group refers to a hydroxy group bonded to a hydrocarbon group, which is a hydroxy group other than a hydroxy group (phenolic hydroxy group) directly bonded to an aromatic ring, from which an aliphatic alcohol (for example, a hexafluoroisopropanol group) having the α-position substituted with an electron-withdrawing group such as a fluorine atom is excluded as a hydroxy group. The alcoholic hydroxy group is preferably a hydroxy group having an acid dissociation constant (pKa) of 12 to 20.

As the polar group, a carboxyl group, a phenolic hydroxy group, a fluorinated alcohol group (preferably a hexafluoroisopropanol group), or a sulfonic acid group is preferable.

The group which is preferable as the acid-decomposable group is a group obtained by substituting a hydrogen atom of such an acid-decomposable group with a group (eliminable group) that is eliminated by the action of an acid.

Examples of the group (eliminable group) that is eliminated by the action of an acid include —$C(R_{36})(R_{37})(R_{38})$, —$C(R_{36})(R_{37})(OR_{39})$, and —$C(R_{01})(R_{02})(R_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the alkyl group of each of $R_{36}$ to $R_{39}$, $R_{01}$, and $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

The cycloalkyl group as each of $R_{36}$ to $R_{39}$, $R_{01}$, and $R_{02}$ may be a monocycle or a polycycle. As the monocycle, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycycle, a cycloalkyl group having 6 to 20 carbon atoms is preferable, and examples thereof include an adamantyl group, a norbornyl group, an isobornyl group, a camphanyl group, a dicyclopentyl group, an α-pinel group, a tricyclodecanyl group, a tetracyclododecyl group, and an androstanyl group. Further, one or more carbon atoms in the cycloalkyl group may be substituted with heteroatoms such as an oxygen atom.

The aryl group of each of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

The aralkyl group of each of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group of each of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

As a ring formed by the mutual bonding of $R_{36}$ and $R_{37}$, a (monocyclic or polycyclic) cycloalkyl group is preferable. As the monocyclic cycloalkyl group, a cyclopentyl group or a cyclohexyl group is preferable, and as the polycyclic cycloalkyl group, a norbornyl group, a tetracyclodecanyl group, a tetracyclododecanyl group, or an adamantyl group is preferable.

As the acid-decomposable group, a tertiary alkyl ester group, an acetal group, a cumyl ester group, an enol ester group, or acetal ester group is preferable, and the acetal group or the tertiary alkyl ester group is more preferable.

Next, the aspect 2 (aspect in which the group represented by $L^p$-$R^p$ includes a polar group) will be described.

Since the group represented by $L^p$-$R^p$ includes a polar group, the solubility of the resin P in an organic solvent can be lowered. In particular, it is preferable that $R^p$ includes a polar group. As the polar group, at least one group selected from the group consisting of an ester group, a sulfonate group, a sulfonamide group, a carboxylic acid group, a sulfonic acid group, a carbonate group, a carbamate group, a hydroxy group, a sulfoxide group, a sulfonyl group, a ketone group, an imide group, an amide group, a sulfonimide group, a cyano group, a nitro group, and an ether group is preferable; at least one group selected from the group consisting of a lactone group, a sultone group, a sultam group, a carboxylic acid group, an alcoholic hydroxy group, and a cyclic carbonate group is more preferable; a lactone group or a sultone group is still more preferable; and a lactone group is particularly preferable.

That is, the group represented by $L^p$-$R^p$ preferably has a lactone structure or a sultone structure, and particularly preferably has the lactone structure.

As the lactone structure or the sultone structure, any structure which has a lactone ring or sultone ring may be used, but a lactone structure having a 5-to 7-membered ring or a sultone structure having a 5- to 7-membered ring is preferable.

A lactone structure in which another ring is fused with the 5- to 7-membered lactone ring so as to form a bicyclo structure or a spiro structure is also preferable. A sultone structure in which another ring is fused with a 5- to 7-membered sultone ring so as to form a bicyclo structure or a spiro structure is also preferable.

Among those, the group represented by $L^p$-$R^p$ preferably includes a repeating unit having a lactone structure represented by any of General Formulae (LC1-1) to (LC1-22) or a sultone structure represented by any of General Formulae (SL1-1) to (SL1-3). In addition, the lactone structure or the sultone structure may be bonded directly to the main chain.

Among those, the lactone structure represented by General Formula (LC1-1), General Formula (LC1-4), General Formula (LC1-5), General Formula (LC1-8), General Formula (LC1-16), General Formula (LC1-21), or General Formula (LC1-22), or the sultone structure represented by General Formula (SL1-1) is preferable.

LC1-1

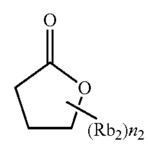

LC1-2

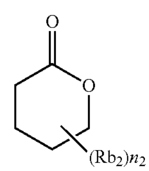

LC1-3

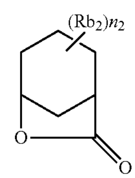

LC1-4

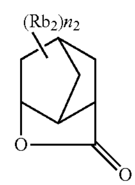

LC1-5

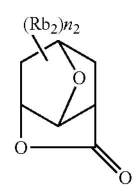

LC1-6

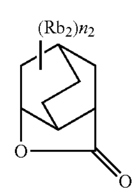

-continued
LC1-7
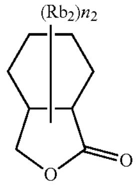
LC1-8
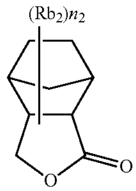
LC1-9
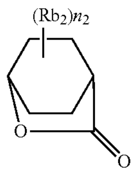
LC1-10
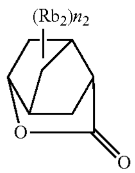
LC1-11
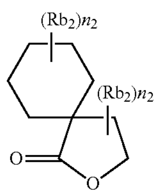
LC1-12
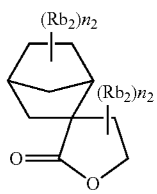
LC1-13
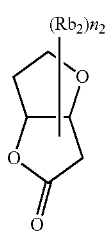
LC1-14
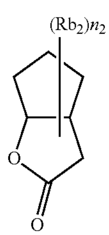
-continued
LC1-15
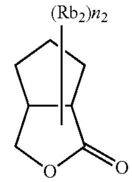
LC1-16
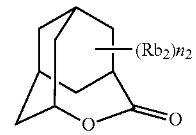
LC1-17
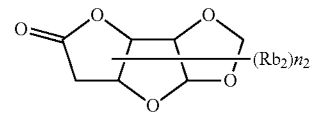
LC1-18
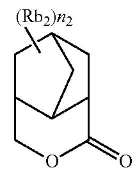
LC1-19
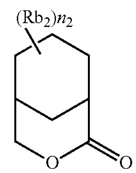
LC1-20
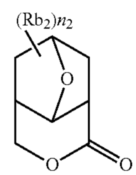
LC1-21
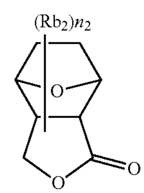
LC1-22
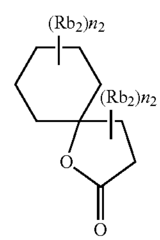
SL1-1
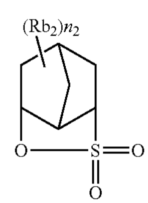

-continued

SL1-2

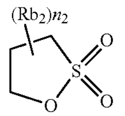

SL1-3

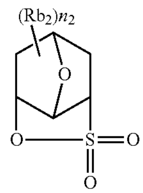

The lactone structure or the sultone structure may or may not have a substituent ($Rb_2$). As the substituent ($Rb_2$), an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxy group, a cyano group, or the like is preferable, and an alkyl group having 1 to 4 carbon atoms or the cyano group is more preferable. $n_2$ represents an integer of 0 to 4. In a case where $n_2$ is 2 or more, the substituents ($Rb_2$) which are present in a plural number may be the same as or different from each other. In addition, the substituents ($Rb_2$) which are present in a plural number may be bonded to each other to form a ring.

The repeating unit represented by General Formula (P1) is preferably a repeating unit represented by General Formula (P2) or (P3), and more preferably the repeating unit represented by General Formula (P2)

(P2)

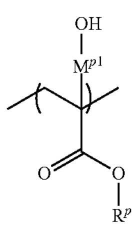

In General Formula (P2), $M^{p1}$ represents a single bond or an alkylene group having 1 to 5 carbon atoms.

$R^p$ represents a monovalent organic group.

(P3)

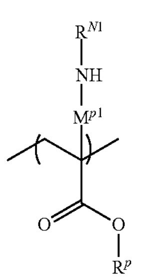

In General Formula (P3), $M^{p1}$ represents a single bond or an alkylene group having 1 to 5 carbon atoms.

$R^p$ represents a monovalent organic group.

$R^{N1}$ represents a hydrogen atom or a monovalent organic group.

$M^{p1}$'s in General Formulae (P2) and (P3) each independently represent a single bond or an alkylene group having 1 to 5 carbon atoms, and are each preferably an alkylene group having 1 to 4 carbon atoms, more preferably an alkylene group having 1 to 3 carbon atoms, particularly preferably a methylene group or an ethylene group, and most preferably the methylene group.

$R^p$'s in General Formulae (P2) and (P3) each independently represent a monovalent organic group, and specific examples and the like thereof are the same as in those of $R^p$ in General Formula (P1).

$R^p$ in each of General Formulae (P2) and (P3) is preferably an organic group represented by General Formula (RP-1) or (RP-2).

(RP-1)

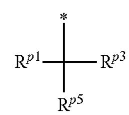

In General Formula (RP-1), $R^{p1}$ to $R^{p3}$ each independently represent an alkyl group, a cycloalkyl group, or an aryl group.

Any two of $R^{p1}$, $R^{p2}$, or $R^{p3}$ may be bonded to each other to form a ring structure.

* represents a bonding site to the oxygen atom to which $R^p$ is bonded.

(RP-2)

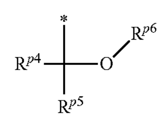

In General Formula (RP-2), $R^{p4}$ and $R^{p5}$ each independently represent a hydrogen atom, an alkyl group, or a cycloalkyl group.

$R^{p6}$ represents an alkyl group or a cycloalkyl group.

Any two of $R^{p1}$, $R^{p2}$, or $R^{p3}$ may be bonded to each other to form a ring structure.

* represents a bonding site to the oxygen atom to which $R^p$ is bonded.

$R^{p1}$ to $R^{p3}$ in General Formula (RP-1) each independently represent an alkyl group, a cycloalkyl group, or an aryl group.

In a case where $R^{p1}$ to $R^{p3}$ each represent an alkyl group, the alkyl group may be linear or branched and is not particularly limited, but is preferably an alkyl group having 1 to 8 carbon atoms, more preferably an alkyl group having 1 to 5 carbon atoms, and still more preferably an alkyl group having 1 to 3 carbon atoms. Examples of the alkyl group include a methyl group, an ethyl group, a propyl group, an isopropyl group, an n-butyl group, a sec-butyl group, a t-butyl group, a hexyl group, and an octyl group. The alkyl group may have a substituent. Examples of the substituent include the above-mentioned substituent T.

In a case where $R^{p1}$ to $R^{p3}$ each represent the cycloalkyl group, the cycloalkyl group is not particularly limited and may be a monocycle or a polycycle. As the monocycle, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycycle, a cycloalkyl group having 6 to 20 carbon atoms is preferable, and examples thereof include an adamantyl group, a norbornyl group, an isobornyl group, a camphanyl group, a dicyclopentyl group, an α-pinel group, a tricyclodecanyl group, a tetracyclodecyl group, a tetracyclododecyl group, and an androstanyl group. Further, one or more carbon atoms in the cycloalkyl group may be substituted with heteroatoms such as an oxygen atom. The cycloalkyl group may have a substituent. Examples of the substituent include the above-mentioned substituent T.

The aryl group in the case where $R^{p1}$ to $R^{p3}$ each represent an aryl group is not particularly limited, and is preferably an aryl group having 6 to 20 carbon atoms, more preferably an aryl group having 6 to 15 carbon atoms, and the most preferably a phenyl group. The aryl group may have a substituent. Examples of the substituent include the above-mentioned substituent T.

Any two of $R^{p1}$, $R^{p2}$, or $R^{p3}$ may be bonded to each other to form a ring structure.

The ring formed by the bonding of any two of $R^{p1}$, $R^{p2}$, or $R^{p3}$ may be a monocycle or a polycycle. As an example of the monocycle, a monocycle having 3 to 20 carbon atoms is preferable, and examples thereof include monocyclic cycloalkane rings such as a cyclopentyl ring, a cyclohexyl ring, a cycloheptyl ring, and a cyclooctane ring. As an example of the polycycle, a polycycle having 5 to 30 carbon atoms is preferable, and examples thereof include polycyclic cycloalkyl rings such as a norbornane ring, a tetracyclodecane ring, a tetracyclododecane ring, and an adamantane ring. Among those, the cyclopentyl ring, the cyclohexyl ring, or the adamantane ring is preferable.

In addition, a ring shown below is also preferable.

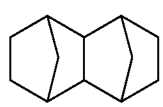 [SMILES: C1CC2CC1C1C3CCC(C3)C21]

$R^{p4}$ and $R^{p5}$ in General Formula (RP-2) each independently represent a hydrogen atom, an alkyl group, or a cycloalkyl group. $R^{p6}$ represents an alkyl group or a cycloalkyl group.

In a case where $R^{p4}$ to $R^{p6}$ in General Formula (RP-2) each represent an alkyl group or a cycloalkyl group, specific examples and preferred examples thereof are each the same as in the case where $R^{p1}$ to $R^{p3}$ in General Formula (RP-1) each represent an alkyl group or a cycloalkyl group.

It is preferable that one of $R^{p4}$ and $R^{p5}$ represents a hydrogen atom and the other represents an alkyl group or a cycloalkyl group.

Specific examples of the repeating unit represented by General Formula (P1) are shown below, but are not limited thereto.

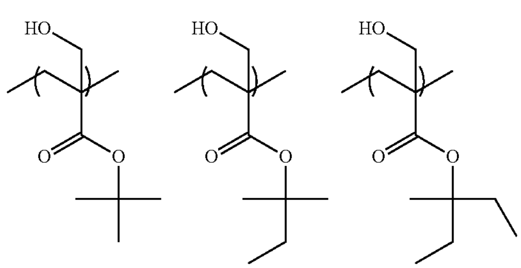

-continued

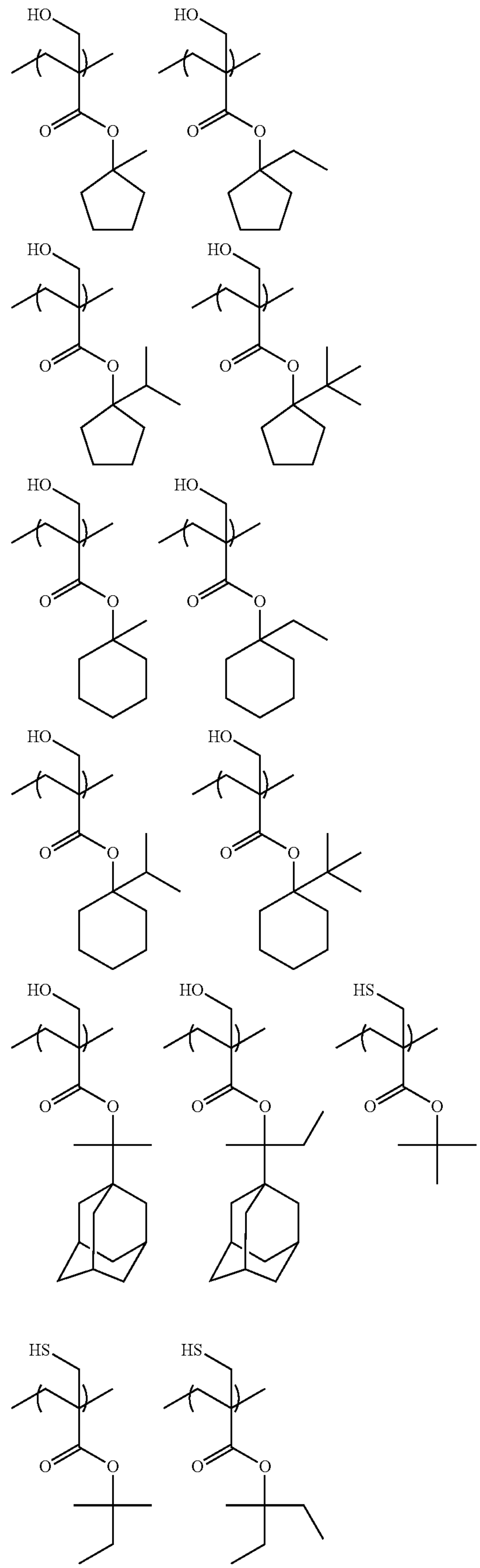

-continued
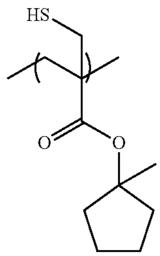
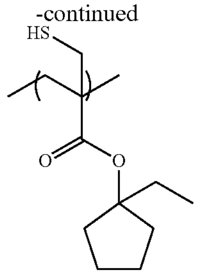
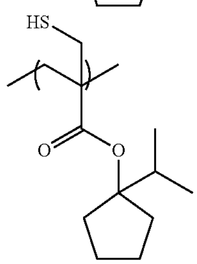
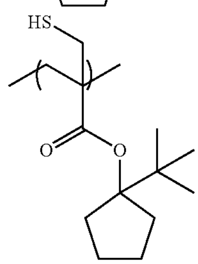
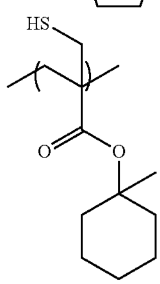
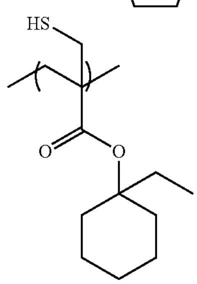
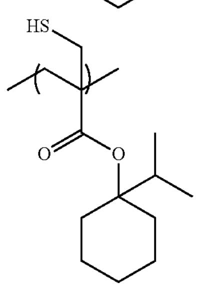
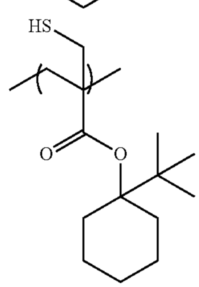
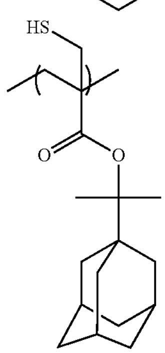
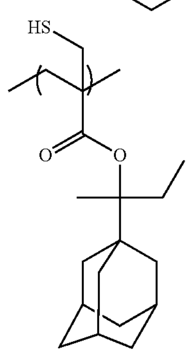
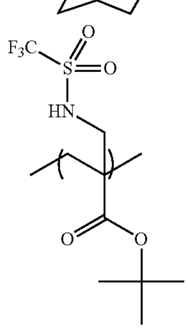
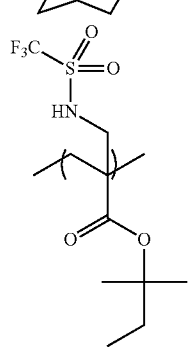
-continued
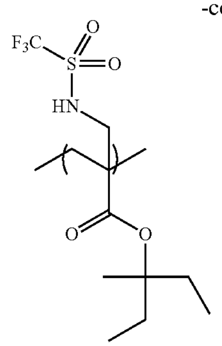
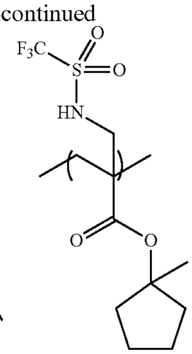
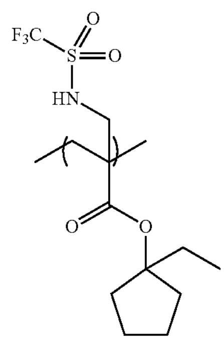
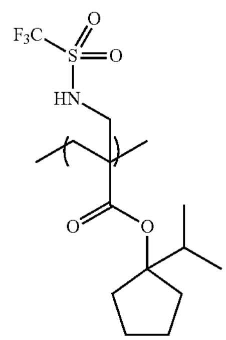
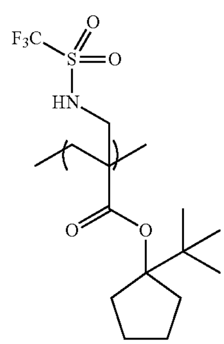
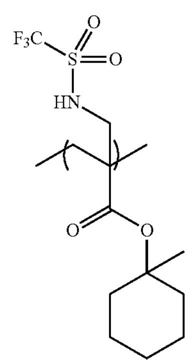
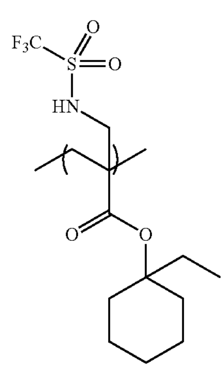
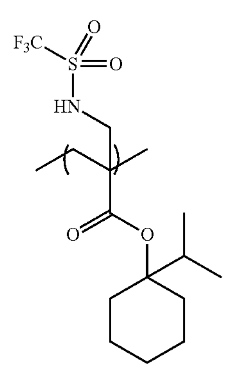

-continued
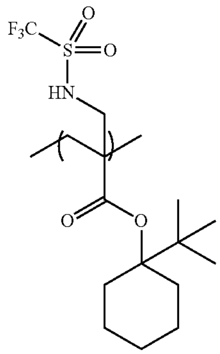
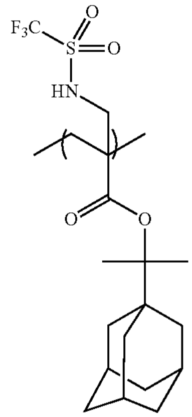
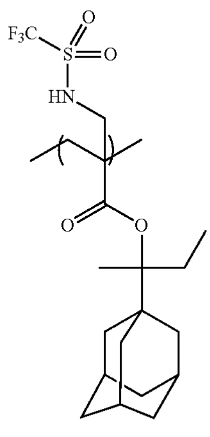
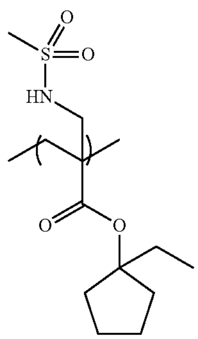
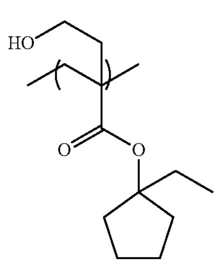
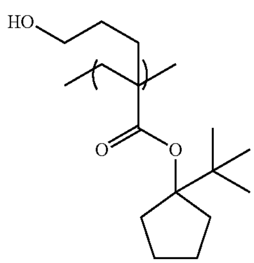
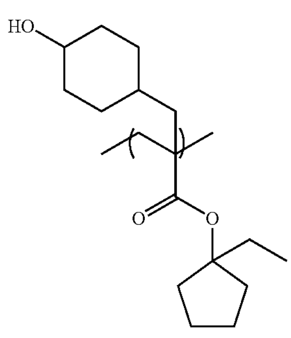
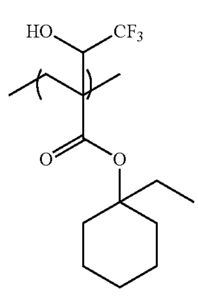
-continued
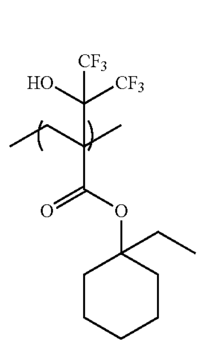
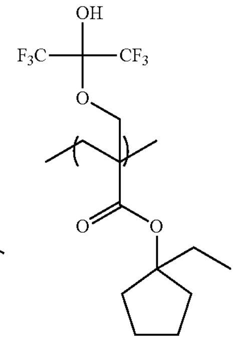
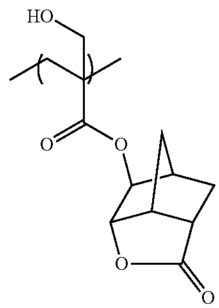
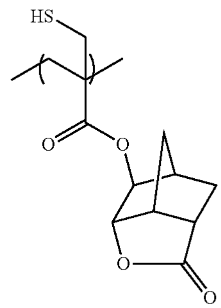
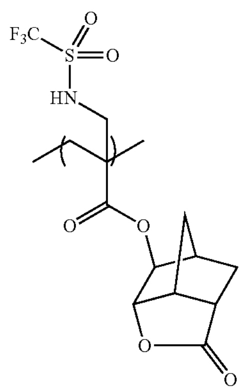
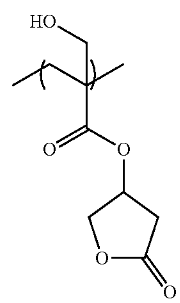
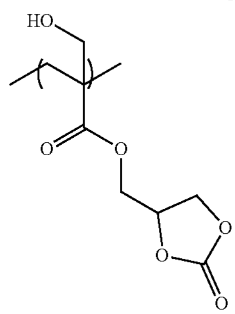
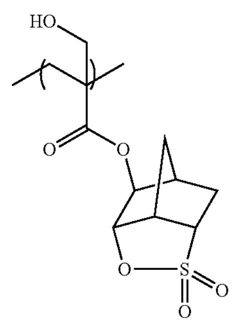
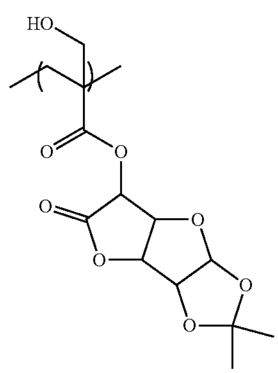

-continued

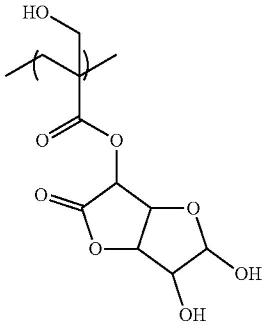

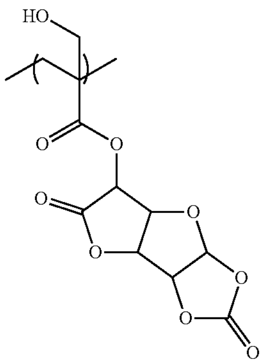

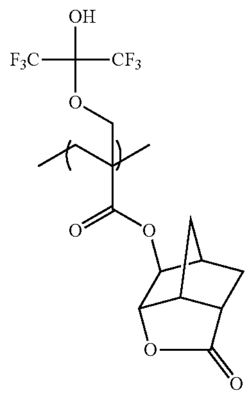

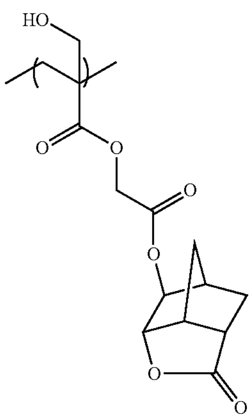

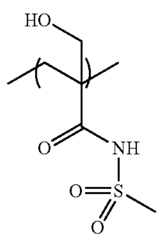

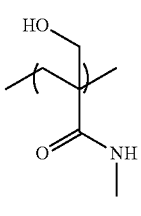

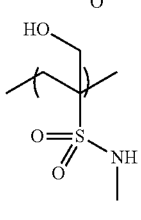

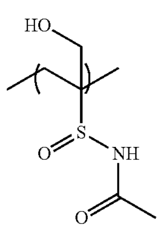

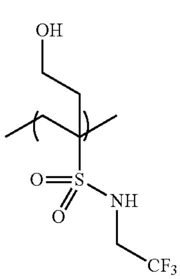

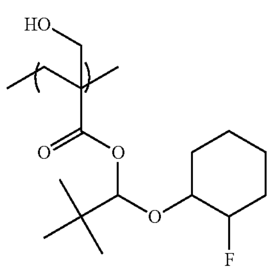

-continued

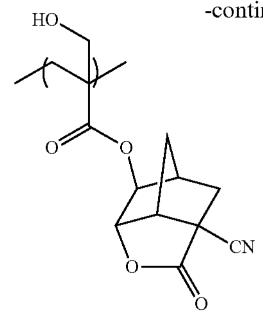

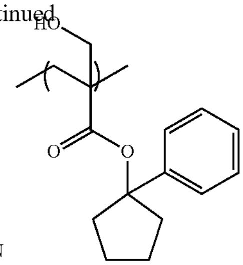

The resin P may include the repeating unit represented by General Formula (P1) which is used singly or in combination of two or more kinds thereof.

The content of the repeating unit represented by General Formula (P1) included in the resin P (in a case where the repeating units represented by General Formula (P1) are present in a plural number, a total content thereof) is preferably 5% to 90% by mole, more preferably 10% to 80% by mole, and still more preferably 10% to 70% by mole with respect to all the repeating units of the resin P.

<Repeating Unit K1 Having Acid-Decomposable Group>

The resin P may further include a repeating unit having an acid-decomposable group (also referred to as a "repeating unit K1"), which is different from the repeating unit represented by General Formula (P1).

In particular, in a case where the repeating unit represented by General Formula (P1) has no acid-decomposable group, it is preferable that the resin P has the repeating unit K1.

The acid-decomposable group in the repeating unit K1 is the same as the acid-decomposable group described in the aspect in which the group represented by $L^p$-$R^p$ includes an acid-decomposable group (aspect 1).

The resin P preferably includes a repeating unit represented by General Formula (AI) as the repeating unit K1.

(AI)

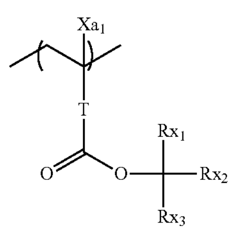

In General Formula (AI), T represents a single bond or a divalent linking group.

Examples of the divalent linking group of T include an alkylene group, an arylene group, —COO-Rt-, and —O-Rt-. In the formulae, Rt represents an alkylene group, a cycloalkylene group, or an arylene group.

T is preferably the single bond or —COO-Rt-. Rt is preferably a chain alkylene group having 1 to 5 carbon atoms, and more preferably —$CH_2$—, —$(CH_2)_2$—, or —$(CH_2)_3$—.

T is more preferably the single bond.

In General Formula (AI), $Xa_1$ represents a hydrogen atom, a halogen atom, or a monovalent organic group.

$Xa_1$ is preferably a hydrogen atom or an alkyl group.

The alkyl group of $Xa_1$ may have a substituent, and examples of the substituent include a hydroxy group and a halogen atom (preferably a fluorine atom).

The alkyl group of $Xa_1$ preferably has 1 to 4 carbon atoms, and examples thereof include a methyl group, an ethyl group, a propyl group, a hydroxymethyl group, and a trifluoromethyl group. The alkyl group of $Xa_1$ is preferably a methyl group.

In General Formula (AI), $Rx_1$ to $Rx_3$ each independently represent an alkyl group or a cycloalkyl group.

Any two of $Rx_1$, $Rx_2$, or $Rx_3$ may or may not be bonded to each other to form a ring structure.

The alkyl group of each of $Rx_1$, $Rx_2$, and $Rx_3$ may be linear or branched, and is preferably a methyl group, an ethyl group, an n-propyl group, an isopropyl group, an n-butyl group, an isobutyl group, a t-butyl group, or the like. The alkyl group preferably has 1 to 10 carbon atoms, more preferably has 1 to 5 carbon atoms, and still more preferably has 1 to 3 carbon atoms. In the alkyl group of each of $Rx_1$, $Rx_2$, and $Rx_3$, a part of carbon-carbon bonds may be a double bond.

The cycloalkyl group of each of $Rx_1$, $Rx_2$, and $Rx_3$ may be either a monocycle or a polycycle. Examples of the monocyclic cycloalkyl group include a cyclopentyl group and a cyclohexyl group. Examples of the polycyclic cycloalkyl group include a norbornyl group, a tetracyclodecanyl group, a tetracyclododecanyl group, and an adamantyl group.

A ring formed by the bonding of two of $Rx_1$, $Rx_2$, and $Rx_3$ may be a monocycle or a polycycle. Examples of the monocycle include monocyclic cycloalkane rings such as a cyclopentyl ring, a cyclohexyl ring, a cycloheptyl ring, and a cyclooctane ring. Examples of the polycycle include polycyclic cycloalkyl rings such as a norbornane ring, a tetracyclodecane ring, a tetracyclododecane ring, and an adamantane ring. Among those, the cyclopentyl ring, the cyclohexyl ring, or the adamantane ring is preferable.

In addition, as a ring formed by the bonding of two of $Rx_1$, $Rx_2$, and $Rx_3$, a ring shown below is also preferable.

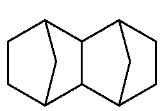 [SMILES: C1CC2CC1C1C3CCC(C3)C21]

Specific examples of the monomer corresponding to the repeating unit represented by General Formula (AI) are shown below. The following specific examples correspond to the case where $Xa_1$ in General Formula (A) is a methyl group, but $Xa_1$ can be optionally substituted with a hydrogen atom, a halogen atom, or a monovalent organic group.

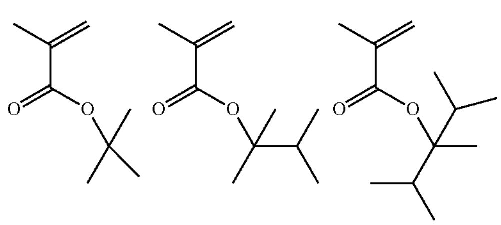

-continued

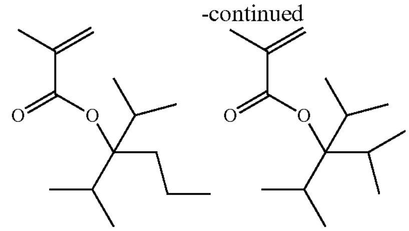

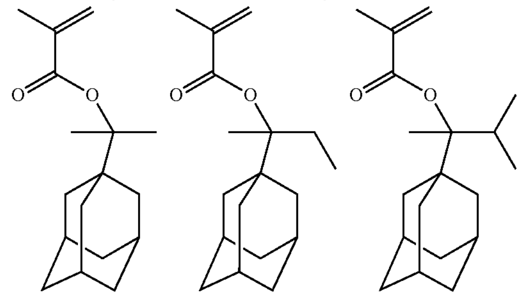

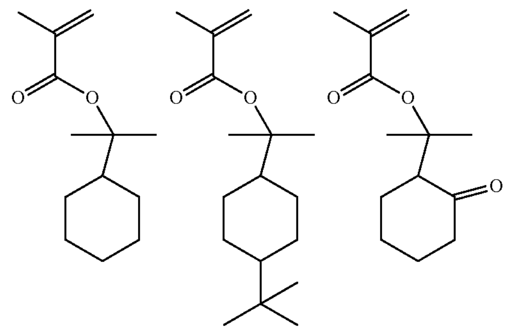

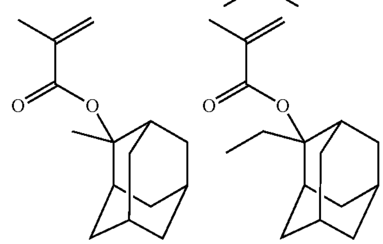

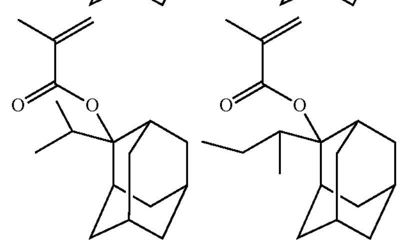

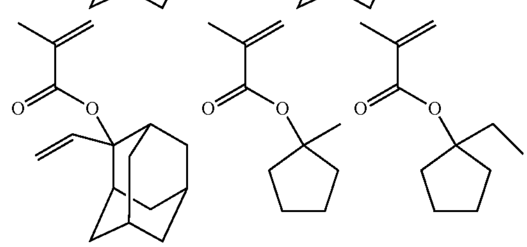

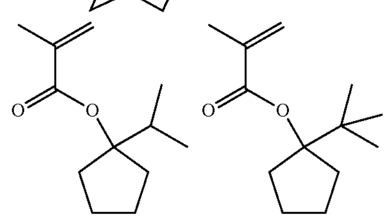

-continued

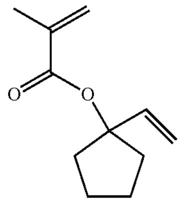
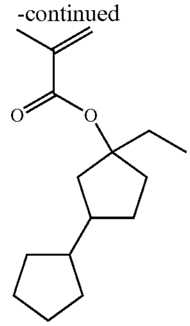
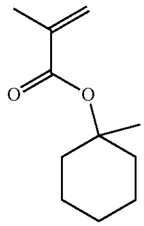
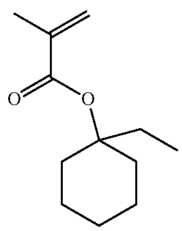
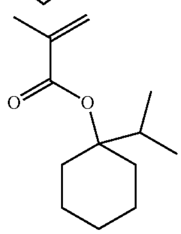
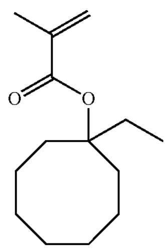
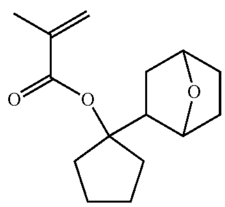
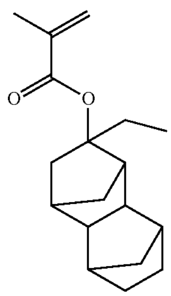
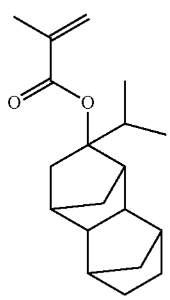
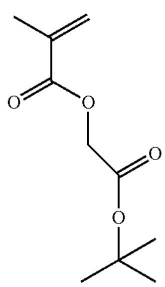
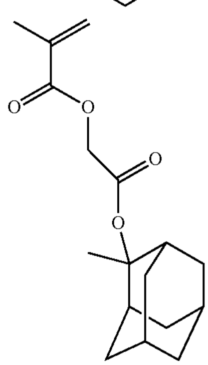

It is also preferable that the resin P has the repeating unit described in paragraphs [0336] to [0396] of the specification of US2016/0070167A1 as the repeating unit K1.

In addition, the resin P may have a repeating unit including a group that decomposes by the action of an acid to produce an alcoholic hydroxy group described in paragraphs [0363] to [0394] of the specification of US2016/0070167A1 as the repeating unit K1.

In a case where the resin P includes the repeating unit K1, a type of the repeating unit K1 included in the resin P may be one kind or two or more kinds.

In a case where the resin P includes the repeating unit K1, the content of the repeating unit K1 included in the resin P (in a case where the repeating units K1 are present in a plural number, a total content thereof) is preferably 10% to 90% by mole, more preferably 20% to 80% by mole, and still more preferably 30% to 70% by mole with respect to all the repeating units of the resin P.

<Repeating Unit K2 Having Polar Group>

The resin P may further include a different repeating unit having a polar group (also referred to as a "repeating unit K2"), which is different from the repeating unit represented by General Formula (P1).

In particular, in a case where the group represented by $L^P$-$R^P$ in General Formula (P1) has no polar group (more specifically, a case where $R^P$ has no polar group, in which the resin P has no repeating unit having a polar group other than the repeating unit having an acid-decomposable group), it is preferable that the resin P has the repeating unit K2.

The polar group in the repeating unit K2 is the same as the polar group described in the aspect in which the group represented by $L^P$-$R^P$ includes a polar group (aspect 2).

The repeating unit K2 is preferably a repeating unit having a lactone structure or a sultone structure, and is preferably a repeating unit represented by General Formula (LS1).

(LS1)

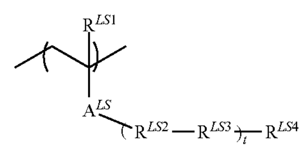

In General Formula (LS1), $A^{LS}$ represents an ester bond (a group represented by —COO—) or an amide bond (a group represented by —CONH—).

t is the number of repetitions of the structure represented by —$R^{LS2}$—$R^{LS3}$—, represents an integer of 0 to 5, and is preferably 0 or 1, and more preferably 0. In a case where t is 0, (—$R^{LS2}$-$R^{LS3}$-)t is a single bond.

$R^{LS2}$ represents an alkylene group, a cycloalkylene group, or a combination thereof. In a case where $R^{LS2}$'s are present in a plural number, $R^{LS2}$'s which are present in a plural number may be the same as or different from each other.

The alkylene group or the cycloalkylene group of $R^{LS}$ may have a substituent.

$R^{LS3}$ represents a single bond, an ether bond, an ester bond, an amide bond, a urethane bond, or a urea bond. In a case where $R^{LS3}$'s are present in a plural number, $R^{LS3}$'s which are present in a plural number may be the same as or different from each other.

Among those, $R^{LS3}$ is preferably the ether bond or an ester bond, and more preferably the ester bond.

$R^{LS4}$ represents a monovalent organic group having a lactone structure or a sultone structure.

Among those, any of the structures represented by General Formulae (LC1-1) to (LC1-22) and the structures represented by General Formulae (SL1-1) to (SL1-3) described above are preferably a group obtained by removing one hydrogen atom from one carbon atom constituting the lactone structure or the sultone structure. Further, it is preferable that the carbon atom from which one hydrogen atom is removed is not a carbon atom constituting the substituent ($Rb_2$).

$R^{LS1}$ represents a hydrogen atom, a halogen atom, or a monovalent organic group (preferably a methyl group).

Examples of a monomer corresponding to the repeating unit having at least one selected from the group consisting of a lactone structure and a sultone structure are shown below.

In the following examples, the methyl group bonded to the vinyl group may be substituted with a hydrogen atom, a halogen atom, or a monovalent organic group.

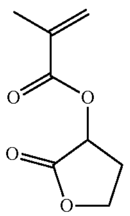

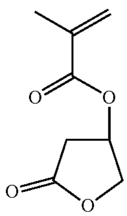

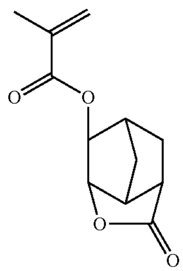

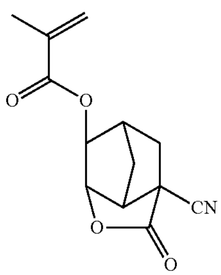

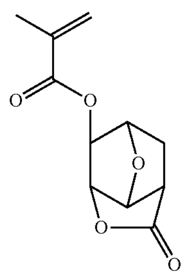

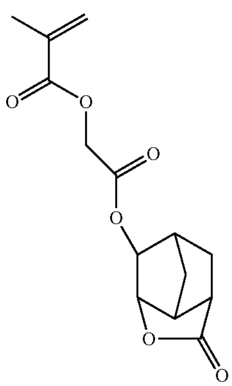

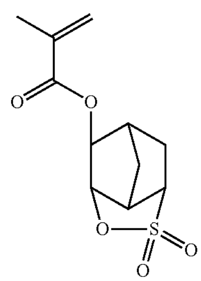

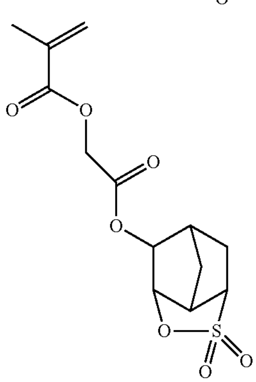

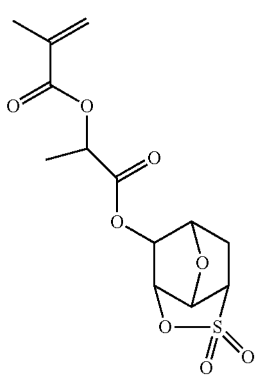

-continued

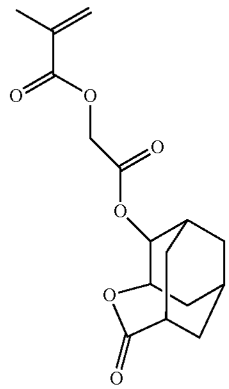

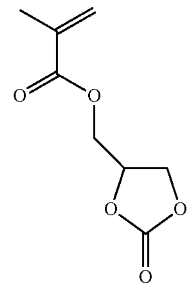

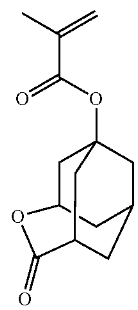

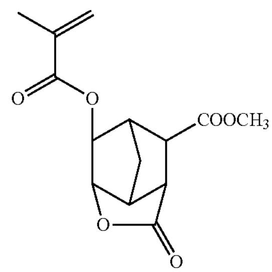

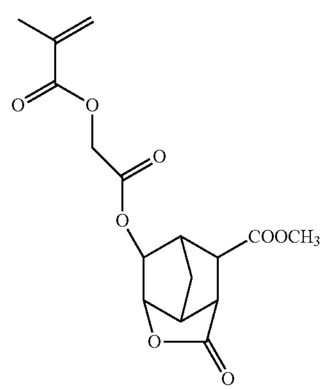

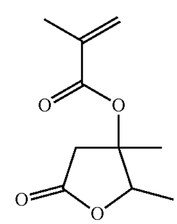

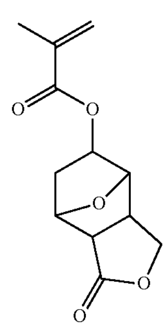

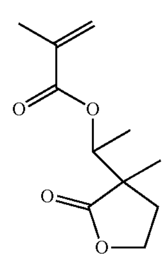

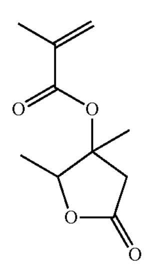

-continued

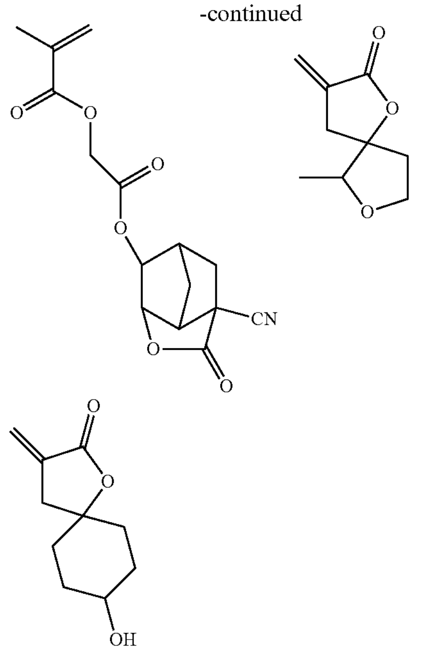

The repeating unit K2 may be a repeating unit having a carbonate structure. As the carbonate structure, a cyclic carbonate ester structure (cyclic carbonate) is preferable.

As the repeating unit having a cyclic carbonate ester structure, a repeating unit represented by General Formula (A-1) is preferable.

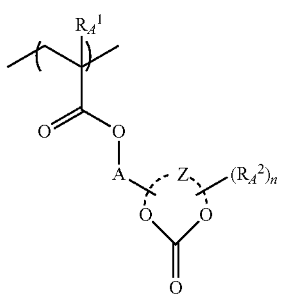

(A-1)

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$ which are present in a plural number may be the same as or different from each other.

A represents a single bond or a divalent linking group.

Z represents an atomic group that forms a monocycle or polycycle with a group represented by —O—CO—O— in the formula.

The repeating unit K2 may be a repeating unit having a polar group such as a hydroxy group, a cyano group, a carboxyl group, and a fluorinated alcohol group (for example, a hexafluoroisopropanol group). The repeating unit having the polar group is preferably a repeating unit having an alicyclic hydrocarbon structure substituted with the polar group. With regard to the alicyclic hydrocarbon structure substituted with the polar group, the alicyclic hydrocarbon structure is preferably a cyclohexyl group, an adamantyl group, or a norbornane group.

Specific examples of a monomer corresponding to the repeating unit having the polar group are shown below, but the present invention is not limited to these specific examples.

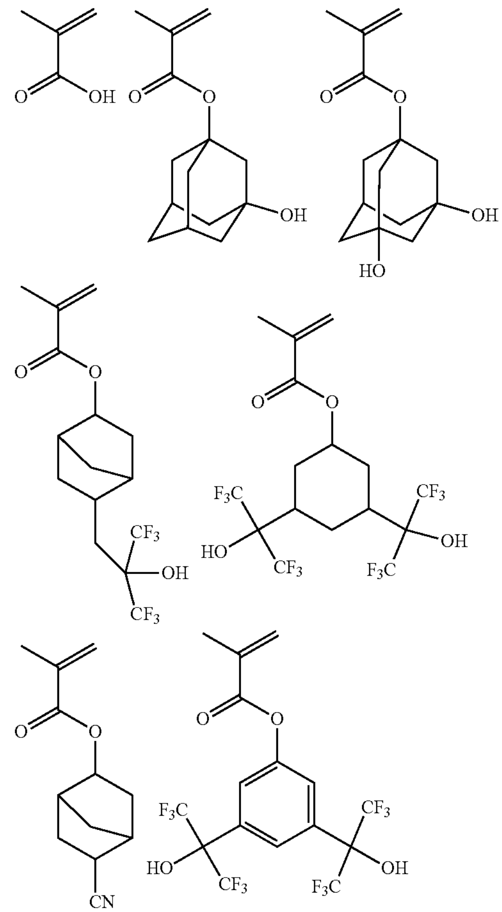

It is also preferable that the resin P has the repeating unit described in paragraphs [0370] to [0433] of the specification of US2016/0070167A1 as the repeating unit K2.

In a case where the resin P includes the repeating unit K2, a type of the repeating unit K2 included in the resin P may be one kind or two or more kinds.

In a case where the resin P includes the repeating unit K2, the content of the repeating unit K2 included in the resin P (in a case where the repeating units K2 are present in a plural number, a total content thereof) is preferably 5% to 70% by mole, more preferably 10% to 65% by mole, and still more preferably 20% to 60% by mole with respect to all the repeating units of the resin P.

<Repeating Unit K3 Having Neither Acid-Decomposable Group Nor Polar Group>

The resin P may further include a repeating unit having neither an acid-decomposable group nor a polar group (also referred to as a "repeating unit K3"), which is different from the repeating unit represented by General Formula (P1).

The repeating unit K3 preferably has an alicyclic hydrocarbon structure. Examples of the repeating unit K3 include the repeating units described in paragraphs [0236] and [0237] of the specification of US2016/0026083A1.

Preferred examples of a monomer corresponding to the repeating unit K3 are shown below.

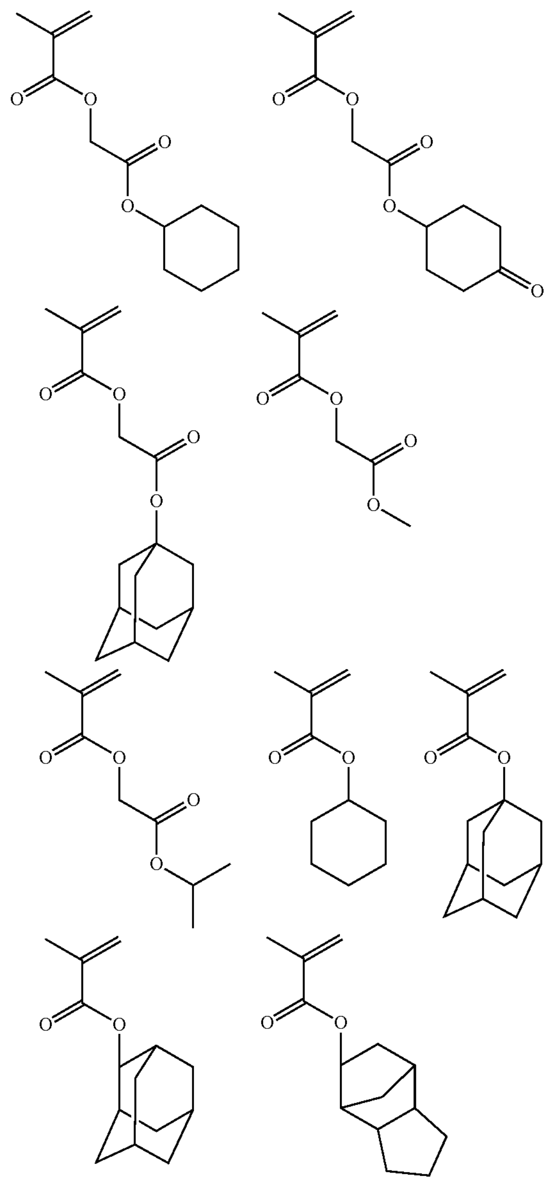

In addition to these, specific examples of the repeating unit K3 include the repeating unit disclosed in paragraph [0433] of the specification of US2016/0070167A1.

In a case where the resin P includes the repeating unit K3, a type of the repeating unit K3 included in the resin P may be one kind or two or more kinds.

In a case where the resin P includes the repeating unit K3, the content of the repeating unit K3 (in a case where the repeating units K3 are present in a plural number, a total content thereof) is preferably 5% to 40% by mole, more preferably 5% to 30% by mole, and still more preferably 5% to 25% by mole with respect to all the repeating units of the resin P.

Moreover, the resin P may have a variety of repeating units, in addition to the repeating structural units, as another repeating unit for the purpose of adjusting dry etching resistance, suitability for a standard developer, adhesiveness to a substrate, and a resist profile, resolving power, heat resistance, sensitivity, and the like which are general characteristics required for a resist.

Examples of such a repeating unit include a repeating unit corresponding to a predetermined monomer, but are not limited thereto.

Examples of a predetermined monomer include a compound having one addition-polymerizable unsaturated bond, selected from acrylates, methacrylates, acrylamides, methacrylamides, allyl compounds, vinyl ethers, and vinyl esters.

In addition to these, an addition-polymerizable unsaturated compound that is copolymerizable with a monomer corresponding to the various repeating structural units may be used.

In the resin P, the content molar ratio of each repeating structural unit is appropriately set in order to adjust various performances.

In a case where the composition of the embodiment of the present invention is used for ArF exposure, the amount of a repeating unit having an aromatic group is in an amount of preferably 15% by mole or less, and more preferably 10% by mole or less with respect to all the repeating units in the resin P from the viewpoint of transparency to ArF light.

In a case where the composition of the embodiment of the present invention is for ArF exposure, it is preferable that all of the repeating units of the resin P are constituted with (meth)acrylate-based repeating units. In this case, any of a resin in which all of the repeating units are methacrylate-based repeating units, a resin in which all of the repeating units are acrylate-based repeating units, and a resin in which all of the repeating units are methacrylate-based repeating units and acrylate-based repeating units can be used, but it is preferable that the amount of the acrylate-based repeating units is 50% by mole or less with respect to all the repeating units of the resin P.

In a case where the composition of the embodiment of the present invention is for KrF exposure, EB exposure, or EUV exposure, the resin P preferably has a repeating unit having an aromatic hydrocarbon ring group, and more preferably includes a repeating unit having a structure (acid-decomposable group) in which a phenolic hydroxy group is protected by an eliminable group that is eliminated through decomposition by the action of an acid. Examples of the repeating unit including a phenolic hydroxy group include a hydroxystyrene repeating unit and a hydroxystyrene (meth) acrylate repeating unit.

In a case where the composition of the embodiment of the present invention is for KrF exposure, EB exposure, or EUV exposure, the content of the repeating unit having an aromatic hydrocarbon ring group included in the resin P is preferably 30% by mole or more with respect to all the repeating units in the resin P. In addition, an upper limit thereof is not particularly limited, but is, for example, 100% by mole or less. Among those, the upper limit is preferably 30% to 100% by mole, more preferably 40% to 100% by mole, and still more preferably 50% to 100% by mole.

The weight-average molecular weight (Mw) of the resin P is preferably 1,000 to 200,000, more preferably 2,000 to 20,000, and still more preferably 3,000 to 20,000. The dispersity (Mw/Mn) is usually 1.0 to 3.0, preferably 1.0 to 2.6, more preferably 1.0 to 2.0, and still more preferably 1.1 to 2.0.

In the composition of the embodiment of the present invention, the resin P may be used singly or in combination of two or more kinds thereof.

The content of the resin P in the composition of the embodiment of the present invention is preferably from 10% by mass to 90% by mass, more preferably from 20% by mass to 90% by mass, and still more preferably from 30% by mass to 90% by mass with respect to the total solid content.

Furthermore, the solid content is intended to be components excluding the solvent in the composition, and any of components other than the solvent are regarded as a solid content even in a case where they are liquid components.

[Photoacid Generator Aw]

The composition of the embodiment of the present invention contains a photoacid generator Aw.

The photoacid generator Aw is a compound that generates an acid having a pKa of −1.40 or more upon irradiation with actinic rays or radiation.

As described above, in the present invention, by using a photoacid generator Aw that generates a weak acid having a pKa of −1.40 or more, an interaction with the resin P is stronger, as compared with a case of using a photoacid generator that generates a strong acid having a pKa of less than −1.40, and the diffusion of the generated acid can be suppressed, whereby the EL performance is improved, the LWR and the LER are small, and the CDU is excellent.

The pKa of an acid generated from the photoacid generator Aw is −1.40 or more, preferably −1.30 or more, more preferably −1.00 or more, and still more preferably −0.90 or more. The upper limit of the pKa of an acid generated from the photoacid generator Aw is not particularly limited, but is preferably 5.00 or less, more preferably 3.00 or less, still more preferably 2.50 or less, and particularly preferably 2.00 or less.

The photoacid generator Aw is preferably a compound (substantially an ionic compound) that does not include an aromatic ring in the anionic structure. Since such a photoacid generator Aw is highly transparent, in particular to ArF, light tends to sufficiently reach the bottom of an actinic ray-sensitive or radiation-sensitive film even in a case where exposure with ArF is carried out.

The acid having a pKa of −1.40 or more generated from the photoacid generator Aw upon irradiation with actinic rays or radiation is preferably a sulfonic acid.

The acid having a pKa of −1.40 or more generated from the photoacid generator Aw upon irradiation with actinic rays or radiation is preferably an alkylsulfonic acid. The alkylsulfonic acid is preferably an alkylsulfonic acid including no fluorine atom or an alkylsulfonic acid having a fluorine atom or a fluoroalkyl group bonded to a carbon atom at an α-position of a sulfonic acid group, in which a total of the number of the fluorine atoms bonded to the carbon atom at the α-position of the sulfonic acid group and the number of the fluoroalkyl groups bonded to the carbon atom at the α-position of the sulfonic acid group is 1.

The acid having a pKa of −1.40 or more generated from the photoacid generator Aw upon irradiation with actinic rays or radiation is preferably a sulfonic acid represented by any of General Formulae (Aw-1), (Aw-2), and (I) to (V).

In other words, the photoacid generator Aw is preferably a compound that generates a sulfonic acid represented by any of General Formulae (Aw-1), (Aw-2), and (I) to (V) upon irradiation with actinic rays or radiation.

(Aw-1)

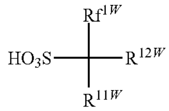

-continued (Aw-2)

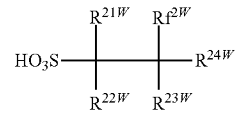

(I)

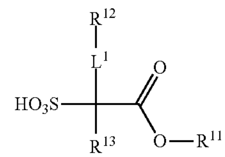

(II)

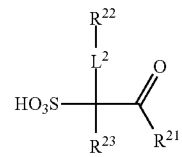

(III)

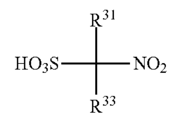

(IV)

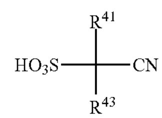

(V)

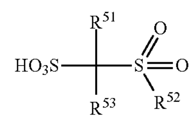

In General Formula (Aw-1), $R^{11W}$ represents a hydrogen atom or a monovalent organic group. $R^{12W}$ represents a monovalent organic group. $Rf^{1W}$ represents a hydrogen atom, a fluorine atom, or a monovalent organic group.

In General Formula (Aw-2), $R^{21W}$, $R^{22W}$, and $R^{23W}$ each independently represent a hydrogen atom, a fluorine atom, or a monovalent organic group. $R^{24W}$ represents a monovalent organic group. $Rf^{2W}$ represents a fluorine atom or a monovalent organic group including a fluorine atom.

In General Formula (I), $R^{11}$ and $R^{12}$ each independently represent a monovalent organic group. $R^{13}$ represents a hydrogen atom or a monovalent organic group. $L^1$ represents a group represented by —CO—O—, —CO—, —O—, —S—, —O—CO—, —S—CO—, or —CO—S—. Two of $R^{11}$, $R^{12}$, and $R^{13}$ may be bonded to each other to form a ring.

In General Formula (II), $R^{21}$ and $R^{22}$ each independently represent a monovalent organic group. $R^{23}$ represents a hydrogen atom or a monovalent organic group. $L^2$ represents a group represented by —CO—, —O—, —S—, —O—CO—, —S—CO—, or —CO—S—. Two of $R^{21}$, $R^{22}$, and $R^{23}$ may be bonded to each other to form a ring.

In General Formula (III), $R^{31}$ and $R^{33}$ each independently represent a hydrogen atom or a monovalent organic group. $R^{31}$ and $R^{33}$ may be bonded to each other to form a ring.

In General Formula (IV), $R^{41}$ and $R^{43}$ each independently represent a hydrogen atom or a monovalent organic group. $R^{41}$ and $R^{43}$ may be bonded to each other to form a ring.

In General Formula (V), $R^{51}$, $R^{52}$, and $R^{53}$ each independently represent a hydrogen atom or a monovalent organic group. Two of $R^{51}$, $R^{52}$, and $R^{53}$ may be bonded to each other to form a ring.

In General Formula (Aw-1), $R^{11W}$ represents a hydrogen atom or a monovalent organic group.

The monovalent organic group represented by $R^{11W}$ is not particularly limited, and is preferably an organic group having 1 to 20 carbon atoms. Examples of the monovalent organic group include an alkyl group and a cycloalkyl group, and the alkyl group may be either linear or branched. The alkyl group preferably has 1 to 20 carbon atoms, more preferably has 1 to 10 carbon atoms, and still more preferably has 1 to 6 carbon atoms. The cycloalkyl group preferably has 3 to 20 carbon atoms, and more preferably has 6 to 20 carbon atoms. Furthermore, the alkyl group and the cycloalkyl group represented by $R^{11W}$ may further have a substituent. The monovalent organic group represented by $R^{11W}$ preferably has no fluorine atom.

As $R^{11W}$, the hydrogen atom is preferable.

$R^{12W}$ represents a monovalent organic group. The monovalent organic group represented by $R^{12W}$ is not particularly limited, and is preferably an organic group having 1 to 30 carbon atoms, more preferably an organic group having 1 to 20 carbon atoms, and still more preferably an organic group having 1 to 10 carbon atoms. Examples of the monovalent organic group include a group represented by *-$L_{11}$-$W_{11}$. Here, $L_{11}$ represents a divalent linking group, $W_{11}$ represents an organic group including a cyclic structure, and * represents a bonding position.

Examples of the divalent linking group represented by $L_{11}$ include —COO—(—C(═O)—O—), —OCO—, —CONH—, —NHCO—, —CO—, —O—, —S—, —SO—, —$SO_2$—, a linear or branched alkylene group (preferably having 1 to 6 carbon atoms), a cycloalkylene group (preferably having 3 to 15 carbon atoms), an alkenylene group (preferably having 2 to 6 carbon atoms), and a divalent linking group formed by combination of a plurality of these groups. Specific examples thereof include —COO—, —OCO—, —CONH—, —NHCO—, —CO—, —O—, —$SO_2$—, -AL-, —COO-AL-, —OCO-AL-, —CONH-AL-, —NHCO-AL-, -AL-OCO—, -AL-COO—, —CO-AL-, -AL-CO—, —O-AL-, -AL-O—, and -AL-O—CO—O-AL-. Further, AL represents a linear or branched alkylene group (preferably having 1 to 6 carbon atoms).

$W_{11}$ represents an organic group including a cyclic structure. Among those, $W_{11}$ is preferably a cyclic organic group.

Examples of the cyclic organic group include an alicyclic group, an aryl group, and a heterocyclic group.

The alicyclic group may be monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable.

The aryl group may be monocyclic or polycyclic. Examples of the aryl group include a phenyl group, a naphthyl group, a phenanthryl group, and an anthryl group.

The heterocyclic group may be monocyclic or polycyclic. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle not having aromaticity include a tetrahydropyran ring, a lactone ring, a sultone ring, and a decahydroisoquinoline ring. Examples of the lactone ring and the sultone ring include the lactone structure and the sultone structure exemplified in the aforementioned resin. As the heterocycle in the heterocyclic group, the furan ring, the thiophene ring, the pyridine ring, or the decahydroisoquinoline ring is particularly preferable.

The cyclic organic group may have a substituent. Examples of the substituent include an alkyl group (which may be either linear or branched, preferably having 1 to 12 carbon atoms), a cycloalkyl group (which may be any of a monocycle, a polycycle, and a spirocycle, and preferably has 3 to 20 carbon atoms), an aryl group (preferably having 6 to 14 carbon atoms), a hydroxy group, an alkoxy group, an ester group, an amide group, a urethane group, a ureide group, a thioether group, a sulfonamide group, and a sulfonic ester group. Incidentally, the carbon constituting the cyclic organic group (carbon contributing to ring formation) may be carbonyl carbon.

$Rf^{1W}$ represents a hydrogen atom, a fluorine atom, or a monovalent organic group.

The monovalent organic group represented by $Rf^{1W}$ is not particularly limited, and examples thereof include a monovalent organic group including a fluorine atom, and preferably include an alkyl group substituted with at least one fluorine atom (in which the alkyl group may be either linear or branched) or a cycloalkyl group. The alkyl group preferably has 1 to 10 carbon atoms, more preferably has 1 to 6 carbon atoms, still more preferably has 1 to 4 carbon atoms, and particularly preferably has 1 to 3 carbon atoms. The cycloalkyl group preferably has 3 to 20 carbon atoms, and more preferably has 6 to 15 carbon atoms. In addition, a perfluoroalkyl group is preferable as the alkyl group substituted with at least one fluorine atom. A perfluorocycloalkyl group is preferable as the cycloalkyl group substituted with at least one fluorine atom.

As $Rf^{1W}$, the hydrogen atom, the fluorine atom, or the perfluoroalkyl group is preferable, the hydrogen atom, the fluorine atom, or a perfluoroalkyl group having 1 to 4 carbon atoms is more preferable, and the hydrogen atom, the fluorine atom, or a trifluoromethyl group is still more preferable.

In General Formula (Aw-2), $R^{21W}$, $R^{22W}$, and $R^{23W}$ each independently represent a hydrogen atom, a fluorine atom, or a monovalent organic group. The monovalent organic group represented by each of $R^{21W}$, $R^{22W}$, and $R^{23W}$ is not particularly limited, examples thereof include the groups exemplified by the above-mentioned substituent T, and among these, the fluorine atom, the alkyl group (which may either linear or branched, and preferably has 1 to 20 carbon atoms, more preferably has 1 to 10 carbon atoms, and still more preferably has 1 to 6 carbon atoms), or the cycloalkyl group (preferably having 3 to 20 carbon atoms, and more preferably having 6 to 15 carbon atoms) is preferable. Further, the alkyl group or the cycloalkyl group represented by each of $R^{21W}$, $R^{22W}$, and $R^{23W}$ may further have a substituent, and may be substituted with, for example, a fluorine atom.

As each of $R^{21W}$, $R^{22W}$, and $R^{23W}$, the hydrogen atom or the fluorine atom is preferable. Furthermore, it is preferable that at least one of $R^{21W}$ or $R^{22W}$ represents a group other than a fluorine atom, and it is more preferable that any of $R^{21W}$ or $R^{22W}$ is a hydrogen atom.

$R^{24W}$ represents a monovalent organic group.

The monovalent organic group represented by $R^{24W}$ is preferably an organic group having 1 to 20 carbon atoms, and examples thereof include a monovalent organic group having 1 to 20 carbon atoms, which has no fluorine atom, and specifically includes the same ones mentioned as the monovalent organic group represented by $R^{12W}$ in General Formula (Aw-1).

$Rf^{2W}$ represents a fluorine atom or a monovalent organic group including a fluorine atom.

Examples of the monovalent organic group including a fluorine atom represented by $Rf^{2W}$ include those mentioned as the monovalent organic group including a fluorine atom, represented by $Rf^{1W}$, in General Formula (Aw-1).

The monovalent organic group as each of $R^{11}$, $R^{12}$, $R^{13}$, $R^{21}$, $R^{22}$, $R^{23}$, $R^{31}$, $R^{33}$, $R^{41}$, $R^{43}$, $R^{51}$, $R^{52}$, and $R^{53}$ in General Formulae (I) to (V) is not particularly limited, but preferably has 1 to 30 carbon atoms, more preferably has 1 to 20 carbon atoms, and still more preferably has 1 to 10 carbon atoms. Examples of the monovalent organic group include an alkyl group, a cycloalkyl group, an aryl group, an aralkyl group, and an alkenyl group. These groups may further have a substituent.

The substituent is not particularly limited, but examples thereof include a halogen atom, an alkyl group (which may be either linear or branched, and preferably has 1 to 12 carbon atoms), a cycloalkyl group (which may be any of a monocycle, a polycycle, and a spiro ring, and preferably has 3 to 20 carbon atoms), an aryl group (preferably having 6 to 14 carbon atoms), a hydroxy group, a carbonyl group, an ether group, a cyano group, an alkoxy group, an ester group, an amide group, a urethane group, a ureide group, a thioether group, a sulfonamide group, a sulfonic ester group, and a group formed by combination of two or more kinds selected from these groups.

In General Formula (I), $L^1$ represents a group represented by —CO—O—, —CO—, —O—, —S—, —O—CO—, —S—CO—, or —CO—S—, and in the above-mentioned divalent linking group, it is preferable that the bond on the left side is bonded to the carbon atom to which a sulfonic acid group (—$SO_3H$) is bonded, and the bond on the right side is bonded to $R^{12}$.

In General Formula (II), $L^2$ represents a group represented by —CO—, —O—, —S—, —O—CO—, —S—CO—, or —CO—S—, and in the divalent linking group, it is preferable that a left-side bond is bonded to the carbon atom to which a sulfonic acid group (—$SO_3H$) is bonded and a right-side bond is bonded to $R^{22}$.

The acid having a pKa of −1.40 or more generated from the photoacid generator Aw upon irradiation with actinic rays or radiation is more preferably a sulfonic acid represented by General Formula (Aw-1) or (Aw-2), and still more preferably a sulfonic acid represented by General Formula (a) or (b).

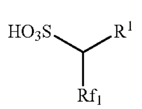

(a)

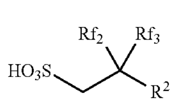

(b)

In General Formula (a), $Rf_1$ represents a hydrogen atom, a fluorine atom, or an alkyl group including a fluorine atom. $R^1$ represents a monovalent organic group.

In General Formula (b), $Rf_2$ and $Rf_3$ each independently represent a fluorine atom or an alkyl group including a fluorine atom. $R^2$ represents a monovalent organic group.

The monovalent organic group represented by each of $R^1$ and $R^2$ in General Formulae (a) and (b) is not particularly limited, but preferably has 1 to 30 carbon atoms, more preferably has 1 to 20 carbon atoms, and still more preferably has 1 to 10 carbon atoms. Examples of the monovalent organic group include an alkyl group, a cycloalkyl group, an alkyloxycarbonyl group, a cycloalkyloxycarbonyl group, an alkylcarbonyloxy group, and a cycloalkylcarbonyloxy group. These groups may further have a substituent.

Preferred ranges of $R^1$ and $R^2$ are the same as that of $R^{12W}$.

The alkyl group including a fluorine atom as each of $Rf_1$, $Rf_2$ and $Rf_3$ in General Formulae (a) and (b) represents an alkyl group in which at least one hydrogen atom is substituted with a fluorine atom, and the alkyl group preferably has 1 to 6 carbon atoms, and more preferably has 1 to 3 carbon atoms.

In addition, the alkyl group including a fluorine atom is preferably a perfluoroalkyl group, and more preferably a trifluoromethyl group.

Specific examples of a sulfonic acid generated from the photoacid generator Aw upon irradiation with actinic rays or radiation will be shown below, but the present invention is not limited thereto.

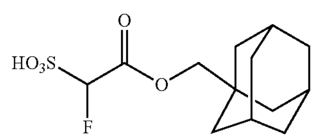
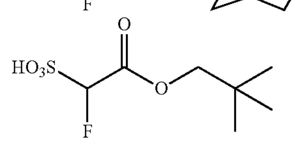
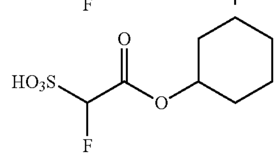
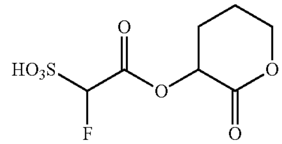
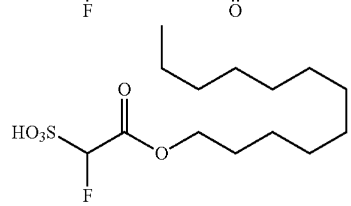
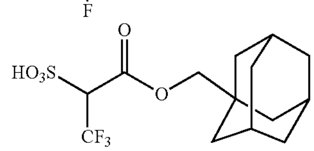
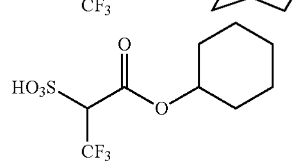

-continued
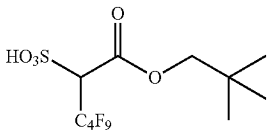
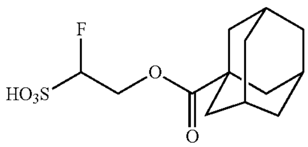
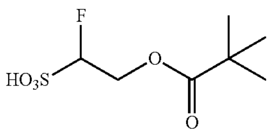
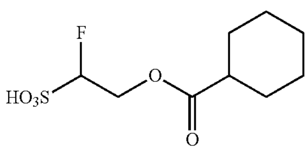
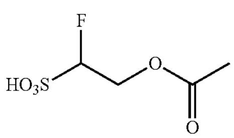
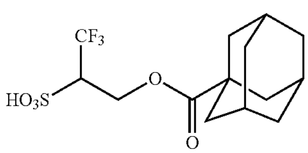
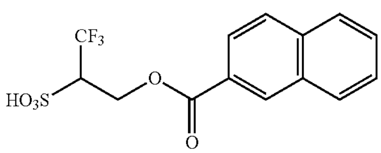
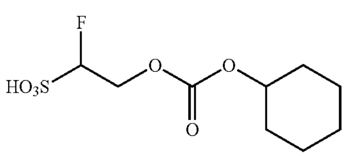
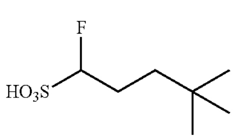
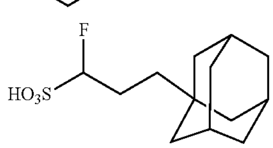
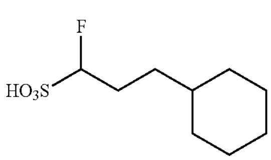
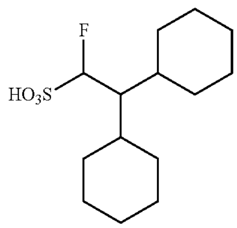
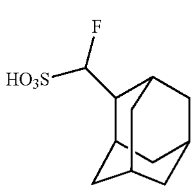
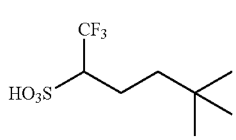
-continued
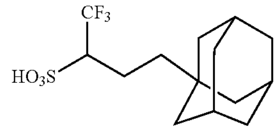
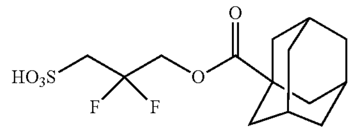
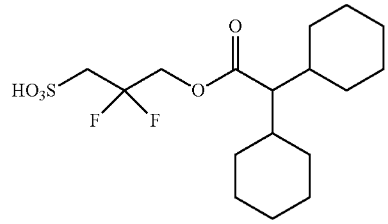
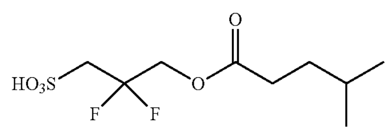
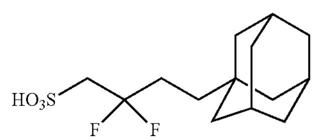
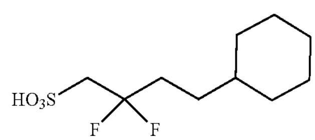
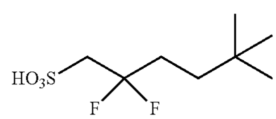
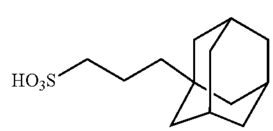
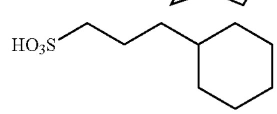
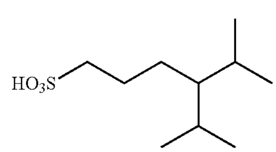
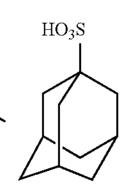
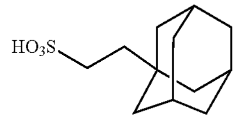
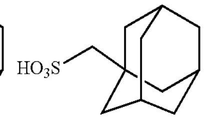
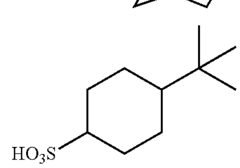
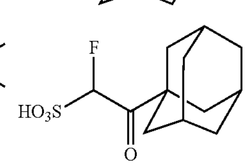

-continued
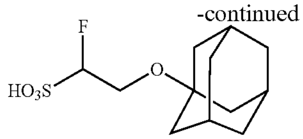
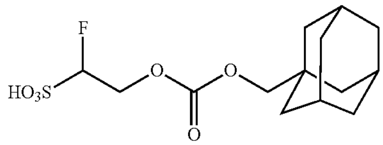
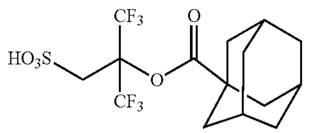
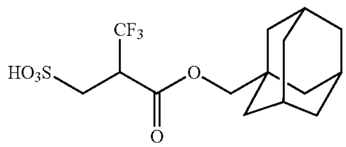
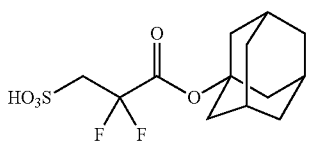
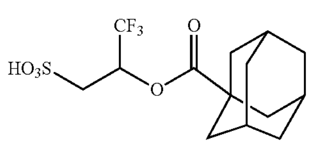
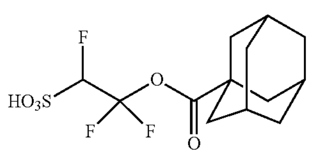
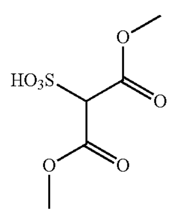
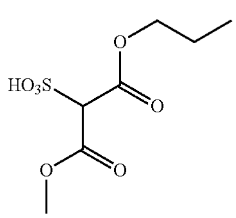
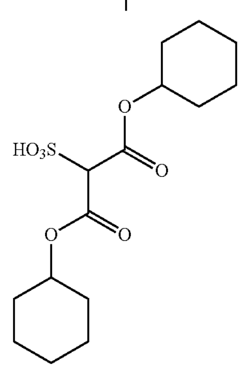
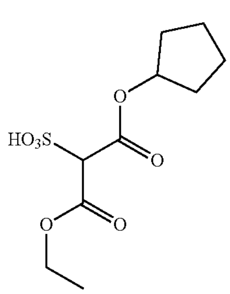
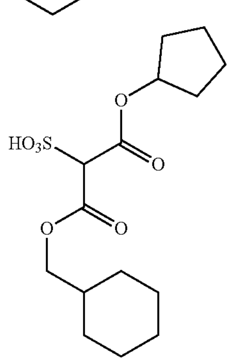
-continued
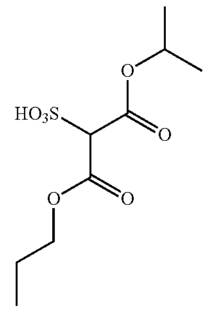
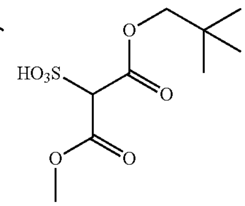
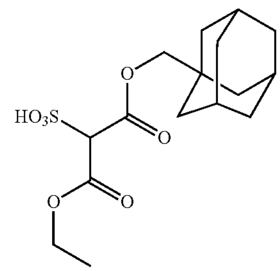
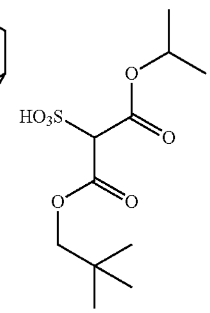
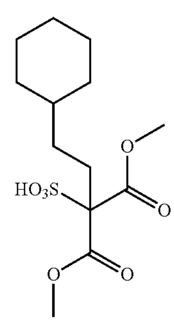
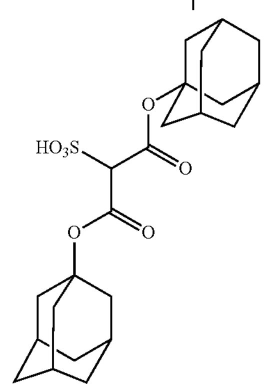
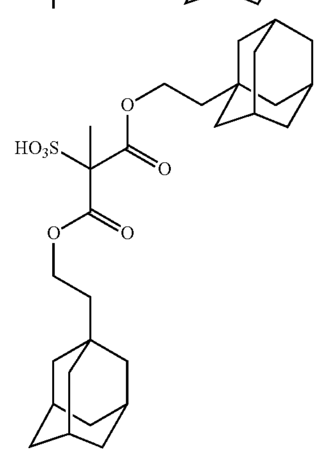
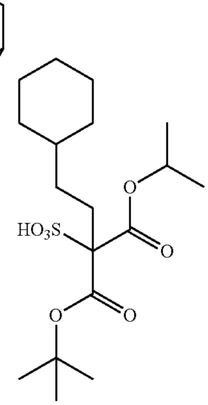
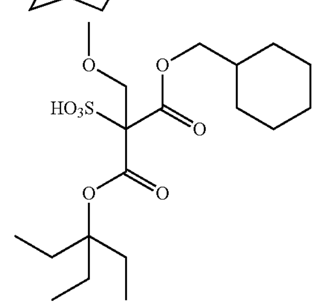
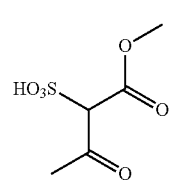

-continued
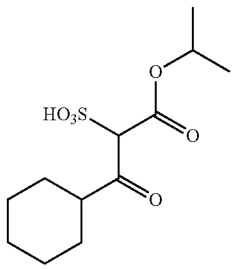
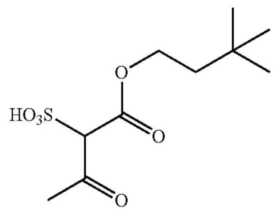
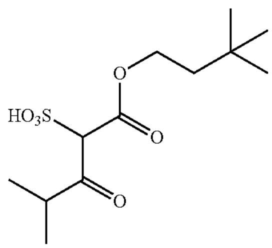
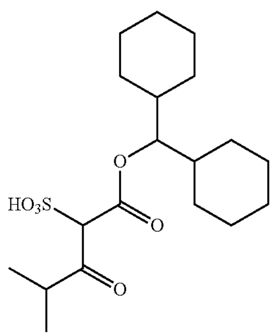
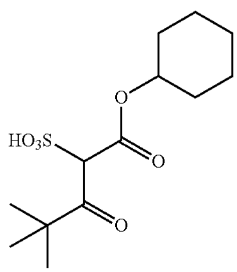
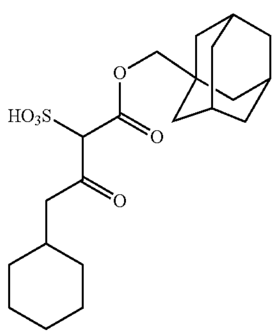
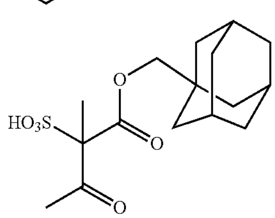
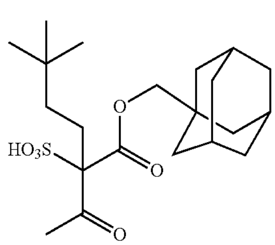
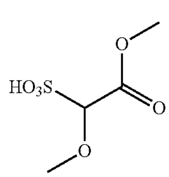
-continued
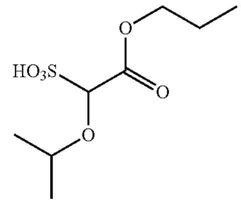
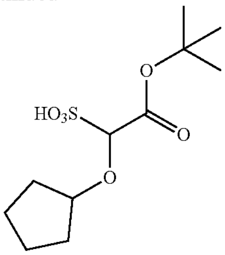
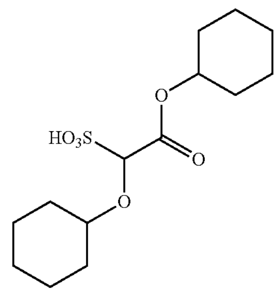
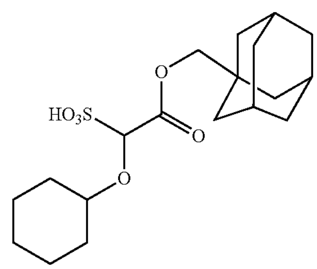
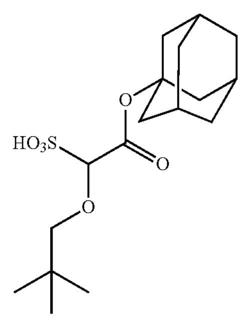
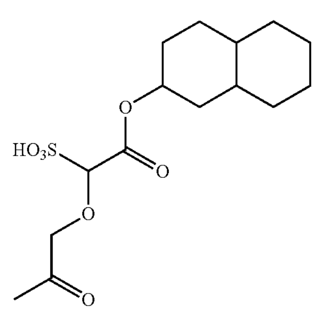

47
-continued
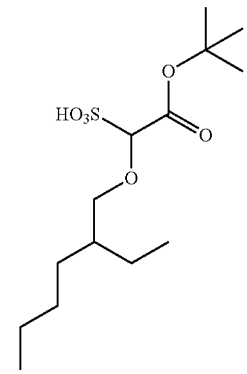
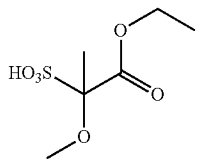
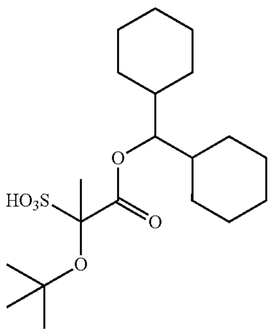
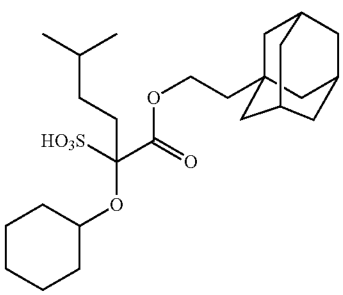
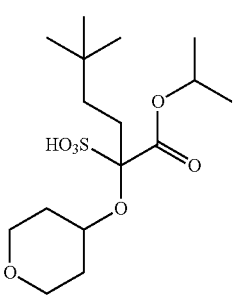
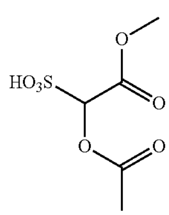
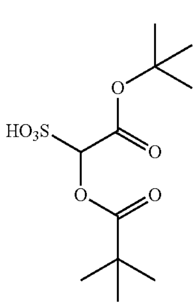
48
-continued
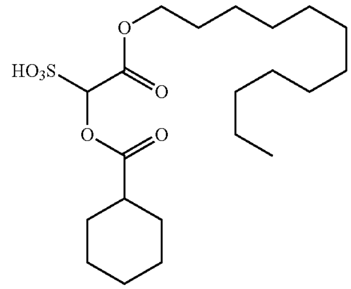
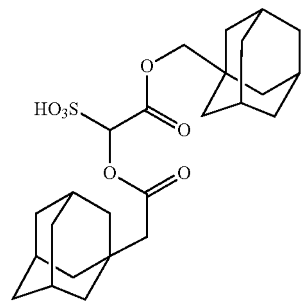
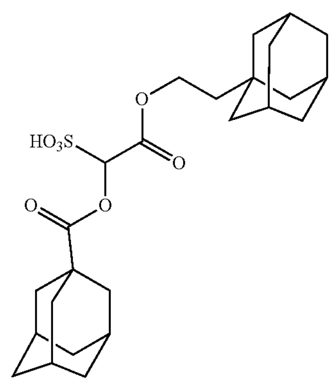
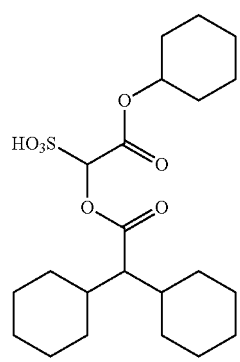
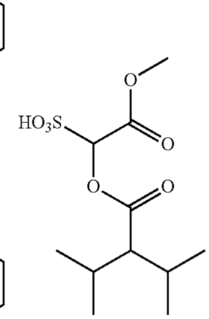
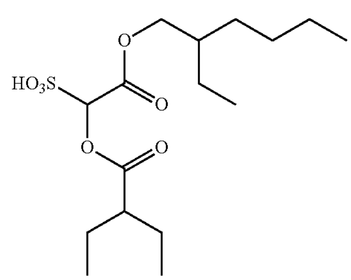

-continued
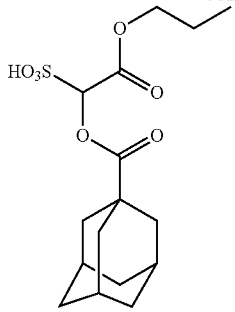
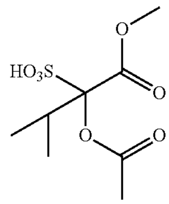
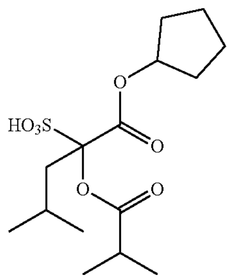
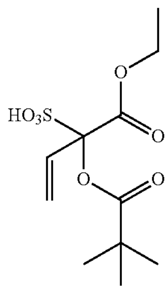
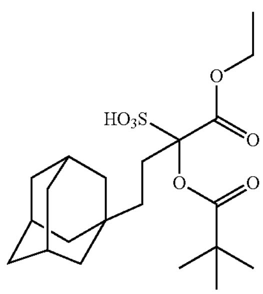
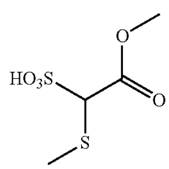
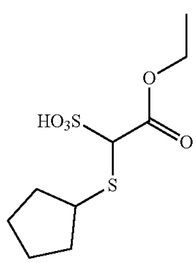
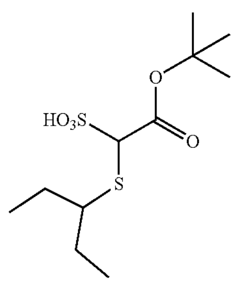
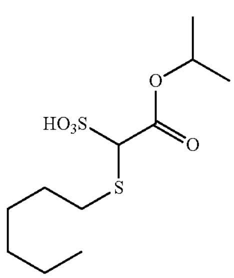
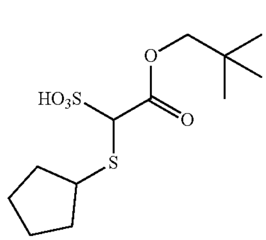
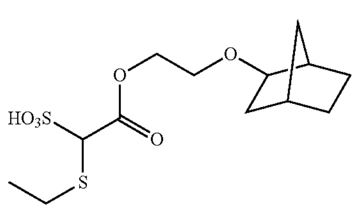
-continued
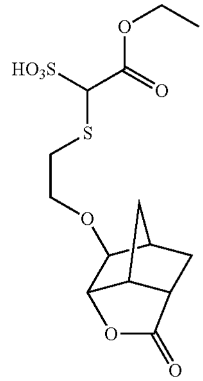
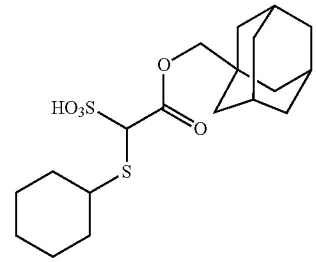
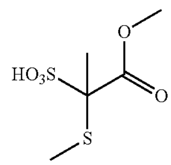
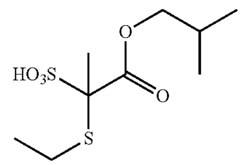
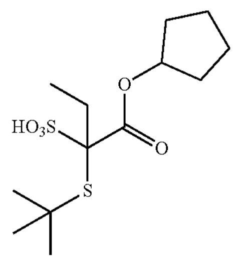
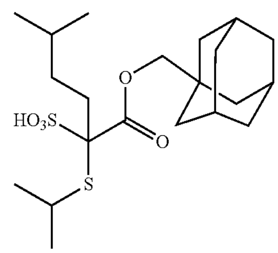
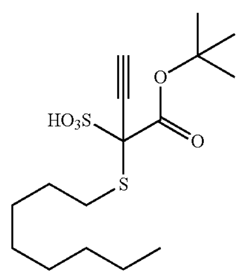
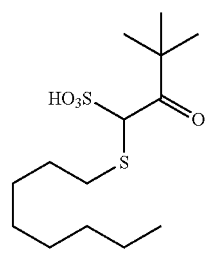
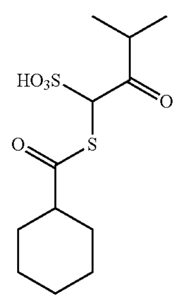
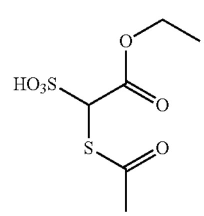
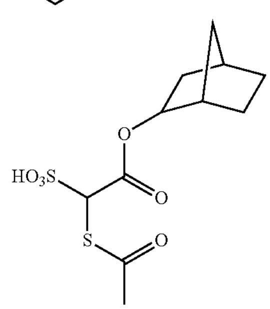
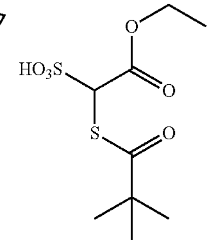

-continued
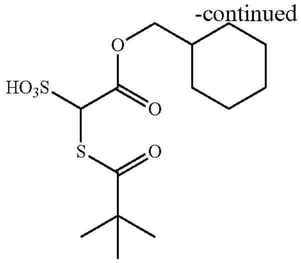
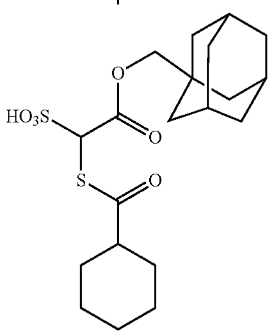
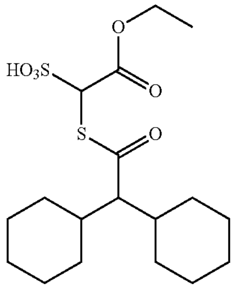
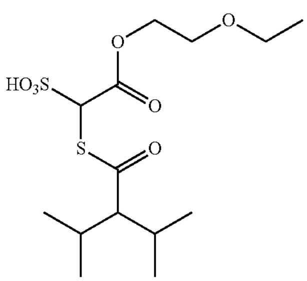
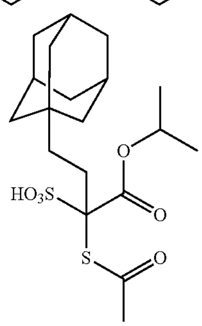
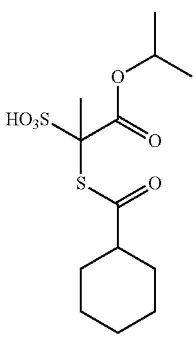
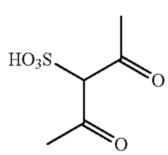
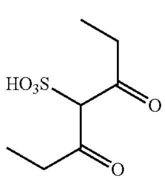
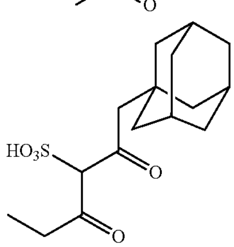
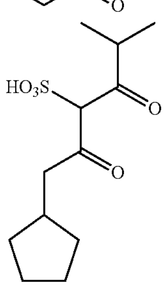
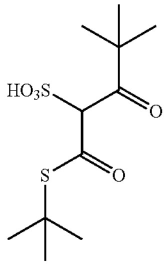
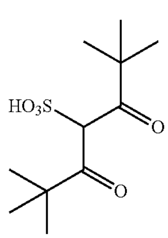
-continued
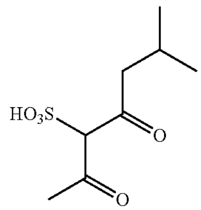
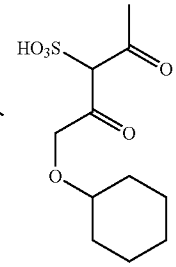
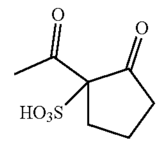
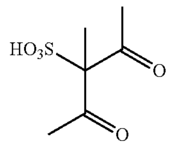
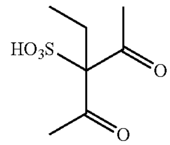
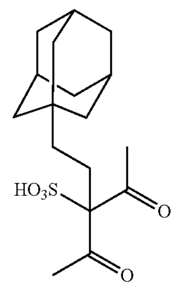
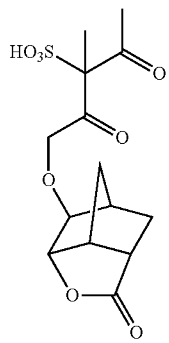
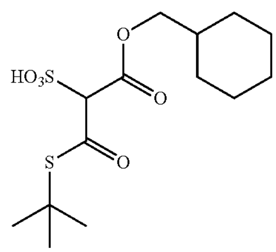
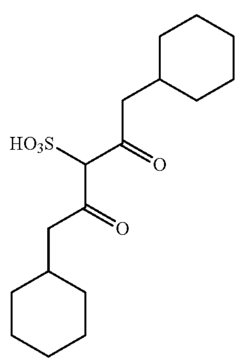
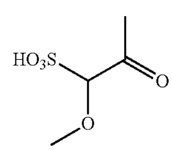
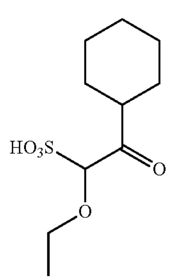
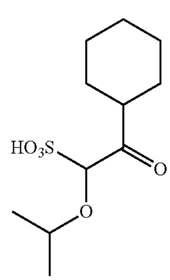

-continued
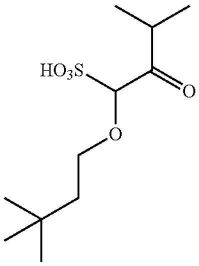
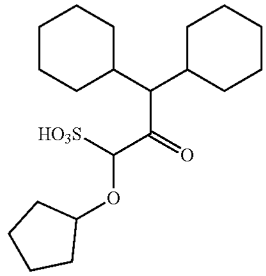
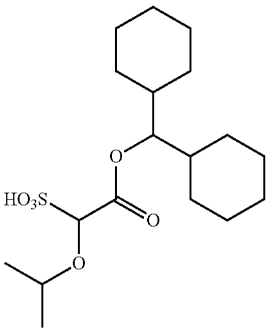
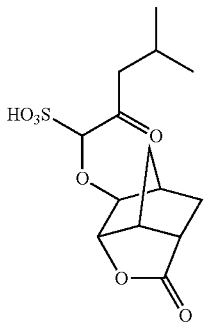
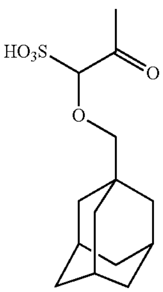
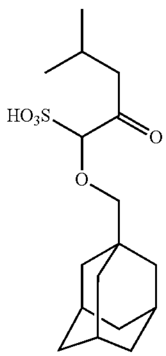
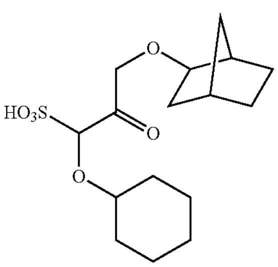
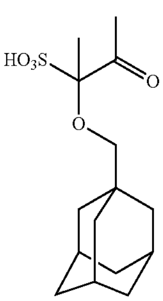
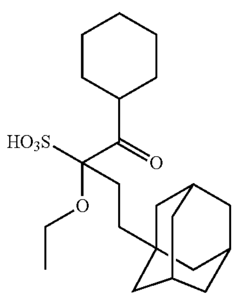
-continued
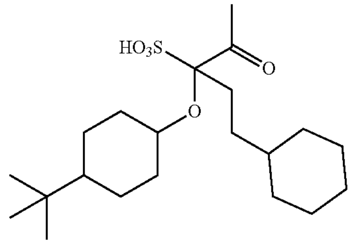
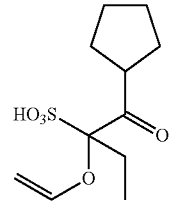
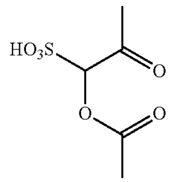
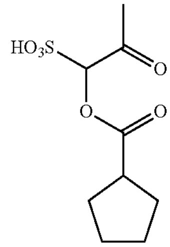
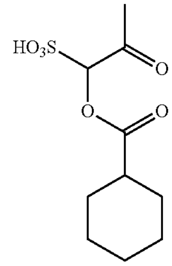
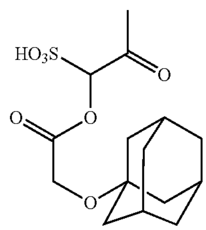
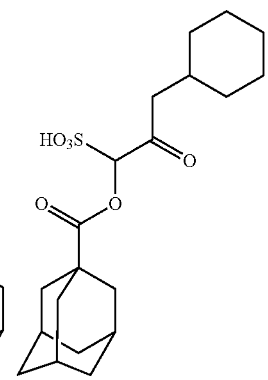
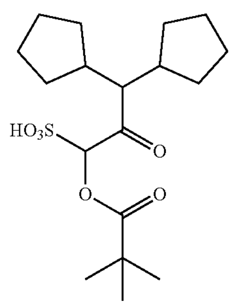
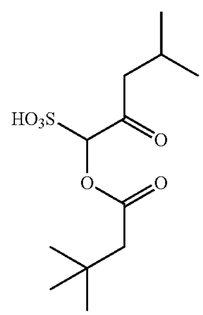
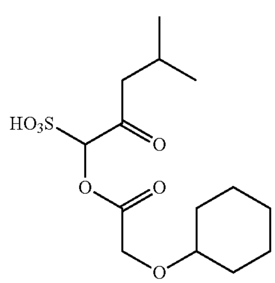

-continued
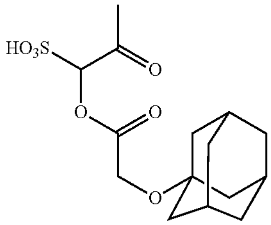
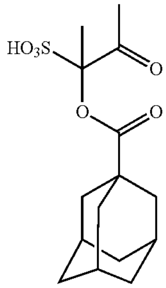
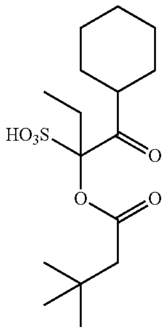
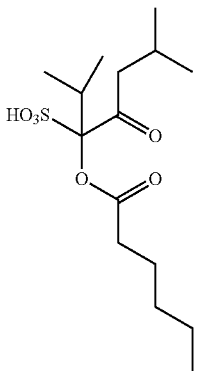
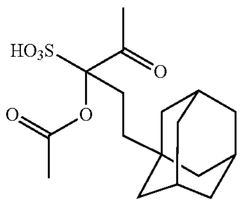
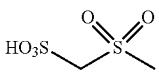
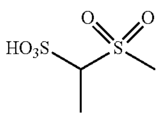
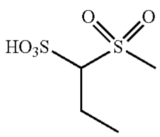
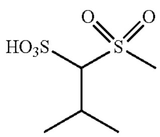
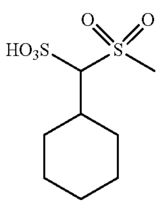
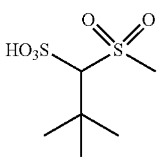
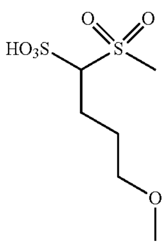
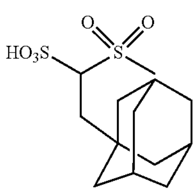
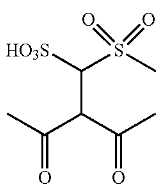
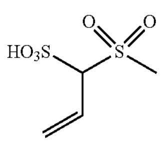
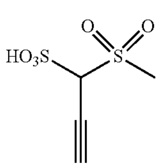
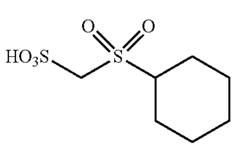
-continued
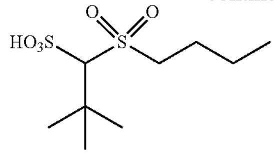
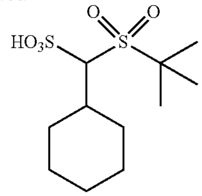
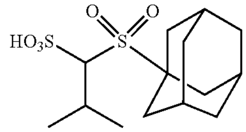
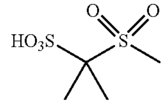
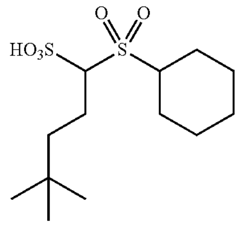
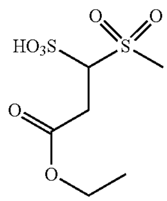
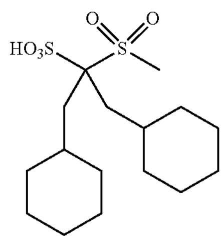
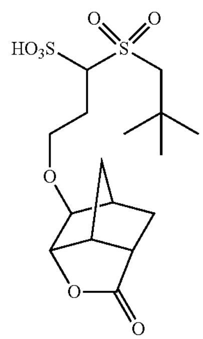
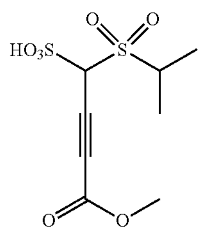
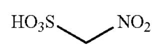
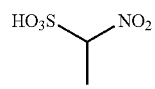
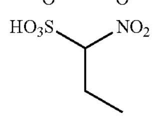
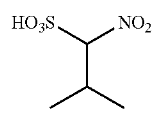
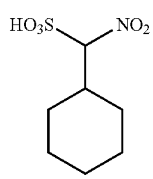
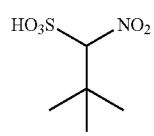
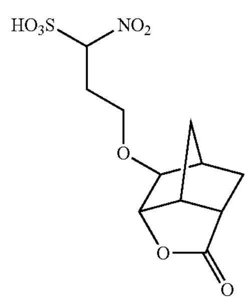
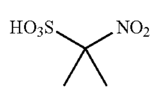

-continued

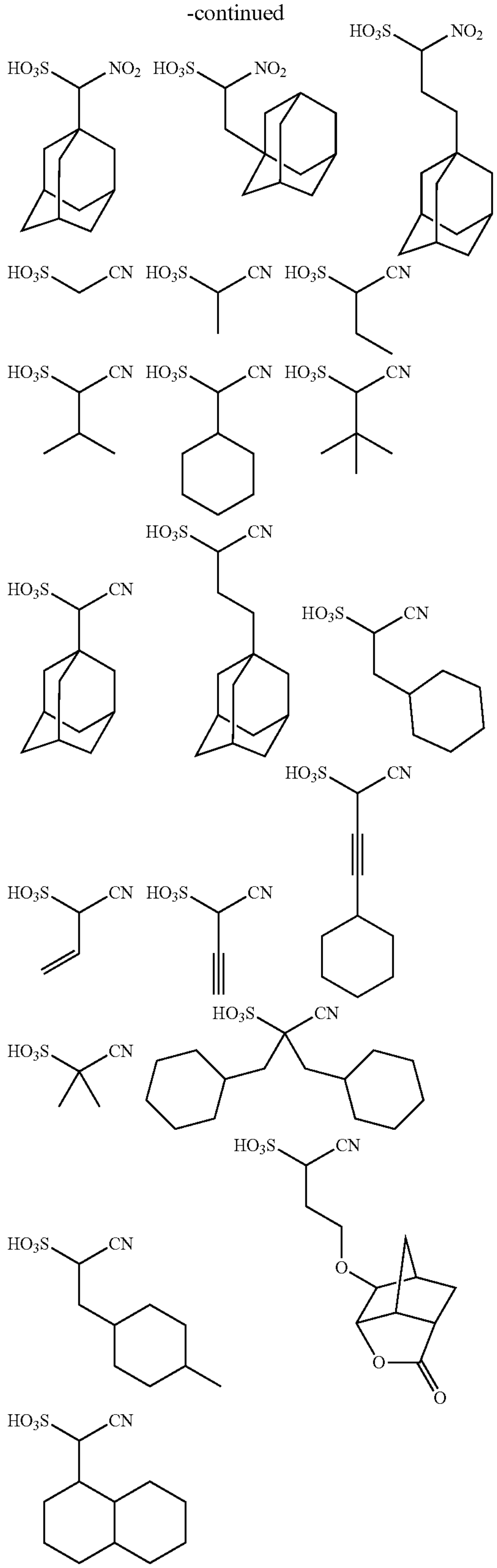

The photoacid generator Aw is preferably, for example, a compound represented by General Formula (ZI), General Formula (ZII), or General Formula (ZIII).

(ZI)

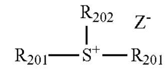

(ZII)

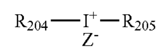

(ZIII)

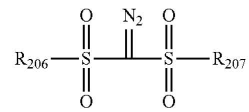

In General Formula (ZI), $R_{201}$, $R_{202}$, and $R_{203}$ each independently represent an organic group.

The organic group as each of $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group), and —$CH_2$—$CH_2$—O—$CH_2$—$CH_2$—.

$Z^-$ represents an anion (preferably a non-nucleophilic anion), and preferably represents a sulfonate anion corresponding to the above-mentioned sulfonic acid represented by any of General Formulae (Aw-1), (Aw-2), and (I) to (V).

Examples of $R_{201}$, $R_{202}$, and $R_{203}$ in General Formula (ZI) include the corresponding groups in a compound (ZI-1), a compound (ZI-2), a compound represented by General Formula (ZI-3) (compound (ZI-3)), and a compound represented by General Formula (ZI-4) (compound (ZI-4)), each of which will be described later.

Furthermore, the photoacid generator Aw may be a compound having a plurality of the structures represented by General Formula (ZI). For example, the photoacid generator may be a compound having a structure in which at least one of $R_{201}$, . . . , or $R_{203}$ of the compound represented by General Formula (ZI) and at least one of $R_{201}$, . . . , or $R_{203}$ of another compound represented by General Formula (ZI) are bonded via a single bond or a linking group.

Examples of the compound represented by General Formula (ZI) include a compound (ZI-1) and a compound (ZI-2), a compound represented by General Formula (ZI-3), and a compound represented by General Formula (ZI-4), each of which will be described below.

First, the compound (ZI-1) will be described.

The compound (ZI-1) is an arylsulfonium compound in which at least one of $R_{201}$, . . . , or $R_{203}$ in General Formula (ZI) is an aryl group, that is, a compound having arylsulfonium as a cation.

In the arylsulfonium compound, all of $R_{201}$ to $R_{203}$ may be aryl groups, or some of $R_{201}$ to $R_{203}$ may be an aryl group, and the rest may be an alkyl group or a cycloalkyl group.

In addition, one of $R_{201}$ to $R_{203}$ may be an aryl group, the remaining two of $R_{201}$ to $R_{203}$ may be bonded to each other to form a ring structure, and an oxygen atom, a sulfur atom, an ester group, an amide group, or a carbonyl group may be included in the ring. Examples of a group formed by the bonding of two of $R_{201}$ to $R_{203}$ include an alkylene group (for example, a butylene group, a pentylene group, or —$CH_2$—$CH_2$—O—$CH_2$—$CH_2$—) in which one or more methylene groups are substituted with an oxygen atom, a sulfur atom, an ester group, an amide group, and/or a carbonyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

As the aryl group included in the arylsulfonium compound, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, the two or more aryl groups may be the same as or different from each other.

The alkyl group or the cycloalkyl group contained in the arylsulfonium compound, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R_{201}$ to $R_{203}$ may each independently have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxy group, or a phenylthio group as a substituent.

Next, the compound (ZI-2) will be described.

The compound (ZI-2) is a compound in which $R_{201}$ to $R_{203}$ in Formula (ZI) each independently represent an organic group having no aromatic ring. Here, the aromatic ring also includes an aromatic ring including a heteroatom.

The organic group having no aromatic ring as each of $R_{201}$ to $R_{203}$ generally has 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Preferred examples of the alkyl group and the cycloalkyl group of each of $R_{201}$ to $R_{203}$ include a linear alkyl group having 1 to 10 carbon atoms or branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

$R_{201}$ to $R_{203}$ may be further substituted with a halogen atom, an alkoxy group (for example, having 1 to 5 carbon atoms), a hydroxy group, a cyano group, or a nitro group.

Next, the compound (ZI-3) will be described.

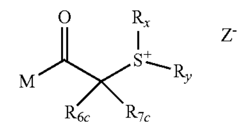

(ZI-3)

In General Formula (ZI-3), M represents an alkyl group, a cycloalkyl group, or an aryl group, and in a case where M has a ring structure, the ring structure may include at least one of an oxygen atom, a sulfur atom, an ester bond, an amide bond, or a carbon-carbon double bond. $R_{6c}$ and $R_{7c}$ each independently represent a hydrogen atom, an alkyl group, a cycloalkyl group, a halogen atom, a cyano group, or an aryl group. $R_{6c}$ and $R_{7c}$ may be bonded to each other to form a ring. $R_x$ and $R_y$ each independently represent an alkyl group, a cycloalkyl group, or an alkenyl group. $R_x$ and $R_y$ may be bonded to each other to form a ring. In addition, at least two selected from M, $R_{6c}$, or $R_{7c}$ may be bonded to each other to form a ring structure, and the ring structure may include a carbon-carbon double bond. $Z^-$ represents an anion, and preferably represents a sulfonate anion corresponding to the sulfonic acid represented by any of General Formulae (Aw-1), (Aw-2), and (I) to (V).

In General Formula (ZI-3), as the alkyl group and the cycloalkyl group represented by M, a linear alkyl group having 1 to 15 carbon atoms (preferably having 1 to 10 carbon atoms), a branched alkyl group having 3 to 15 carbon atoms (preferably having 3 to 10 carbon atoms), or a cycloalkyl group having 3 to 15 carbon atoms (preferably having 1 to 10 carbon atoms) is preferable, and specific examples thereof include a methyl group, an ethyl group, a propyl group, an n-butyl group, a sec-butyl group, a t-butyl group, a cyclopropyl group, a cyclobutyl group, a cyclohexyl group, and a norbornyl group.

The aryl group represented by M is preferably a phenyl group or a naphthyl group, and more preferably the phenyl group. The aryl group may be an aryl group which has a heterocyclic structure having an oxygen atom, a sulfur atom, or the like. Examples of the heterocyclic structure include a furan ring, a thiophene ring, a benzofuran ring, and a benzothiophene ring.

M may further have a substituent (for example, a substituent T). In this aspect, examples of M include a benzyl group.

In addition, in a case where M has a ring structure, the ring structure may include at least one of an oxygen atom, a sulfur atom, an ester bond, an amide bond, or a carbon-carbon double bond.

Examples of the alkyl group, the cycloalkyl group, and the aryl group represented by each of $R_{6c}$ and $R_{7c}$ include the same ones as those of M as mentioned above, and preferred aspects thereof are also the same. In addition, $R_{6c}$ and $R_{7c}$ may be bonded to each other to form a ring.

Examples of the halogen atom represented by each of $R_{6c}$ and $R_{7c}$ include a fluorine atom, a chlorine atom, a bromine atom, and an iodine atom.

Examples of the alkyl group and the cycloalkyl group represented by each of $R_x$ and $R_y$ include the same ones as those of M as mentioned above, and preferred aspects thereof are also the same.

The alkenyl group represented by each of $R_x$ and $R_y$ is preferably an allyl group or a vinyl group.

$R_x$ and $R_y$ may further have a substituent (for example, a substituent T). In this aspect, examples of each of $R_x$ and $R_y$ include a 2-oxoalkyl group or an alkoxycarbonylalkyl group.

Examples of the 2-oxoalkyl group represented by each of $R_x$ and $R_y$ include those having 1 to 15 carbon atoms (preferably having 1 to 10 carbon atoms), and specifically a 2-oxopropyl group and a 2-oxobutyl group.

Examples of the alkoxycarbonylalkyl group represented by each of $R_x$ and $R_y$ include those having 1 to 15 carbon atoms (preferably having 1 to 10 carbon atoms). In addition, $R_x$ and $R_y$ may be bonded to each other to form a ring.

The ring structure formed by the mutual linkage of $R_x$ and $R_y$ may include an oxygen atom, a sulfur atom, an ester bond, an amide bond, or a carbon-carbon double bond.

In General Formula (ZI-3), M and Roc may be bonded to each other to form a ring structure, and the ring structure formed may include a carbon-carbon double bond.

Among those, the compound (ZI-3) is preferably a compound (ZI-3A).

The compound (ZI-3A) is a compound having a phenacylsulfonium salt structure, represented by General Formula (ZI-3A).

(ZI-3A)

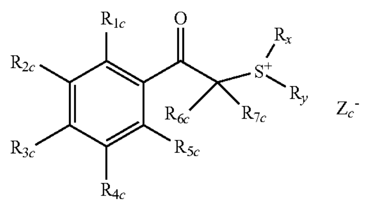

In General Formula (ZI-3A), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxy group, a nitro group, an alkylthio group, or an arylthio group.

$R_{6c}$ and $R_{7c}$ have the same definitions as $R_{6c}$ and $R_{7c}$ in General Formula (ZI-3) as mentioned above, respectively, and preferred aspects thereof are also the same.

$R_x$ and $R_y$ have the same definitions as $R_x$ and $R_y$ respectively, in General Formula (ZI-3) described above, and preferred aspects thereof are also the same.

Any two or more of $R_{1c}$, . . . , or $R_{5c}$, or $R_x$ and $R_y$ may be bonded to each other to form a ring structure, and the ring structure may each independently include an oxygen atom, a sulfur atom, an ester bond, an amide bond, or a carbon-carbon double bond. Furthermore, $R_{5c}$ and $R_{6c}$, or $R_{5c}$ and $R_x$ may be bonded to each other to form a ring structure, and the ring structure may each independently include a carbon-carbon double bond. In addition, $R_{6c}$ and $R_{7c}$ may be bonded to each other to form a ring structure.

Examples of the ring structure include an aromatic or non-aromatic hydrocarbon ring, an aromatic or non-aromatic heterocycle, and a polycyclic fused ring in which two or more of these rings are combined. Examples of the ring structure include a 3- to 10-membered ring and the ring structure is preferably a 4- to 8-membered ring, and more preferably a 5- or 6-membered ring.

Examples of the group formed by the bonding of any two or more of $R_{1c}$, . . . , or $R_{5c}$, $R_{6c}$ and $R_{7c}$, and $R_x$ and $R_y$ include a butylene group and a pentylene group.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

$Zc^-$ represents an anion, and preferably represents a sulfonate anion corresponding to the sulfonic acid represented by any of General Formulae (Aw-1), (Aw-2), and (I) to (V).

Examples of the cation in the compound (ZI-2) or (ZI-3) include the cations described in paragraph [0036] and the subsequent paragraphs of US2012/0076996A.

Next, the compound (ZI-4) will be described.

The compound (ZI-4) is represented by General Formula (ZI-4).

(ZI-4)

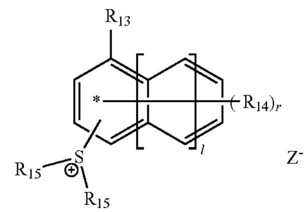

In General Formula (ZI-4), l represents an integer of 0 to 2. l is particularly preferably 0.

r represents an integer of 0 to 8.

$R_{13}$ represents a group having a hydrogen atom, a fluorine atom, a hydroxy group, an alkyl group, a cycloalkyl group, an alkoxy group, an alkoxycarbonyl group, or a group having a monocyclic or polycyclic cycloalkyl skeleton. These groups may have a substituent.

In a case where a plurality of $R_{14}$'s are present, $R_{14}$'s each independently represent an alkyl group, a cycloalkyl group, an alkoxy group, an alkylsulfonyl group, a cycloalkylsulfonyl group, an alkylcarbonyl group, an alkoxycarbonyl group, or an alkoxy group having a monocyclic or polycyclic cycloalkyl skeleton. These groups may have a substituent.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to each other to form a ring, the ring skeleton may include a heteroatom such as an oxygen atom and a nitrogen atom. In one aspect, it is preferable that two $R_{15}$'s are alkylene groups and are bonded to each other to form a ring structure.

$Z^-$ represents an anion, and preferably represents a sulfonate anion corresponding to the sulfonic acid represented by any of General Formulae (Aw-1), (Aw-2), and (I) to (V).

In General Formula (ZI-4), the alkyl group of each of $R_{13}$, $R_{14}$, and $R_{15}$ is linear or branched. The alkyl group preferably has 1 to 10 carbon atoms. As the alkyl group, a methyl group, an ethyl group, an n-butyl group, a t-butyl group, or the like is more preferable. Two $R_{15}$'s may be bonded to each other to form a ring and the number of ring members in a case where the ring is formed is preferably 5 or 6.

The ring in a case two $R_{15}$'s may be bonded to each other to form a ring may have a substituent. The substituent is not particularly limited, but examples thereof include a hydroxy group, a halogen atom, an alkyl group, and an alkoxy group. The halogen atom is preferably a fluorine atom, a chlorine atom, a bromine atom, or an iodine atom, and more preferably the fluorine atom. The alkyl group may be linear or branched. The alkyl group preferably has 1 to 10 carbon atoms, and more preferably has 1 to 6 carbon atoms. Examples of the alkyl group include a methyl group, an ethyl group, a propyl group, an n-butyl group, a sec-butyl group, and a t-butyl group. The alkyl group may have a substituent, the substituent is not particularly limited, but examples thereof include a halogen atom. The alkoxy group may be linear or branched. The alkoxy group preferably has 1 to 10 carbon atoms, and more preferably has 1 to 6 carbon atoms. Examples of the alkoxy group include a methoxy group, an ethoxy group, and a tert-butoxy group. The alkoxy group may have a substituent, the substituent is not particularly limited, but examples thereof include an alkoxy group (for example, an alkoxy group having 1 to 6 carbon atoms) and a cycloalkyl group (for example, a cycloalkyl group having 5 to 10 carbon atoms).

Examples of the cation of the compound represented by General Formula (ZI-4) include the cations described in paragraphs [0121], [0123], and [0124] of JP2010-256842A, and paragraphs [0127], [0129], and [0130] of JP2011-076056A.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group of each of $R_{204}$ to $R_{207}$ is preferably a phenyl group or a naphthyl group, and more preferably the phenyl group. The aryl group of each of $R_{204}$ to $R_{207}$ may be an aryl group which has a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

As the alkyl group and the cycloalkyl group of each of $R_{204}$ to $R_{207}$, a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

The aryl group, the alkyl group, and the cycloalkyl group of each of $R_{204}$ to $R_{207}$ may each independently have a substituent. Examples of the substituent which may be contained in each of the aryl group, the alkyl group, and the cycloalkyl group of each of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxy group, and a phenylthio group.

Preferred examples of the sulfonium cation in General Formula (ZI) and the iodonium cation in General Formula (ZII) are shown below.

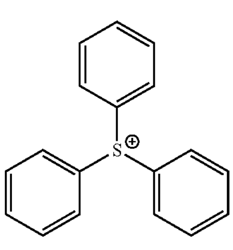

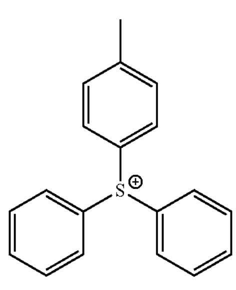

-continued

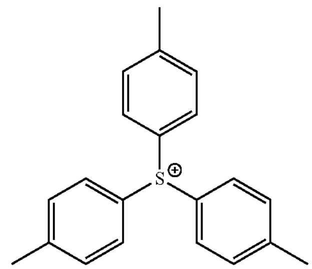

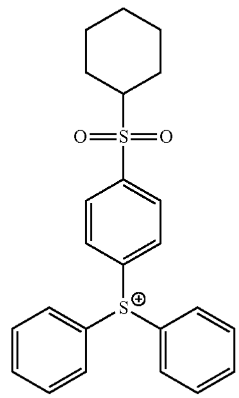

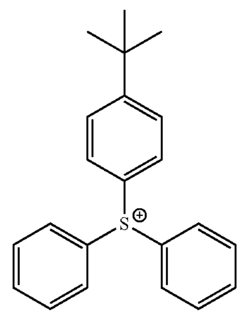

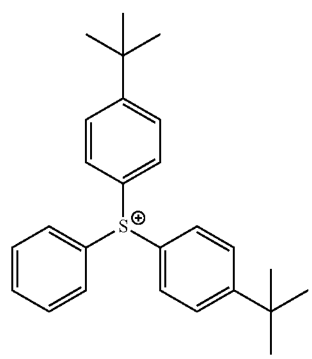

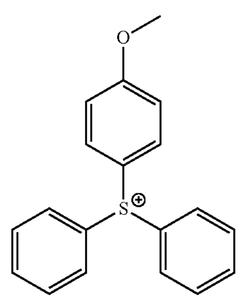

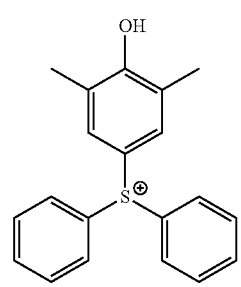

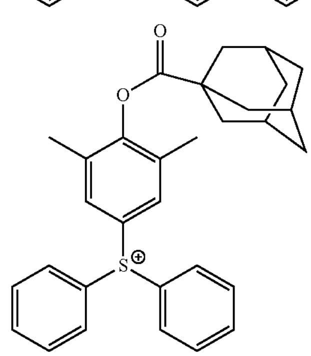

-continued
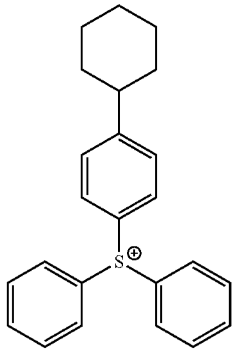
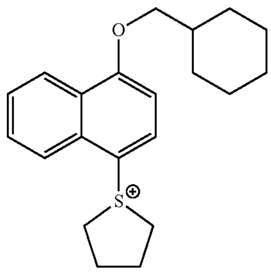
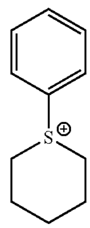
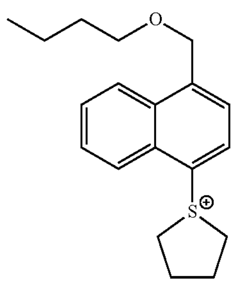
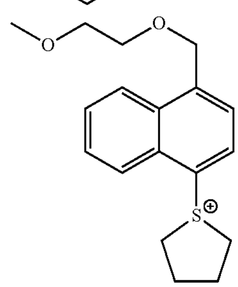
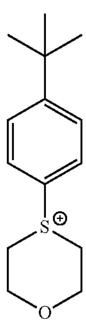
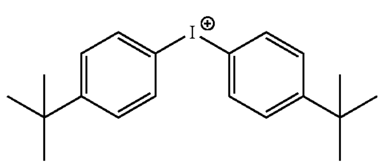
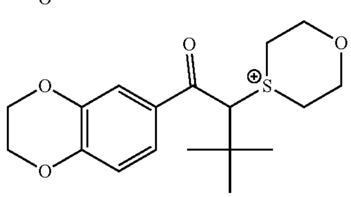
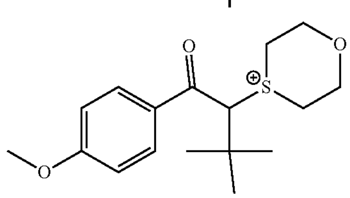
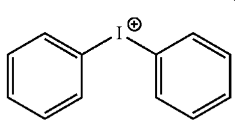
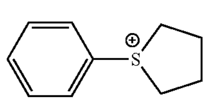
-continued
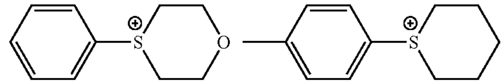
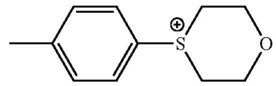
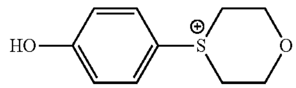
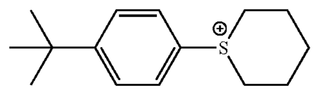
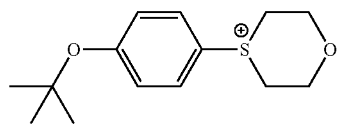
Specific examples of the photoacid generator Aw are shown below, but the present invention is not limited thereto.
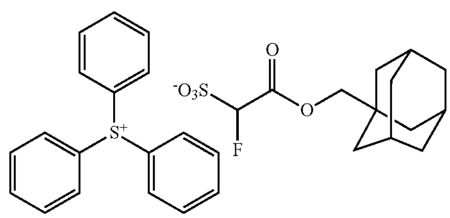
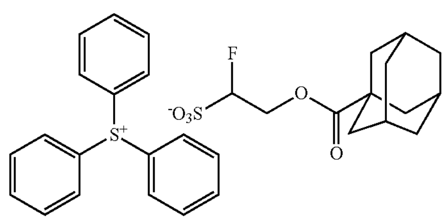
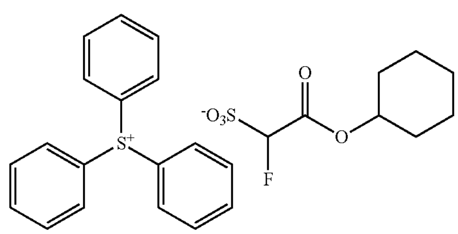
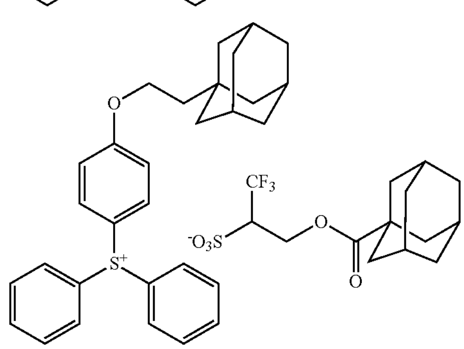

-continued
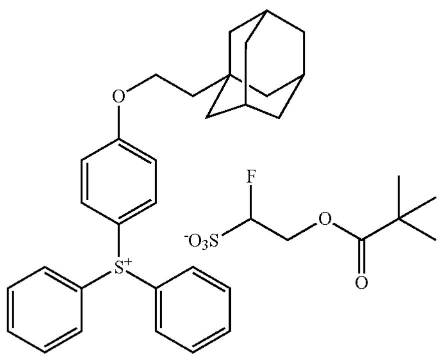
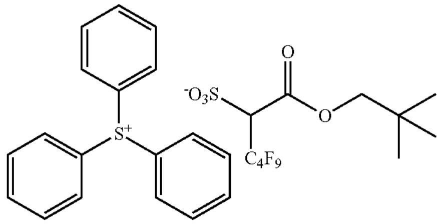
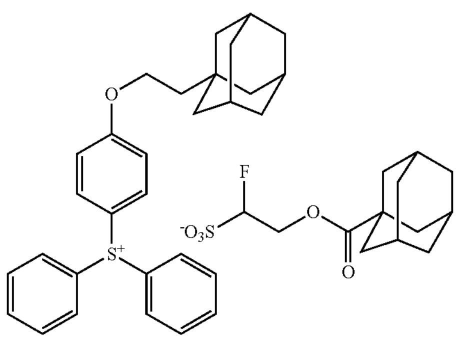
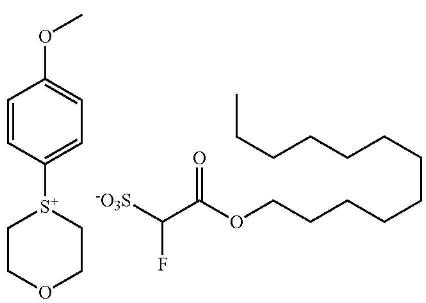
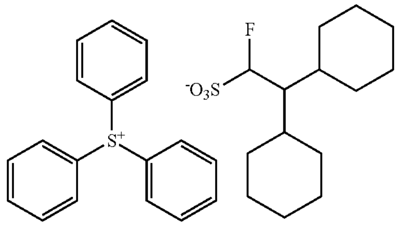
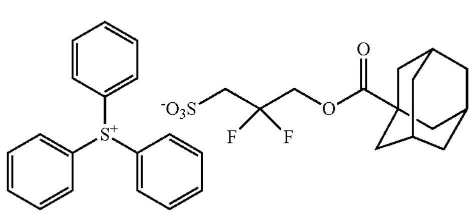
-continued
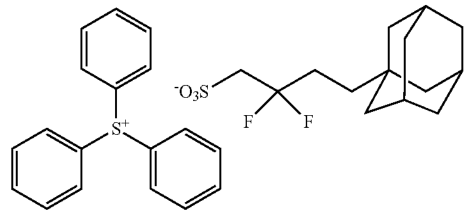
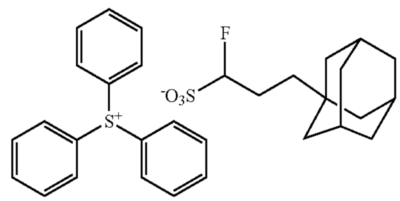
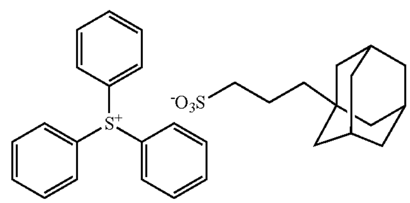
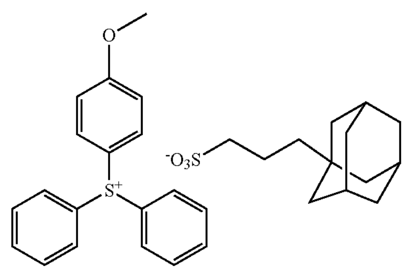
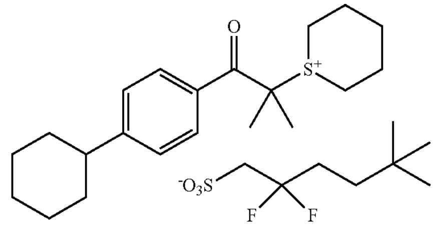
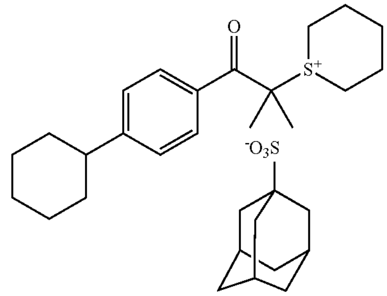
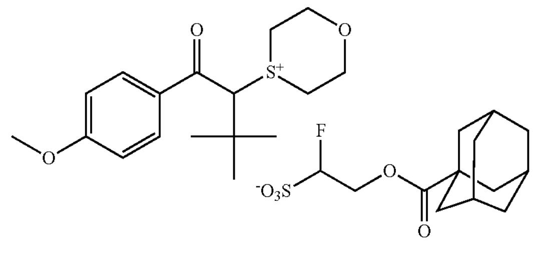

-continued
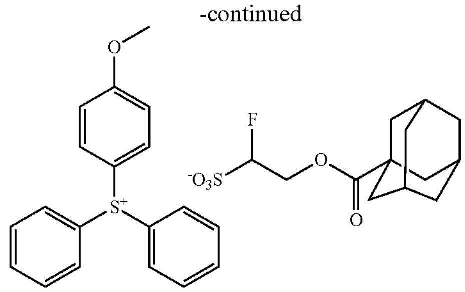
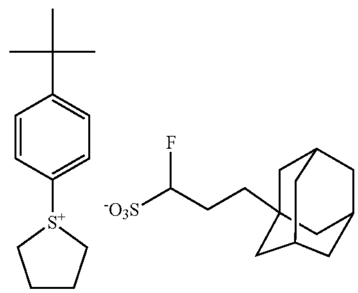
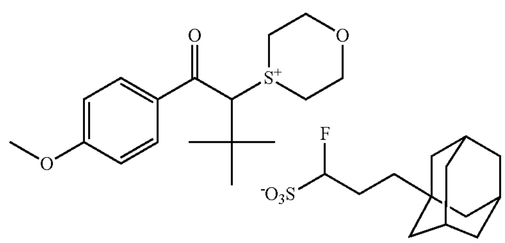
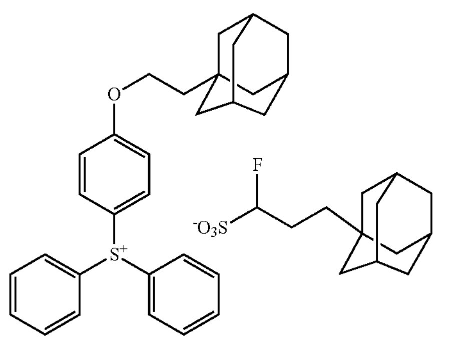
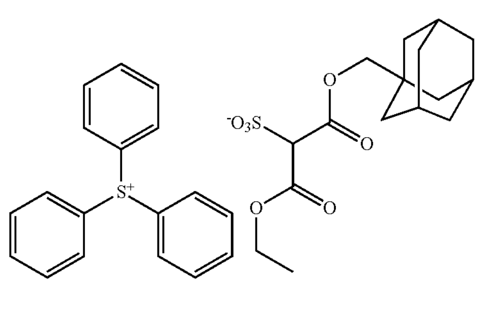
-continued
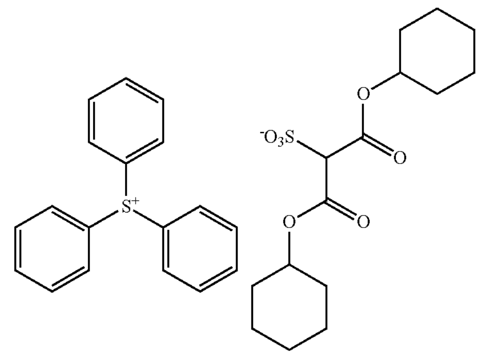
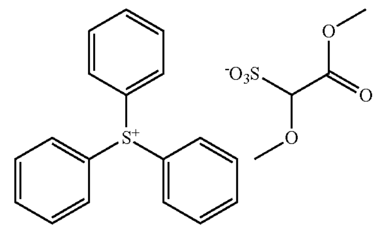
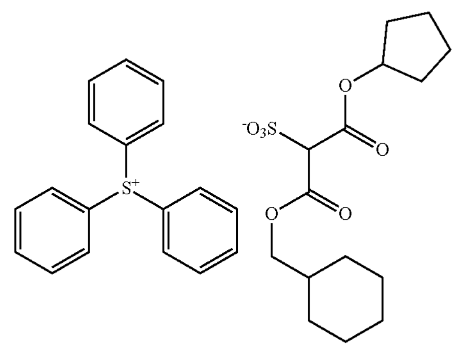
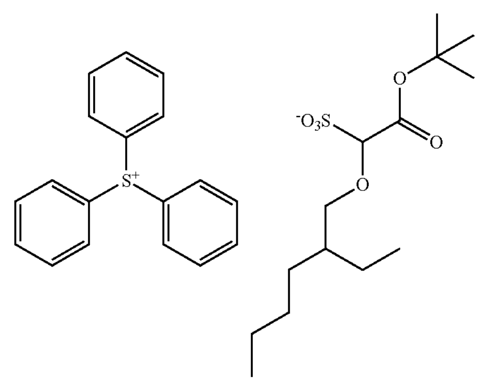
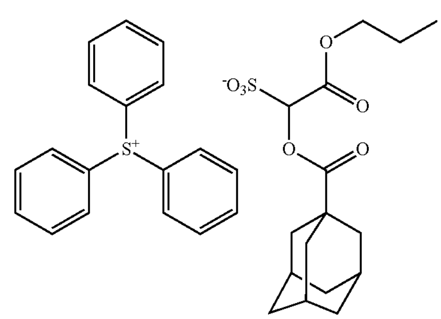

-continued
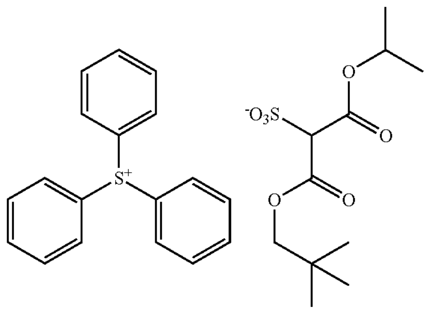
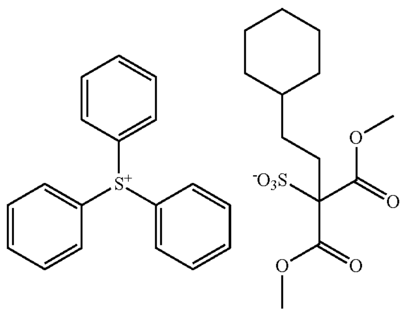
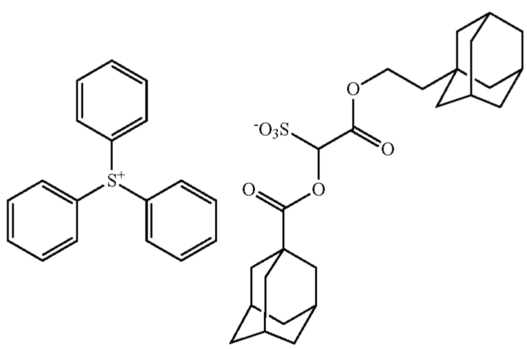
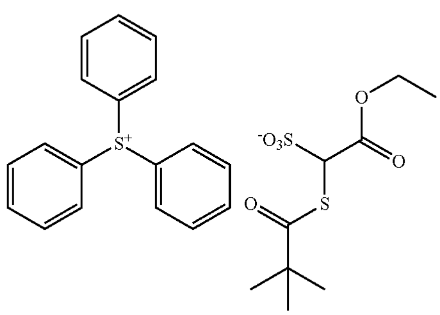
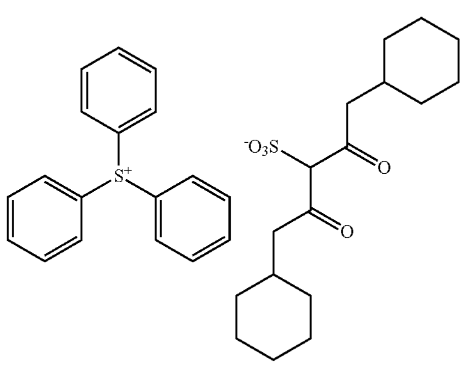
-continued
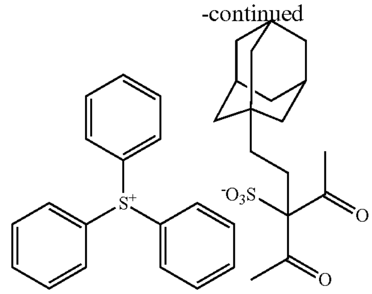
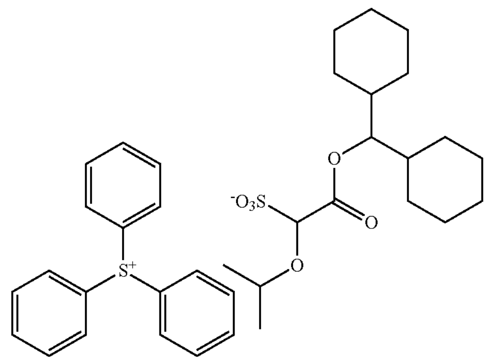
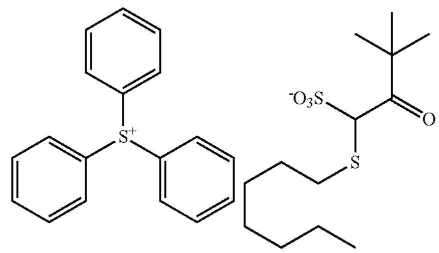
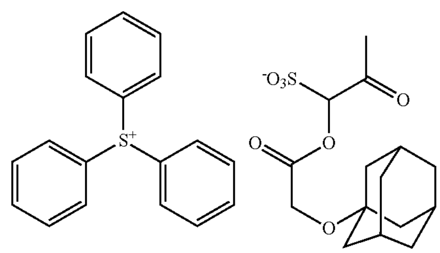
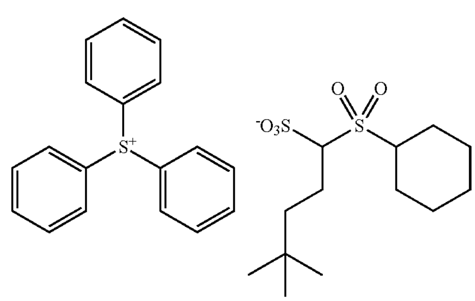
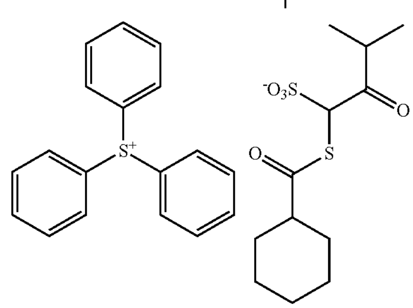

-continued
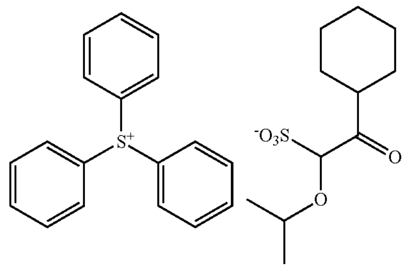
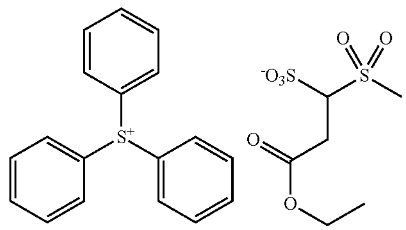
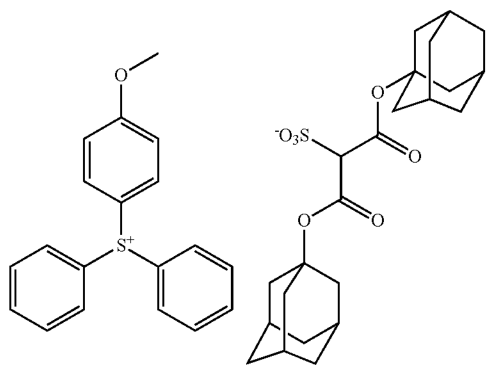
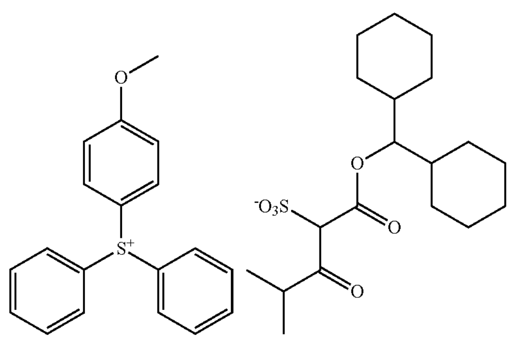
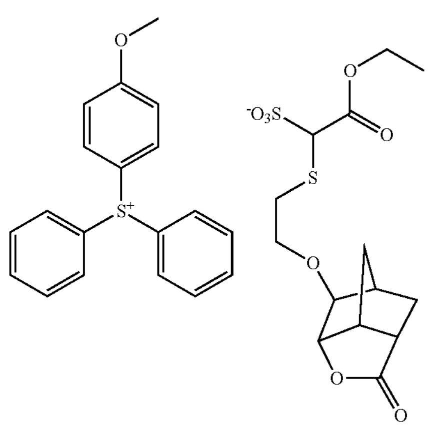
-continued
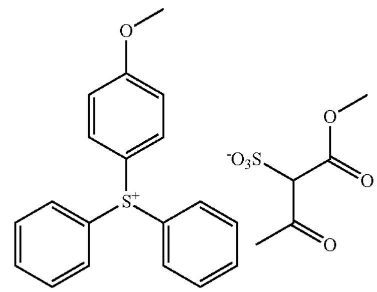
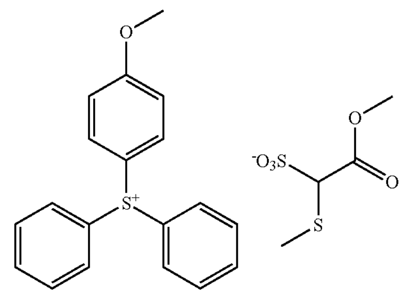
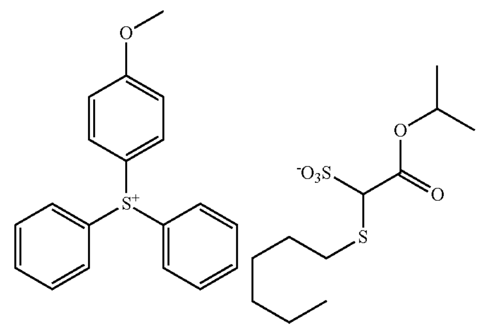
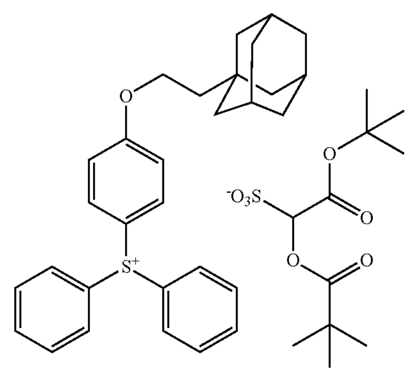
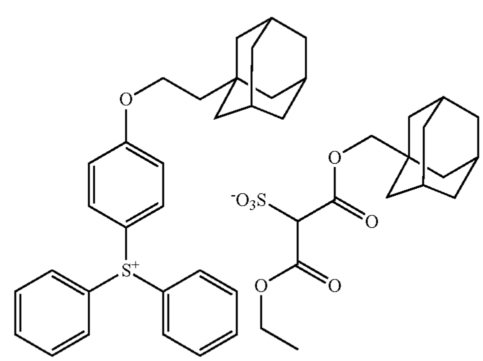

-continued
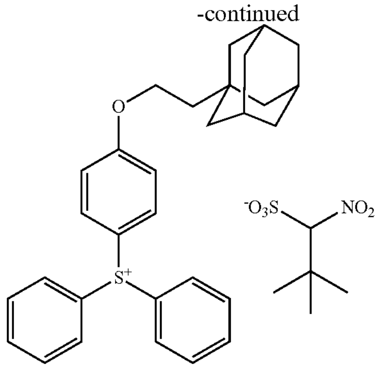
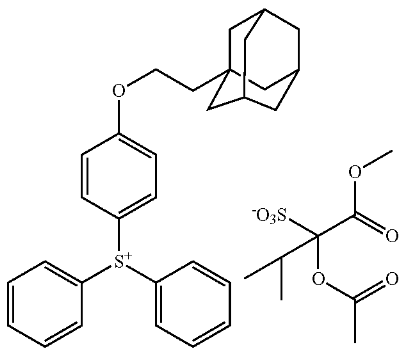
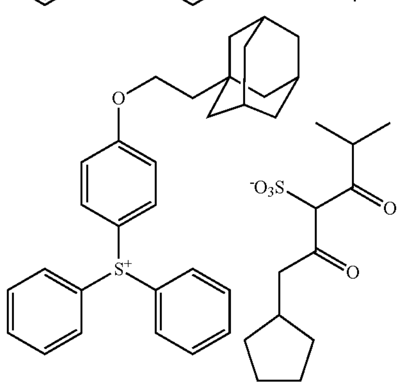
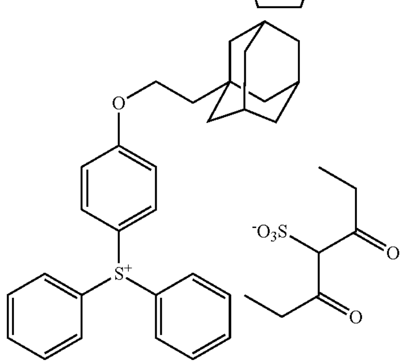
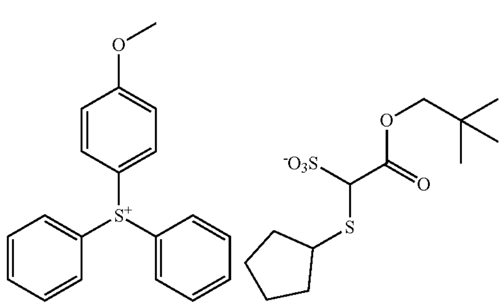
-continued
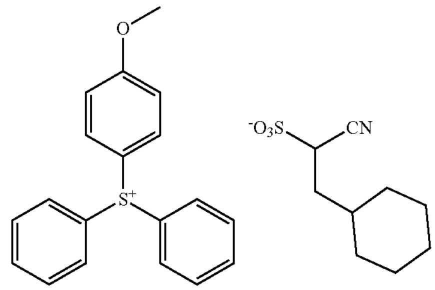
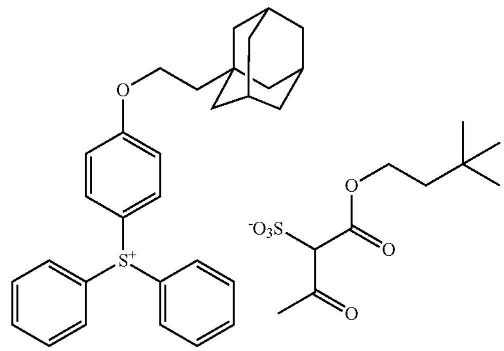
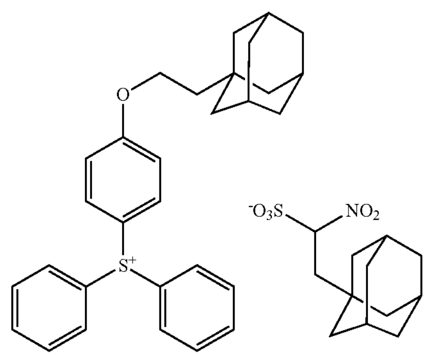
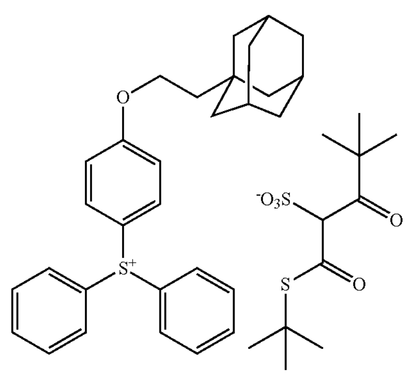
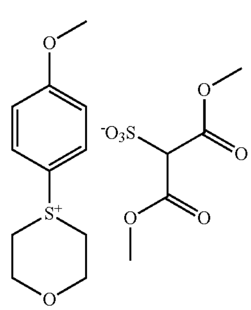
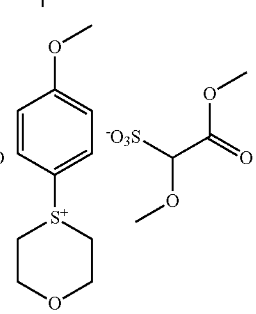

-continued
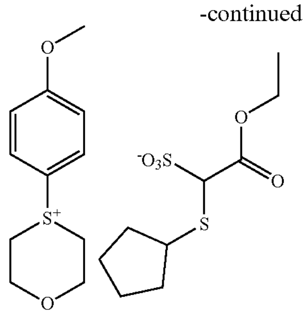
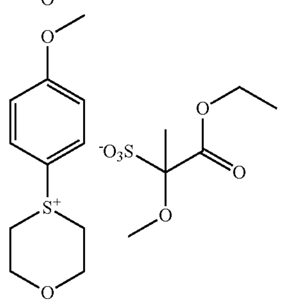
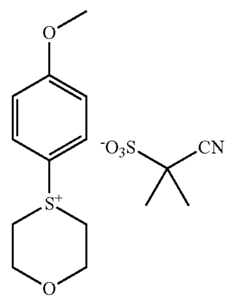
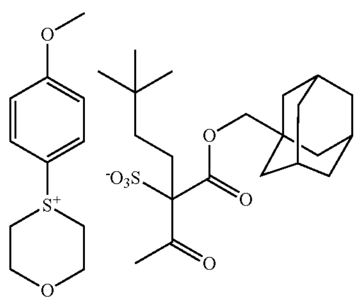
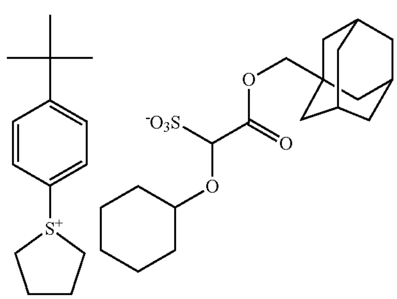
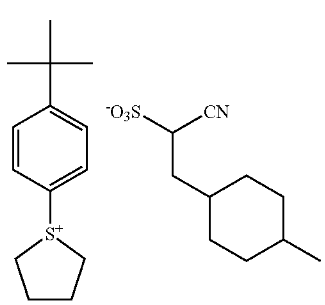
-continued
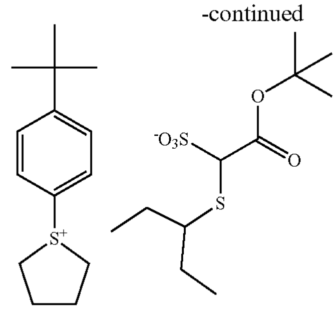
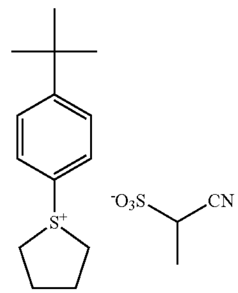
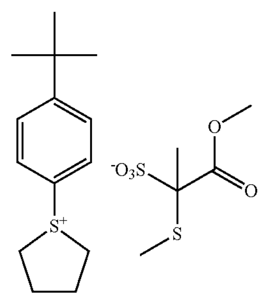
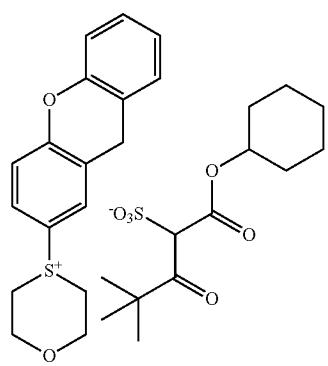
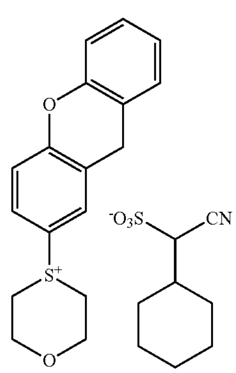

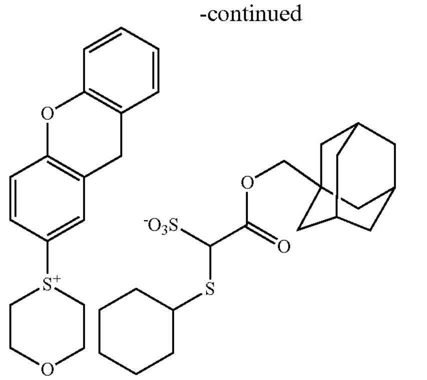
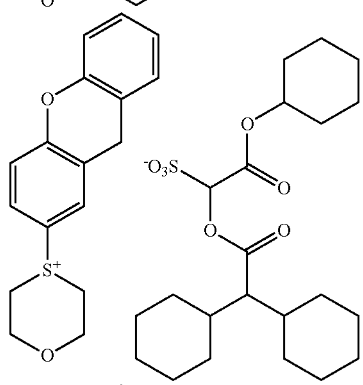
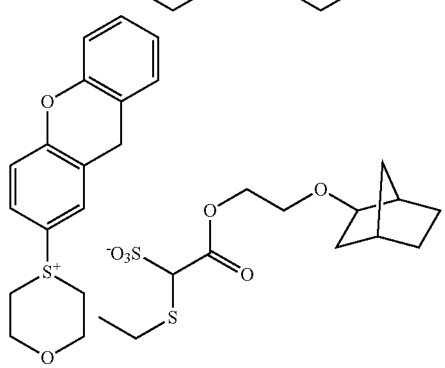
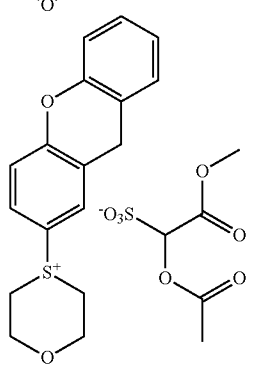
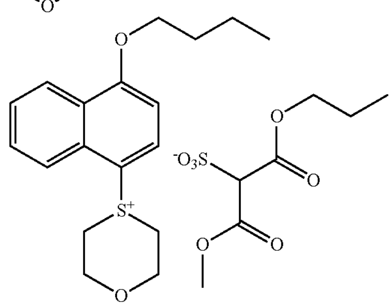
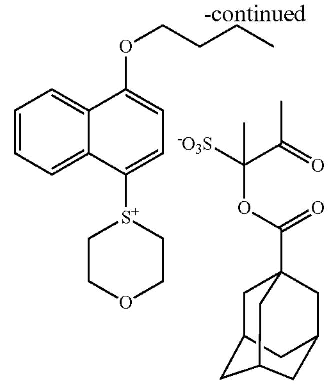
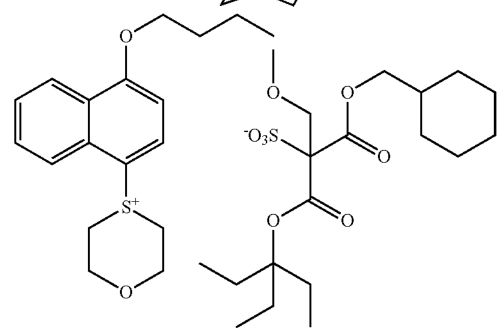
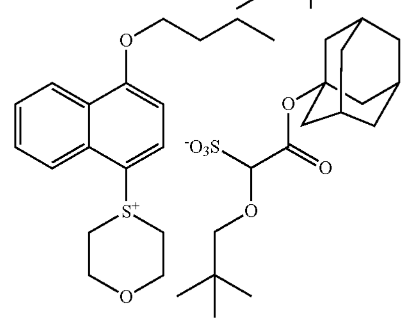
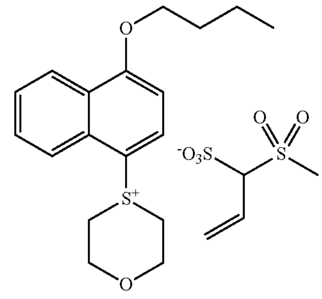
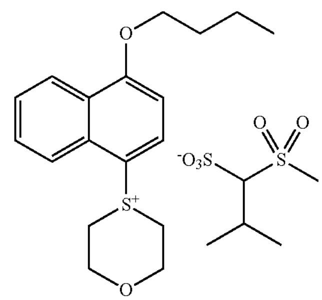

-continued
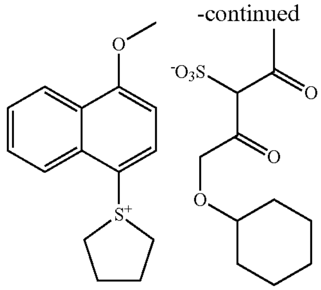
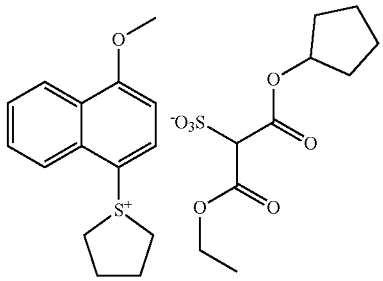
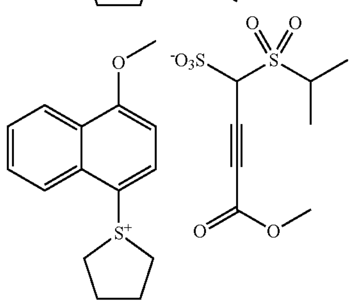
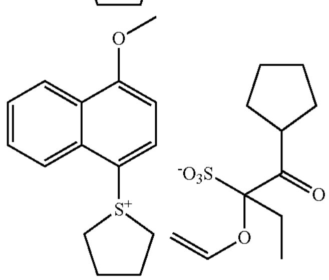
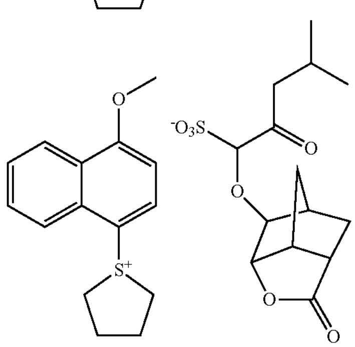
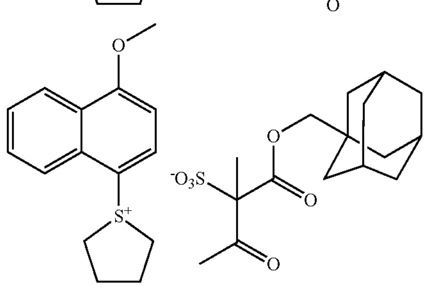
-continued
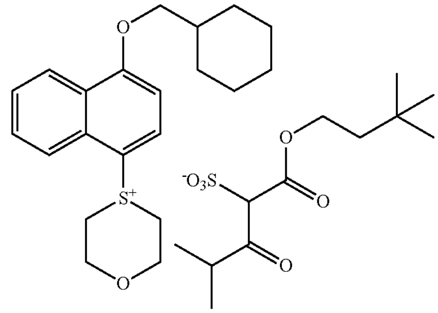
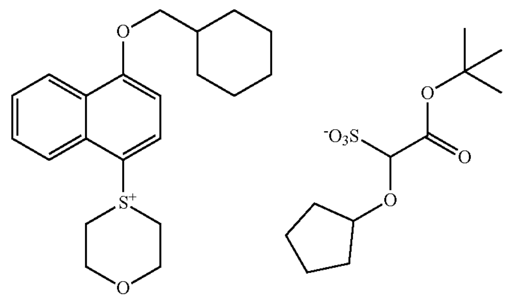
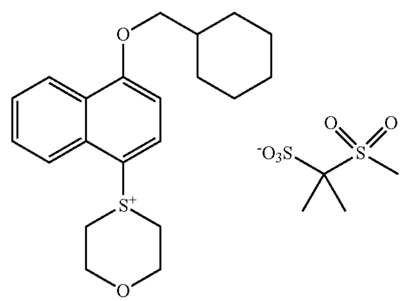
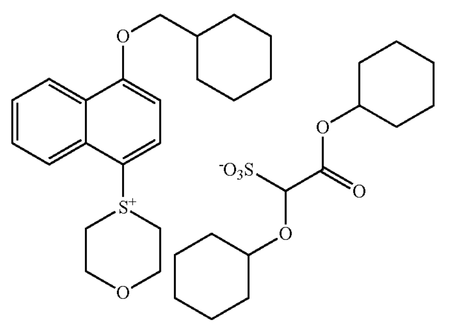
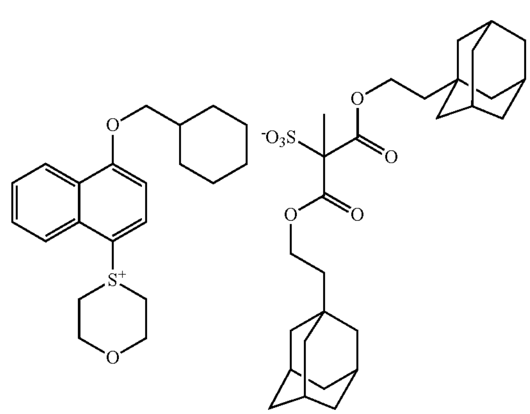

-continued
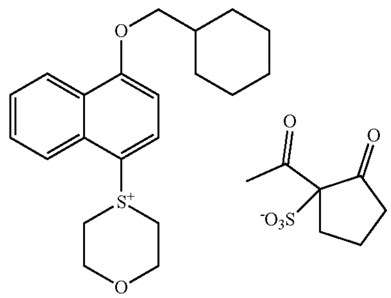
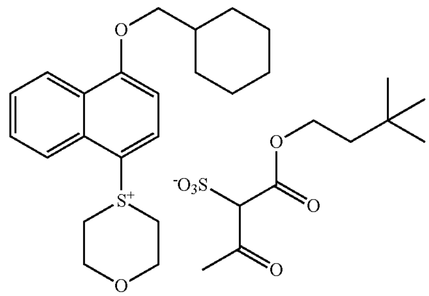
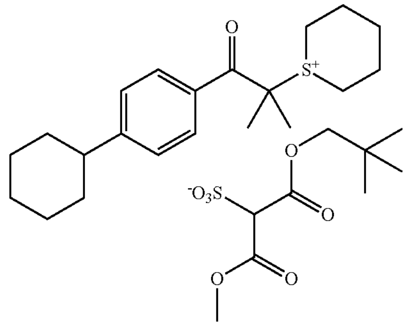
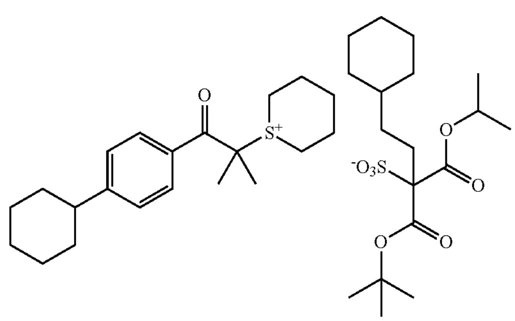
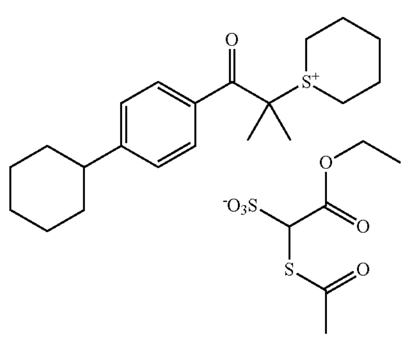
-continued
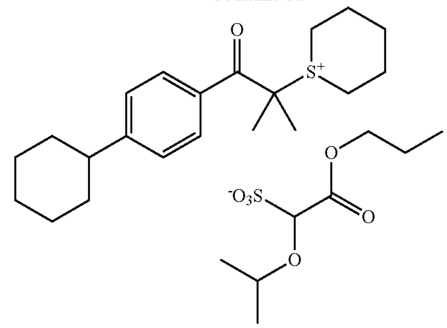
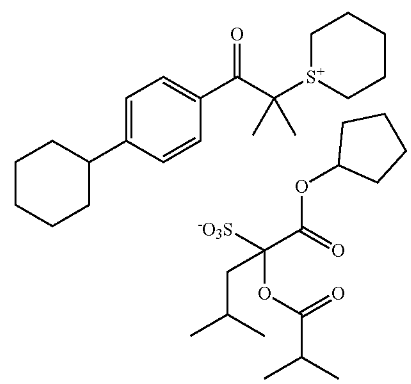
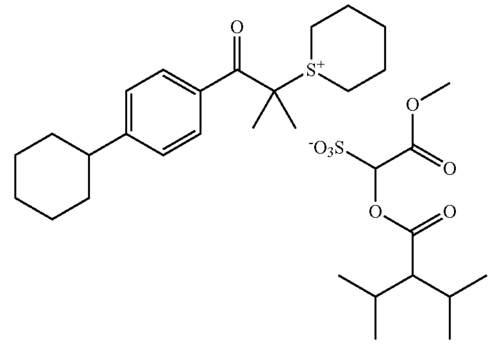
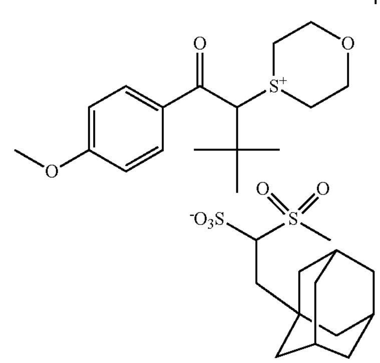
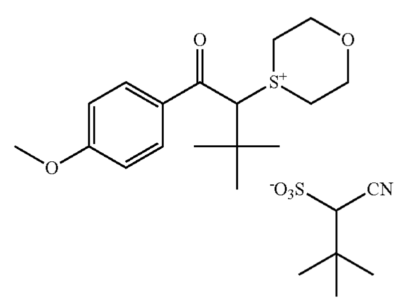

-continued
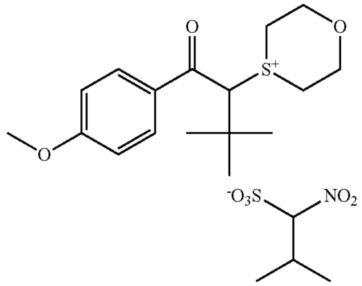
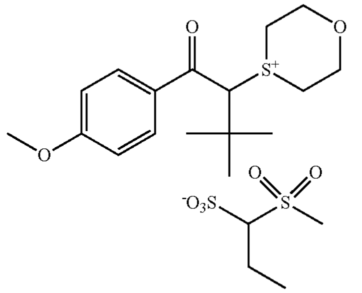
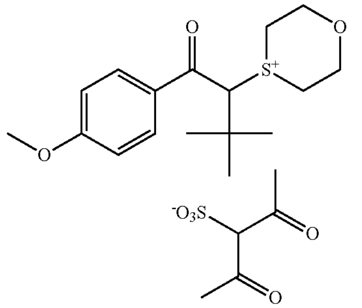
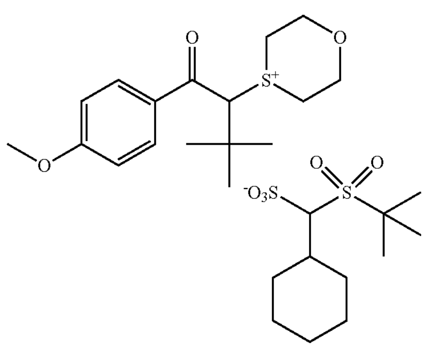
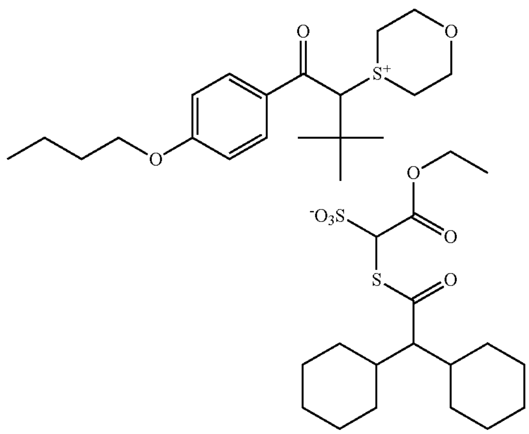
-continued
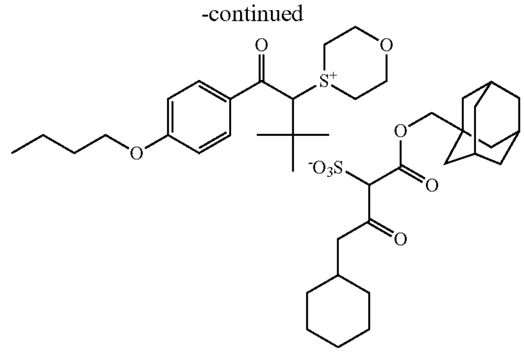
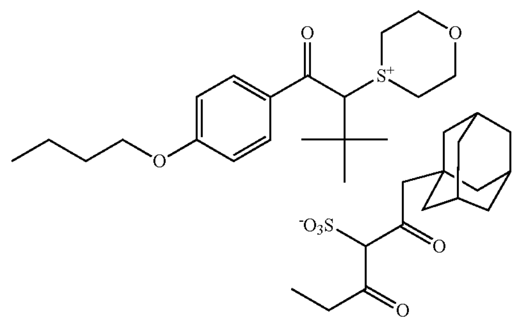
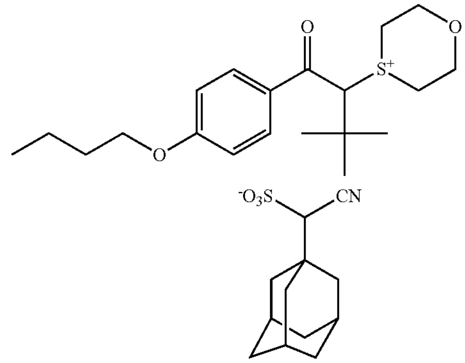
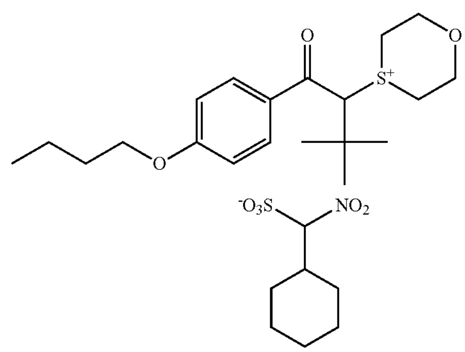

-continued

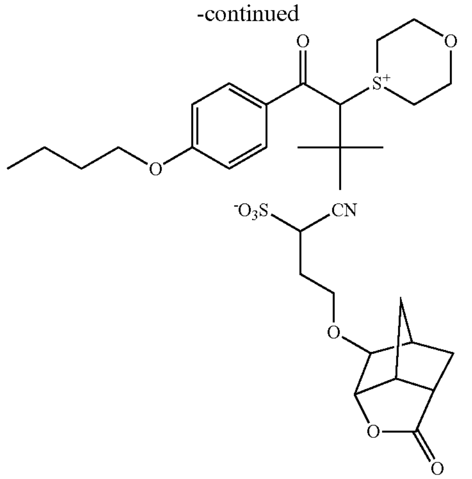

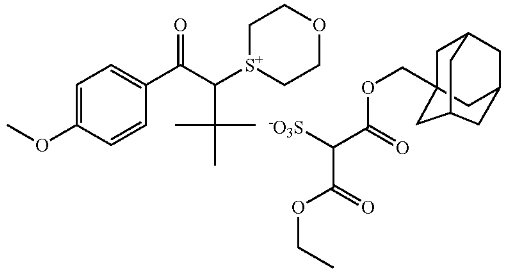

The photoacid generator Aw may be in a form of a low-molecular-weight compound or a form incorporated into a part of a polymer. Further, a combination of the form of a low-molecular-weight compound and the form incorporated into a part of a polymer may also be used.

In the present invention, the photoacid generator Aw is preferably in the form of a low-molecular-weight compound.

In a case where the photoacid generator Aw is in the form of the low-molecular-weight compound, the molecular weight is preferably 3,000 or less, more preferably 2,000 or less, and still more preferably 1,000 or less.

In a case where the photoacid generator Aw is in the form incorporated into a part of a polymer, it may be incorporated into the resin P or into a resin other than the resin P.

The photoacid generator Aw can be synthesized by a known method, and can be, for example, synthesized according to the method described in JP2007-161707A.

The photoacid generator Aw may be used singly or in combination of two or more kinds thereof.

The content of the photoacid generator Aw (in a case where the photoacid generators Aw are present in a plurality of kinds, a total content thereof) in the composition of the embodiment of the present invention is preferably 0.1% to 40% by mass, more preferably 0.5% to 35% by mass, still more preferably 3% to 30% by mass, and particularly preferably 3% to 25% by mass with respect to the total solid content of the composition of the embodiment of the present invention.

In a case where the compound represented by General Formula (ZI-3) or (ZI-4) is included as the photoacid generator Se, a content of the photoacid generator included in the composition of the embodiment of the present invention (in a case where the photoacid generators Aw are present in a plurality of kinds, a total content thereof) is preferably 5% to 35% by mass, and more preferably 7% to 30% by mass with respect to the total solid content of the composition of the embodiment of the present invention.

Furthermore, the composition of the embodiment of the present invention may or may not contain a photoacid generator different from the photoacid generator Aw. The content of the photoacid generator that generates an acid having a pKa of less than −1.40 upon irradiation with actinic rays or radiation is preferably 5% by mass or less, more preferably 3% by mass or less, and still more preferably 0% by mass (that is, the photoacid generator is not contained) with respect to the total solid content of the composition of the embodiment of the present invention.

<Acid Diffusion Control Agent>

The composition of the embodiment of the present invention preferably contains an acid diffusion control agent. The acid diffusion control agent acts as a quencher that suppresses a reaction of the acid-decomposable resin in the unexposed area by excessive generated acids by trapping acids generated from the photoacid generator Aw and the like upon exposure. For example, a basic compound (DA), a basic compound (DB) having basicity that is reduced or lost upon irradiation with actinic rays or radiation (also referred to as a "compound (DB)"), a compound (DC) that generates an acid which serves as a relatively weak acid with respect to the photoacid generator Aw (also referred to as a "compound (DC)"), a low-molecular-weight compound (DD) having a nitrogen atom and having a group that is eliminated by the action of an acid (also referred to as a "compound (DD)"), an onium salt compound (DE) having a nitrogen atom in a cationic moiety (also referred to as a "compound (DE)"), or the like can be used as the acid diffusion control agent. In the composition of the embodiment of the present invention, a known acid diffusion control agent can be appropriately used. For example, the known compounds disclosed in paragraphs [0627] to [0664] of the specification of US2016/0070167A1, paragraphs [0095] to [0187] of the specification of US2015/0004544A1, paragraphs [0403] to [0423] of the specification of US2016/0237190A1, and paragraphs [0259] to [0328] of the specification of US2016/0274458A1 can be suitably used as the acid diffusion control agent.

(Basic Compound (DA))

As the basic compound (DA), compounds having structures represented by Formulae (A) to (E) are preferable.

(A)

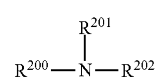

(B)

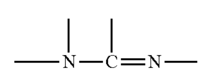

(C)

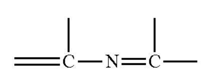

(D)

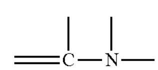

(E)

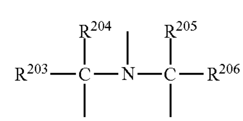

In General Formulae (A) and (E), $R^{200}$, $R^{201}$, and $R^{202}$ may be the same as or different from each other, and each independently represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may be bonded to each other to form a ring.

$R^{203}$, $R^{204}$, $R^{205}$, and $R^{206}$ may be the same as or different from each other and each independently represent an alkyl group having 1 to 20 carbon atoms.

The alkyl group or the cycloalkyl group represented by each of $R^{200}$, $R^{201}$, $R^{202}$, $R^{203}$, $R^{204}$, $R^{205}$, and $R^{206}$ in General Formulae (A) and (E) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl group or the cycloalkyl group represented by each of $R^{200}$, $R^{201}$, $R^{202}$, $R^{203}$, $R^{204}$, $R^{205}$, and $R^{206}$ in General Formulae (A) and (E) is more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxy group and/or an ether bond, and an aniline derivative having a hydroxy group and/or an ether bond, or the like is more preferable.

A difference between the pKa of a conjugate acid of the basic compound (DA) and the pKa of an acid generated from the photoacid generator Aw (a value obtained by subtracting the pKa of an acid generated from the photoacid generator Aw from the pKa of a conjugate acid of the basic compound (DA)) is preferably 1.00 or more, more preferably 1.00 to 14.00, and still more preferably 2.00 to 13.00.

In addition, the pKa of a conjugate acid of the basic compound (DA) varies depending on the type of the photoacid generator Aw to be used, but is preferably 0.00 to 14.00, more preferably 3.00 to 13.00, and still more preferably 3.50 to 12.50.

(Basic Compound (DB) Having Basicity that is Reduced or Lost Upon Irradiation with Actinic Rays or Radiation)

The basic compound (DB) is a compound which has a proton-accepting functional group and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

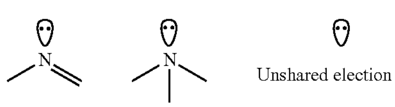

Unshared election pair

Preferred examples of the partial structure of the proton-accepting functional group include a crown ether structure, an azacrown ether structure, primary to tertiary amine structures, a pyridine structure, an imidazole structure, and a pyrazine structure.

The compound (DB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

The pKa of a compound generated by decomposition of the compound (DB) upon irradiation with actinic rays or radiation preferably satisfies $pKa<-1$, and more preferably satisfies $-13<pKa<-1$, and still more preferably satisfies $13<pKa<-3$.

The compound (DB) is preferably a compound represented by General Formula (bd-1).

$$R_{b1}—B_{b1}—X_{b1}\text{-}A_{b1}\text{-}W_1—N^-—W_2—Rf_{b1}[C_{b1}^+] \quad \text{General Formula (bd-1):}$$

In General Formula (bd-1), $W_1$ and $W_2$ each independently represent —$SO_2$— or —CO—.

$Rf_{b1}$ represents an alkyl group which may have a substituent, a cycloalkyl group which may have a substituent, or an aryl group which may have a substituent.

$A_{b1}$ represents a single bond or a divalent linking group.

$X_{b1}$ represents a single bond, —$SO_2$—, or —CO—.

$B_{b1}$ represents a single bond, an oxygen atom, or —$N(R_{b1x})R_{b1y}$—.

$R_{b1x}$ represents a hydrogen atom or an organic group.

$R_{b1y}$ represents a single bond or a divalent organic group.

$R_{b1}$ represents a monovalent organic group having a proton-accepting functional group.

$R_{b1x}$ may be bonded to $R_{b1y}$ to form a ring, and may be bonded to $R_{b1}$ to form a ring. $[C_{b1}^+]$ represents a counter cation.

It is preferable that at least one of $W_1$ or $W_2$ is —$SO_2$—, and it is more preferable that both of $W_1$ and $W_2$ are —$SO_2$—.

$Rf_{b1}$ is preferably an alkyl group having 1 to 6 carbon atoms, which may have a fluorine atom, more preferably a perfluoroalkyl group having 1 to 6 carbon atoms, and still more preferably a perfluoroalkyl group having 1 to 3 carbon atoms.

The divalent linking group for $A_{b1}$ is preferably a divalent linking group having 2 to 12 carbon atoms, and examples thereof include an alkylene group and a phenylene group. Among those, an alkylene group having at least one fluorine atom is preferable, and the alkylene group preferably has 2 to 6 carbon atoms, and more preferably has 2 to 4 carbon atoms. The alkylene chain may have a linking group such as an oxygen atom or a sulfur atom. The alkylene group is preferably an alkylene group in which 30% to 100% of the hydrogen atoms are substituted with fluorine atoms, and more preferably an alkylene group in which the carbon atom bonded to $X_{b1}$ or $W_1$ has a fluorine atom. Among those, the divalent linking group for Abi is preferably a perfluoroalkylene group, and more preferably a perfluoroethylene group, a perfluoropropylene group, or a perfluorobutylene group.

As the organic group for $R_{b1x}$ an organic group having 2 to 30 carbon atoms is preferable, and examples thereof include an alkyl group, a cycloalkyl group which may have an oxygen atom in the ring, an aryl group, an aralkyl group, and an alkenyl group.

The alkyl group for $R_{b1x}$ may have a substituent, and is preferably a linear or branched alkyl group having 1 to 20 carbon atoms, and an oxygen atom, a sulfur atom, and/or a nitrogen atom may be contained in the alkyl chain.

Furthermore, examples of the alkyl group having a substituent include a linear or branched alkyl group substituted with a cycloalkyl group (for example, an adamantylmethyl group, an adamantylethyl group, a cyclohexylethyl group, and a camphor residue).

The cycloalkyl group for $R_{b1x}$ may have a substituent and is preferably a cycloalkyl group having 3 to 20 carbon atoms. Further, the cycloalkyl group may have an oxygen atom in the ring.

The aryl group for $R_{b1x}$ may have a substituent, and is preferably an aryl group having 6 to 14 carbon atoms.

The aralkyl group for $R_{b1x}$ may have a substituent, and preferred examples thereof include an aralkyl group having 7 to 20 carbon atoms.

The alkenyl group for $R_{b1x}$ may have a substituent, and examples thereof include a group having a double bond at any position of the alkyl group mentioned as $R_{b1x}$.

In a case where $B_{b1}$ represents —N($R_{b1x}$)$R_{b1y}$—, the divalent organic group for $R_{b1y}$ is preferably an alkylene group. In addition, in this case, examples of the ring formed by the mutual bonding of $R_{b1x}$ and $R_{b1y}$, include a 5- to 8-membered ring including a nitrogen atom, and particularly preferably the 6-membered ring. The nitrogen atom included in the ring may be a nitrogen atom other than the nitrogen atom directly bonded to $X_{b1}$ in —N($R_{b1x}$)$R_{b1y}$—.

In a case where $B_{b1}$ represents —N($R_{b1x}$)$R_{b1y}$—, it is preferable that $R_{b1}$ and $R_{b1x}$ are bonded to each other to form a ring. In a case of forming a ring, stability is improved, and the storage stability of a composition using the same ring structure is improved. The number of carbon atoms forming the ring is preferably 4 to 20 and may be a monocycle or a polycycle, and the ring may include an oxygen atom, a sulfur atom and/or a nitrogen atom. The nitrogen atom included in the ring may be a nitrogen atom other than the nitrogen atom directly bonded to $X_{b1}$ in —N($R_{b1x}$)$R_{b1y}$—.

Examples of the monocycle include a 4-membered ring, a 5-membered ring, a 6-membered ring, a 7-membered ring, and an 8-membered ring, each of which includes a nitrogen atom. Examples of such a ring structure include a piperazine ring and a piperidine ring. The polycycle includes a structure constituted with a combination of 2 or 3 or more monocyclic structures. Each of the monocycle and the polycycle may have a substituent, which is preferably a halogen atom, a hydroxy group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), and aminoacyl group (preferably 2 to 20 carbon atoms). These substituents may further have a substituent where available. In a case where the aryl group and the cycloalkyl group each further have a substituent, examples of the substituent include an alkyl group (preferably having 1 to 15 carbon atoms). Examples of the substituent which is further contained in the aminoacyl group include an alkyl group (preferably having 1 to 15 carbon atoms).

The proton-accepting functional group in $R_{b1}$ is as described above, and preferably has, as a partial structure thereof, a structure of, for example, a crown ether, primary to tertiary amines, and a nitrogen-containing heterocycle (pyridine, imidazole, pyrazine, and the like).

Furthermore, as the proton-accepting functional group, a functional group having a nitrogen atom is preferable, and a group having a primary to tertiary amino group or a nitrogen-containing heterocyclic group is more preferable. In these structures, it is preferable that all of the atoms adjacent to the nitrogen atom included in the structure are carbon atoms or hydrogen atoms. In addition, it is preferable that an electron-withdrawing functional group (such as a carbonyl group, a sulfonyl group, a cyano group, and a halogen atom) is not directly linked to the nitrogen atom.

The monovalent organic group in the monovalent organic group (the group $R_{b1}$) including such a proton-accepting functional group preferably has 2 to 30 carbon atoms, examples thereof include an alkyl group, a cycloalkyl group, an aryl group, an aralkyl group, and an alkenyl group, and each of the groups may have a substituent.

In the alkyl group, the cycloalkyl group, the aryl group, the aralkyl group, and the alkenyl group, each of which includes a proton-accepting functional group in $R_{b1}$, examples of the alkyl group, the cycloalkyl group, the aryl group, the aralkyl group, and the alkenyl group include the same groups as those of the alkyl group, the cycloalkyl group, the aryl group, the aralkyl group, and the alkenyl group mentioned as Rx, respectively.

Examples of the substituent which is contained in each of the groups include a halogen atom, a hydroxy group, a nitro group, a cyano group, a carboxyl group, a cycloalkyl group (preferably having 3 to 10 carbon atoms; a part of the group may be substituted with a heteroatom or a group having a heteroatom (an ester group or the like)), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). Examples of the substituent which may be contained in the cyclic group in the aryl group, the cycloalkyl group, and the like include an alkyl group (preferably having 1 to 20 carbon atoms). Examples of the substituent which is contained in the aminoacyl group include 1 or 2 alkyl groups (preferably having 1 to 20 carbon atoms).

As for [$C_{b1}^+$], a sulfonium cation or an iodonium cation is preferable as the counter cation. As the sulfonium cation and the iodonium cation, for example, a sulfonium cation and an iodonium cation for a cation which may be contained in the photoacid generator Aw (more specifically a cation in the compound represented by General Formula (ZI), a cation in the compound represented by General Formula (ZII), or the like) can be similarly used.

A difference between the pKa of a conjugate acid of the basic compound (DB) and the pKa of an acid generated from the photoacid generator Aw (a value obtained by subtracting the pKa of an acid generated from the photoacid generator Aw from the pKa of a conjugate acid of the basic compound (DB)) is preferably 1.00 or more, more preferably 1.00 to 14.00, and still more preferably 2.00 to 13.00.

In addition, the pKa of a conjugate acid of the basic compound (DB) varies depending on the type of the photoacid generator Aw to be used, but is preferably 0.00 to 14.00, more preferably 3.00 to 13.00, and still more preferably 3.50 to 12.50.

(Compound (DC) that Generates Acid that is Relatively Weak Acid with Respect to Photoacid Generator Aw)

The compound (DC) is preferably a compound that generates an acid upon irradiation with actinic rays or radiation. Hereinafter, a compound that generates an acid upon irradiation with actinic rays or radiation among the compounds (DC) is also referred to as a "photoacid generator B".

The photoacid generator B is preferably a compound that generates an acid having a pKa higher than the acid generated from the photoacid generator Aw by 1.00 or more.

A difference between the pKa of an acid of the photoacid generator B and the pKa of an acid generated from the photoacid generator Aw (a value obtained by subtracting the pKa of an acid generated from the photoacid generator Aw from the pKa of an acid of the photoacid generator B) is 1.00 or more, more preferably 1.00 to 10.00, still more preferably 1.00 to 5.00, and particularly preferably 1.00 to 3.00.

In addition, the pKa of an acid generated from the photoacid generator B varies depending on the type of the photoacid generator Aw used, but is, for example, preferably 0.00 to 10.00, more preferably 0.50 to 5.00, and still more preferably 1.00 to 5.00.

The photoacid generator B is preferably an onium salt compound consisting of an anion and a cation. As such the onium salt compound, compounds represented by General Formulae (d1-1) to (d1-3) are preferable.

(d1-1)

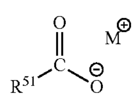

(d1-2)

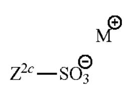

(d1-3)

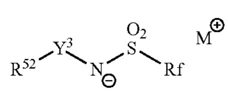

In the formulae, $R^{51}$ represents a hydrocarbon group (for example, an aryl group such as a phenyl group) which may have a substituent (for example, a hydroxy group).

$Z^{2c}$ represents a hydrocarbon group having 1 to 30 carbon atoms, which may have a substituent (provided that a carbon atom adjacent to S is not substituted with a fluorine atom).

The hydrocarbon group for $Z^{2c}$ may be linear or branched, and may have a cyclic structure. Further, the carbon atom in the hydrocarbon group (preferably the carbon atom forming a cyclic structure in a case where the hydrocarbon group has the cyclic structure) may be carbonyl carbon (—CO—). Examples of the hydrocarbon group include a group having a norbornyl group which may have a substituent. The carbon atom forming the norbornyl group may be carbonyl carbon.

$R^{52}$ represents an organic group, $Y^3$ represents a linear or branched alkylene group, a cycloalkylene group, or an arylene group, and Rf represents a hydrocarbon group including a fluorine atom.

In addition, "$Z^{2c}$—$SO_3$—" in General Formula (d1-2) is preferably different from an anion in the photoacid generator Aw (preferably a sulfonate anion corresponding to the sulfonic acid represented by any of General Formulae (a), (b), and (I) to (V)).

$M^+$'s are each independently an ammonium cation, a sulfonium cation, or an iodonium cation.

As the sulfonium cation and the iodonium cation, for example, the sulfonium cation and the iodonium cation (more specifically the cations in a compound represented by General Formula (ZI) and a compound represented by General Formula (ZII)) in the cation which may be contained in the photoacid generator Aw can be similarly used.

The photoacid generator B may be a compound which has a cation site and an anion site in the same molecule, and has the cation site and the anion site linked by a covalent bond.

As the compound, a compound represented by General Formula (C-1) or a compound represented by General Formula (C-2) is preferable.

(C-1)

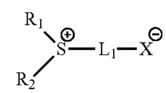

(C-2)

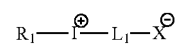

(C-3)

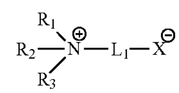

In General Formulae (C-1) to (C-3), $R_1$, $R_2$, and $R_3$ each independently represent a substituent having 1 or more carbon atoms.

$L_1$ represents a divalent linking group that links a cationic group ($S^+$, $I^+$, or $N^+$) with $—X^-$, or a single bond.

$—X^-$ represents —COO—, $—SO_3^-$, $—SO_2^-$, or $—N^-—R_4$.

$R_4$ represents a monovalent substituent having at least one of a carbonyl group (—CO—), a sulfonyl group ($—SO_2—$), or a sulfinyl group (—S(=O)—) at a site for linking to an adjacent N atom.

$R_1$, $R_2$, $R_3$, $R_4$, and $L_1$ may be bonded to each other to form a ring.

In addition, in General Formula (C-3), two of $R_1$ to $R_3$ are combined with each other to represent one divalent substituent, and may be bonded to an N atom via a double bond.

Examples of the substituent having 1 or more carbon atoms in each of $R_1$ to $R_3$ include an alkyl group, a cycloalkyl group, an aryl group (preferably having 6 to 15 carbon atoms), an alkyloxycarbonyl group, a cycloalkyloxycarbonyl group, an aryloxycarbonyl group, an alkylaminocarbonyl group, a cycloalkylaminocarbonyl group, and an arylaminocarbonyl group. Among those, the alkyl group, the cycloalkyl group, or the aryl group is preferable.

Examples of $L_1$ as a divalent linking group include a linear or branched alkylene group, a cycloalkylene group, an arylene group (preferably having 6 to 15 carbon atoms), a carbonyl group, an ether bond, an ester bond, an amide bond, an urethane bond, an urea bond, and a group formed by combination of two or more kinds thereof. Among those, the alkylene group, the arylene group, the ether bond, the ester bond, or the group formed by combination of two or more kinds thereof is preferable.

The photoacid generator B is a compound that generates an acid having a pKa higher than that of the acid generated from the photoacid generator Aw by 1.00 or more, and may be an onium salt compound having a nitrogen atom in the cationic moiety. The onium salt compound having a nitrogen atom in the cationic moiety preferably has a basic moiety including a nitrogen atom in the cationic moiety.

The basic moiety is preferably an amino group, and more preferably an aliphatic amino group. Further, all of the atoms adjacent to the nitrogen atom in the basic moiety are preferably hydrogen atoms or carbon atoms. In addition, from the viewpoint of improving basicity, it is preferable that an electron-withdrawing functional group (such as a carbonyl group, a sulfonyl group, a cyano group, and a halogen atom) is not directly linked to the nitrogen atom.

The photoacid generator B may be in a form of a low-molecular-weight compound or a form incorporated into a part of a polymer. Further, a combination of the form of a low-molecular-weight compound and the form incorporated into a part of a polymer may also be used.

The photoacid generator B is preferably in the form of a low-molecular-weight compound.

In a case where the photoacid generator B is in the form of the low-molecular-weight compound, the molecular weight is preferably 3,000 or less, more preferably 2,000 or less, and still more preferably 1,000 or less.

(Compound (DD) Having Nitrogen Atom and Having Group that is Eliminated by Action of Acid)

The compound (DD) is preferably an amine derivative having, on a nitrogen atom, a group that is eliminated by the action of an acid.

As the group that is eliminated by the action of an acid, an acetal group, a carbonate group, a carbamate group, a tertiary ester group, a tertiary hydroxy group, or a hemiaminal ether group is preferable, and the carbamate group or the hemiaminal ether group is more preferable.

The compound (DD) is preferably a low-molecular-weight compound.

The molecular weight of the compound (DD) is preferably 100 to 1,000, more preferably 100 to 700, and still more preferably 100 to 500.

The compound (DD) may have a carbamate group having a protective group on the nitrogen atom. The protective group constituting the carbamate group is represented by General Formula (d-1).

(d-1)

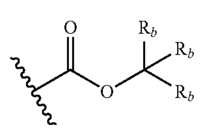

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be bonded to each other to form a ring.

The alkyl group, the cycloalkyl group, the aryl group, or the aralkyl group represented by $R_b$ may be each independently substituted with a functional group such as a hydroxy group, a cyano group, an amino group, a pyrrolidino group, a piperidino group, a morpholino group, and an oxo group, an alkoxy group, or a halogen atom. The same applies to the alkoxyalkyl group represented by $R_b$.

As $R_b$, a linear or branched alkyl group, a cycloalkyl group, or an aryl group is preferable, and the linear or branched alkyl group, or the cycloalkyl group is more preferable.

Examples of the ring formed by the mutual linkage of two $R_b$'s include an alicyclic hydrocarbon, an aromatic hydrocarbon, a heterocyclic hydrocarbon, and derivatives thereof.

Examples of the specific structure of the group represented by General Formula (d-1) include, but are not limited to, the structures disclosed in paragraph [0466] of the specification of US2012/0135348A1.

The compound (DD) preferably has a structure represented by General Formula (6).

(6)

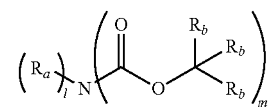

In General Formula (6), l represents an integer of 0 to 2, m represents an integer of 1 to 3, and these satisfy l+m=3.

$R_a$ represents a hydrogen atom, an alkyl group, a cycloalkyl group, an aryl group, or an aralkyl group. In a case where 1 is 2, two $R_a$'s may be the same as or different from each other, and the two $R_a$'s may be linked to each other to form a heterocycle with the nitrogen atom in the formula. This heterocycle may include a heteroatom other than the nitrogen atom in the formula.

$R_b$ has the same definition as $R_b$ in General Formula (d-1), and preferred examples are also the same.

In General Formula (6), the alkyl group, the cycloalkyl group, the aryl group, and the aralkyl group as $R_a$ may be each independently substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (these groups may be substituted with the groups as described above) of $R_a$ include the same groups as the specific examples as described above with respect to $R_b$.

Specific examples of the particularly preferred compound (DD) in the present invention include, but are not limited to, the compounds disclosed in paragraph [0475] of the specification of US2012/0135348A1.

A difference between the pKa of a conjugate acid of the compound (DD) and the pKa of an acid generated from the photoacid generator Aw (a value obtained by subtracting the pKa of an acid generated from the photoacid generator Aw from the pKa of a conjugate acid of the compound (DD)) is preferably 1.00 or more, more preferably 1.00 to 14.00, and still more preferably 2.00 to 13.00.

In addition, the pKa of the conjugate acid of the compound (DD) varies depending on the type of the photoacid generator Aw used, but is preferably 0.00 to 14.00, more preferably 3.00 to 13.00, and still more preferably 3.50 to 12.50.

(Onium Salt Compound (DE) Having Nitrogen Atom in Cationic Moiety)

The compound (DE) is preferably a compound having a basic moiety including a nitrogen atom in the cationic moiety. The basic moiety is preferably an amino group, and more preferably an aliphatic amino group. All of the atoms adjacent to the nitrogen atom in the basic moiety are still more preferably hydrogen atoms or carbon atoms. In addition, from the viewpoint of improving basicity, it is preferable that an electron-withdrawing functional group (such as a carbonyl group, a sulfonyl group, a cyano group, and a halogen atom) is not directly linked to the nitrogen atom.

Preferred specific examples of the compound (DE) include, but are not limited to, the compounds disclosed in paragraph [0203] of US2015/0309408A1.

A difference between the pKa of a conjugate acid of the compound (DE) and the pKa of an acid generated from the photoacid generator Aw (a value obtained by subtracting the pKa of an acid generated from the photoacid generator Aw from the pKa of a conjugate acid of the compound (DE)) is preferably 1.00 or more, more preferably 1.00 to 14.00, and still more preferably 2.00 to 13.00.

In addition, the pKa of the conjugate acid of the compound (DE) varies depending on the type of the photoacid generator Aw used, but is preferably 0.00 to 14.00, more preferably 3.00 to 13.00, and still more preferably 3.50 to 12.50.

The composition of the embodiment of the present invention preferably contains at least one of a basic compound (DA), a basic compound (DB) having basicity that is reduced or lost upon irradiation with actinic rays or radiation, a compound (DC) that generates an acid having a pKa of 1.00 or more higher than the acid generated from the photoacid generator Aw, a compound (DD) having a nitrogen atom and having a group that is eliminated by an action of an acid, or an onium salt compound (DE) having a nitrogen atom in a cationic moiety.

Preferred examples of the acid diffusion control agent are shown below, but are not limited thereto.

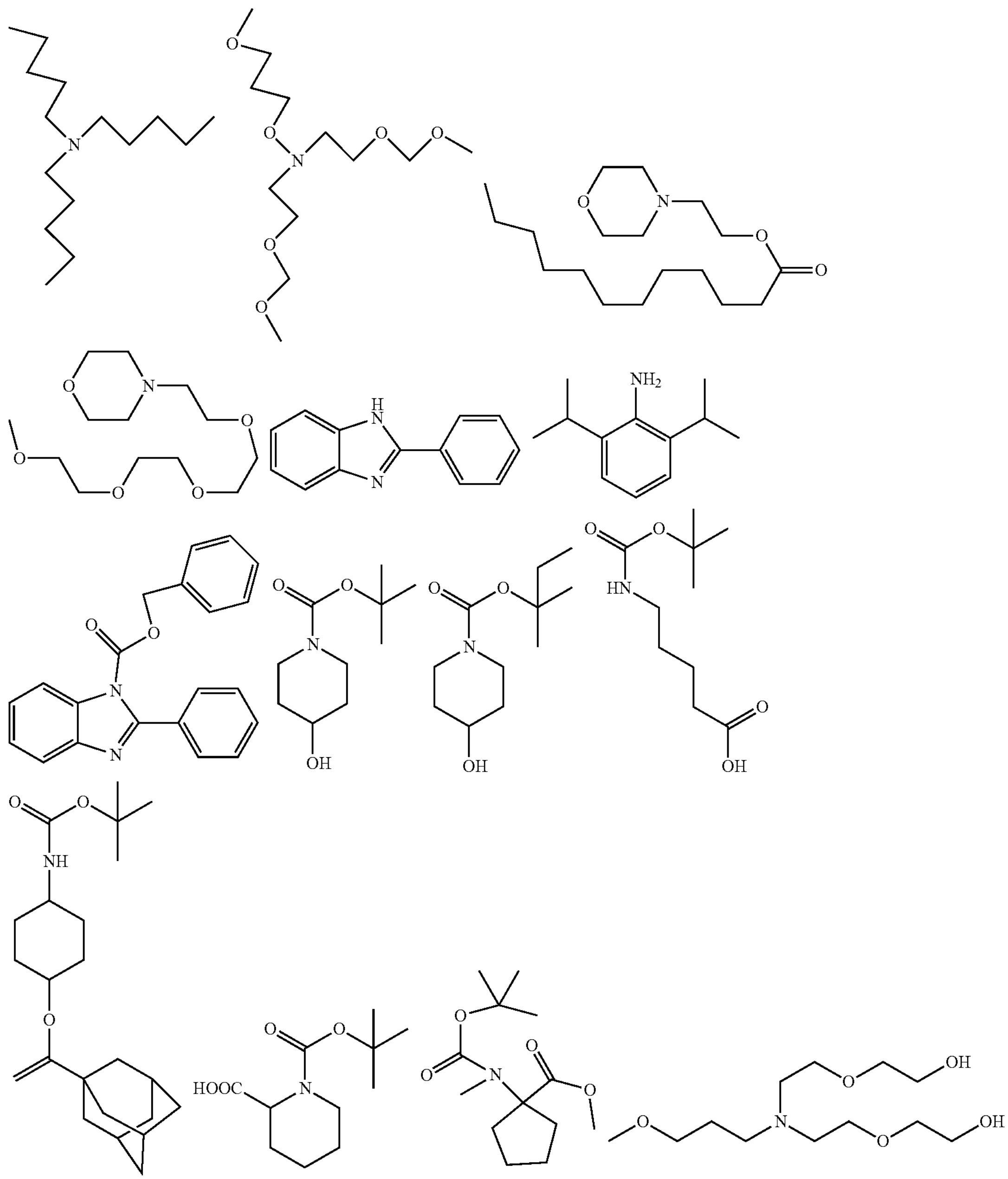

-continued
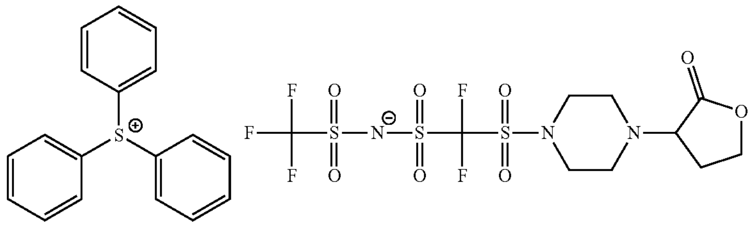
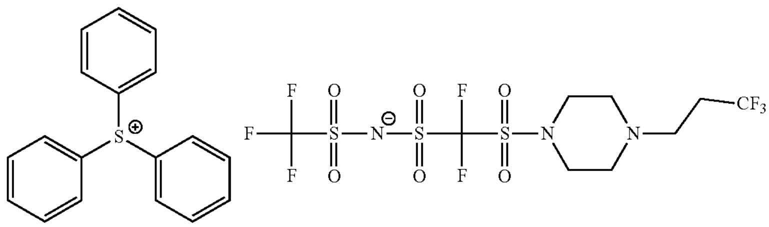
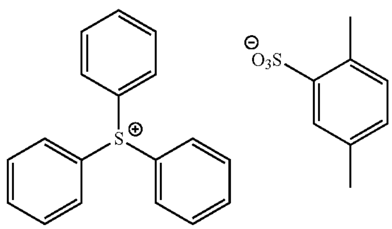
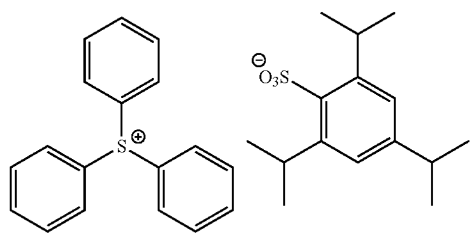
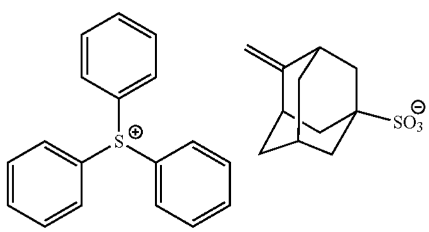
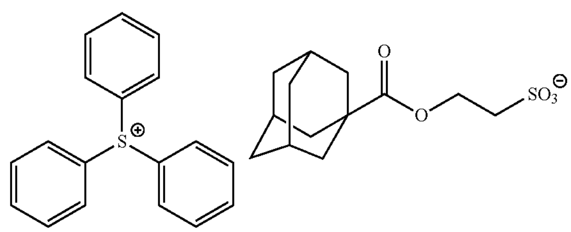
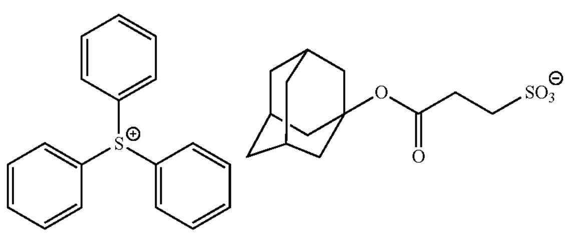
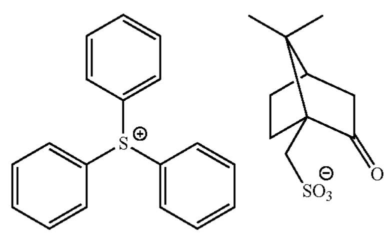
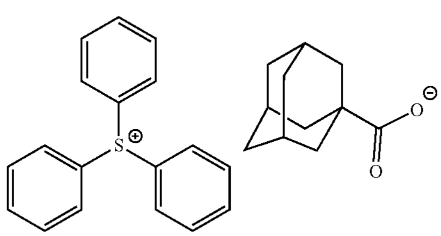
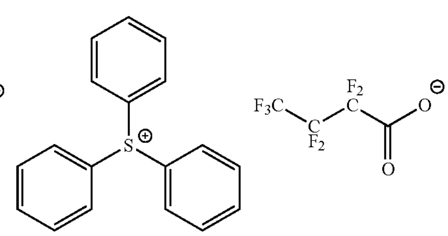
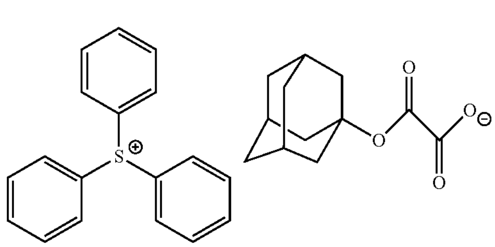
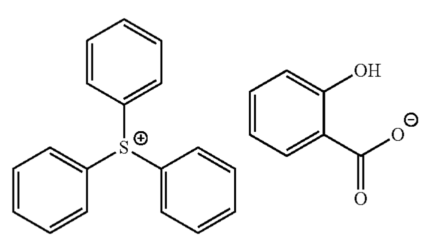

-continued
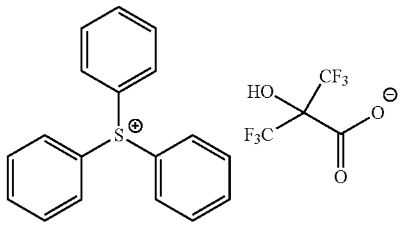
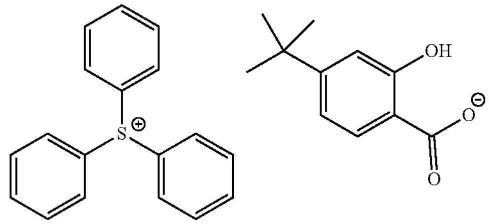
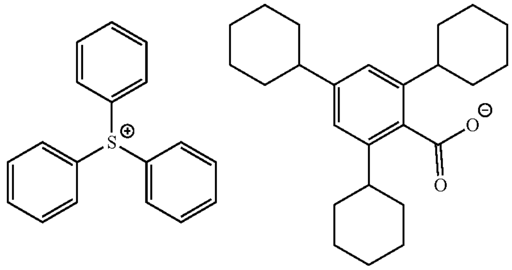
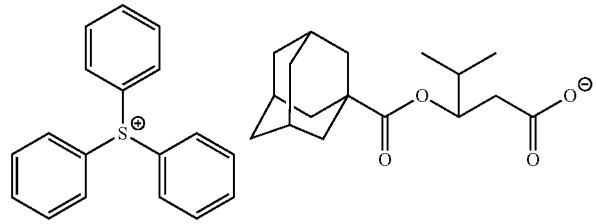
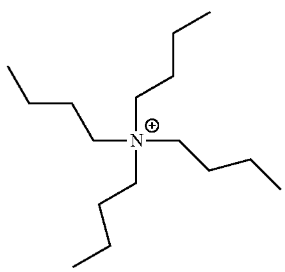
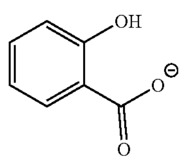
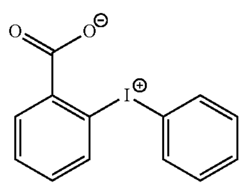
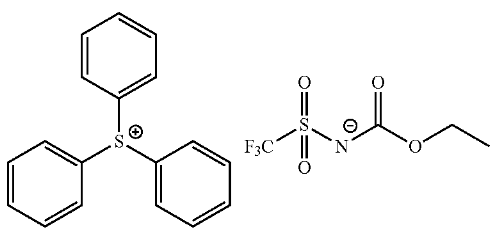
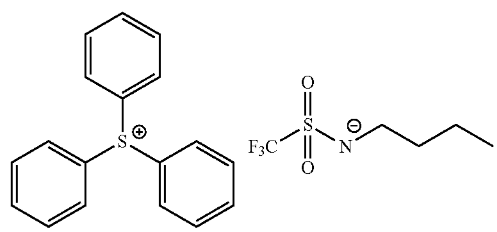
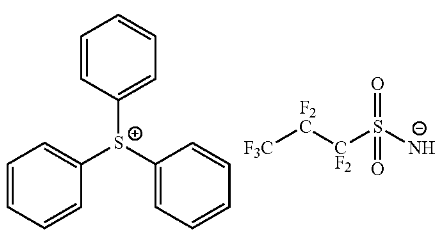
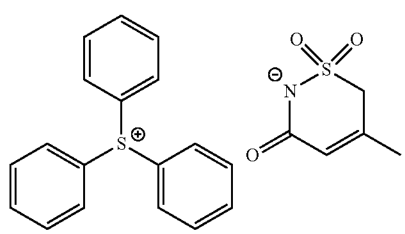
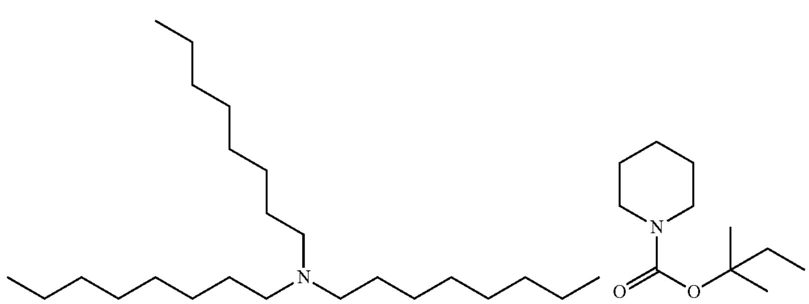

-continued

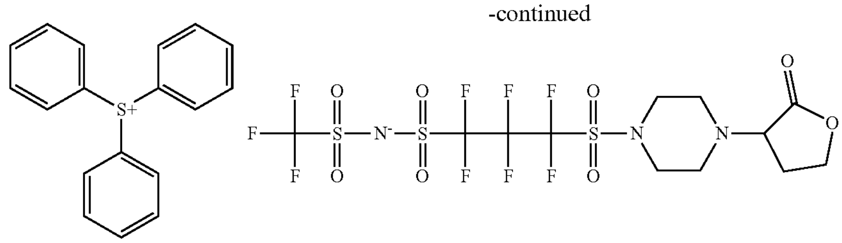

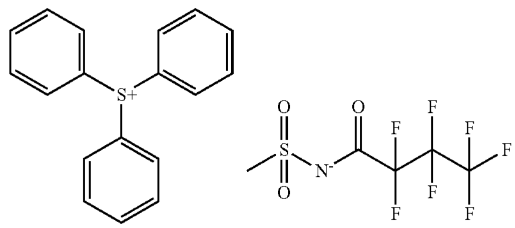

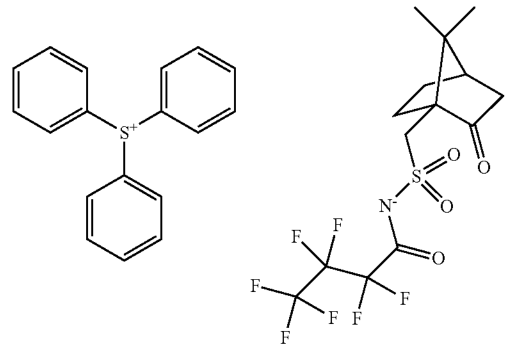

In the composition of the embodiment of the present invention, the acid diffusion control agents may be used singly or in combination of two or more kinds thereof.

In a case where the composition of the embodiment of the present invention contains the acid diffusion control agent, the content of the acid diffusion control agent (in a case where the acid diffusion control agents are present in a plural number, a total content thereof) is preferably 0.05% to 10% by mass, and more preferably 0.05% to 5% by mass with respect to the total solid content of the composition of the embodiment of the present invention.

[Hydrophobic Resin]

The composition of the embodiment of the present invention may include a hydrophobic resin. Further, the hydrophobic resin is a resin different from the resin P, and from the viewpoint that the film thickness uniformity of a film is excellent, it is preferable that the hydrophobic resin does not substantially include a repeating unit having a group (acid-decomposable group) having polarity that increases through decomposition by the action of an acid. Further, an expression of "not substantially including" as mentioned herein means that the content of the repeating unit including an acid-decomposable group in the hydrophobic resin is intended to be from 0% by mole to 5% by mole with respect to all the repeating units of the hydrophobic resin, and an upper limit thereof is preferably 3% by mole or less, and more preferably 1% by mole or less.

By incorporation the hydrophobic resin into the composition of the embodiment of the present invention, it is easy to control the static and/or dynamic contact angle on the surface of a resist film (actinic ray-sensitive or radiation-sensitive film). Thus, it is possible to improve development characteristics, suppress generation of out gas, improve immersion liquid followability upon liquid immersion exposure, and reduce liquid immersion defects, for example.

It is preferable that the hydrophobic resin is designed to be unevenly distributed on a surface of a resist film, but unlike the surfactant, the hydrophobic resin does not necessarily have a hydrophilic group in a molecule thereof and does not necessarily contribute to homogeneous mixing of polar materials and non-polar materials.

From the viewpoint of uneven distribution on the surface layer of a film, it is preferable that the hydrophobic resin is a resin having one or more groups (also referred to as "hydrophobic groups") selected from the group consisting of a fluorine atom, a group having a fluorine atom, a group having a silicon atom, a linear or branched alkyl group or cycloalkyl group having 6 or more carbon atoms, an aryl group having 9 or more carbon atoms, an aralkyl group having 10 or more carbon atoms, an aryl group substituted with at least one linear or branched alkyl group having 3 or more carbon atoms, and an aryl group substituted with at least one cycloalkyl group having 5 or more carbon atoms.

In addition, the hydrophobic resin preferably includes a repeating unit including the hydrophobic group.

Furthermore, in a case where the hydrophobic resin includes a fluorine atom and/or a silicon atom, the fluorine atom and/or the silicon atom in the hydrophobic resin may be included in the main chain of a resin or may be included in a side chain.

As the group having a fluorine atom, the linear or branched alkyl group or cycloalkyl group having a fluorine atom, or the aryl group having a fluorine atom is preferable.

As the linear or branched alkyl group having a fluorine atom, a perfluoroalkyl group having 1 to 4 carbon atoms is preferable, and $CF_3$ is more preferable.

As the cycloalkyl group having a fluorine atom, a perfluorocycloalkyl group having 3 to 20 carbon atoms is preferable.

Examples of the aryl group having a fluorine atom include a phenyl group substituted with a fluorine atom.

Examples of the group having a silicon atom include an alkylsilyl group.

Examples of the alkylsilyl group include a trimethylsilyl group, a triethylsilyl group, and a tert-butyldimethylsilyl group.

Examples of the linear or branched alkyl group or cycloalkyl group having 6 or more carbon atoms include a linear or branched alkyl group or cycloalkyl group having 6 to 20 carbon atoms, for example, a 2-ethylhexyl group, a norbornyl group, and an adamantyl group.

Examples of the aryl group having 9 or more carbon atoms include an aryl group having a polycyclic structure formed by combination of two or more 5-membered or 6-membered monocyclic aromatic hydrocarbon rings.

As the aralkyl group having 10 or more carbon atoms, for example, an aralkyl group having 10 to 20 carbon atoms is preferable, and specific examples thereof include a 1-naphthylmethyl group, a 1-(1-naphthyl)ethyl group, a triphenylmethyl group, and a pyrenylmethyl group.

Examples of the aryl group substituted with at least one linear or branched alkyl group having 3 or more carbon atoms include a phenyl group substituted with a linear or branched alkyl group having 3 to 20 carbon atoms (preferably having 3 to 10 carbon atoms).

Examples of the aryl group substituted with at least one cycloalkyl group having 5 or more carbon atoms include a phenyl group substituted with a cycloalkyl group having 5 to 20 carbon atoms (preferably having 5 to 10 carbon atoms).

It is preferable that the hydrophobic resin includes a repeating unit including a fluorine atom or a group having a fluorine atom. In addition, from the viewpoint that the film thickness uniformity is more excellent, it is preferable that the number of fluorine atoms included in the hydrophobic resin is higher than the number of fluorine atoms included in the above-mentioned photoacid generator Aw.

Here, the number of fluorine atoms included in the hydrophobic resin is determined by Equation (1) in a case where the hydrophobic resin includes only one kind of repeating unit including a fluorine atom. In addition, in a case where the hydrophobic resin includes two or more kinds of repeating units including a fluorine atom, the number of fluorine atoms is determined as a sum of the values determined by Equation (1) for the respective repeating units including a fluorine atom.

$$Y_A = a \times b \div 100 \qquad \text{Equation (1):}$$

$Y_A$: Number of fluorine atoms included in the hydrophobic resin a: Number of fluorine atoms in the repeating unit including a fluorine atom b: Content (% by mole) of repeating units including a fluorine atom with respect to all the repeating units in the hydrophobic resin It is preferable that the hydrophobic resin includes at least one group selected from (x) or (y) shown below, and it is more preferable that the hydrophobic resin includes a repeating unit including a group selected from (y).

In addition, (x) and (y) shown below may include the above-mentioned hydrophobic group:

(x) an acid group, and (y) a group having a solubility in an alkaline developer that increases through decomposition by the action of the alkaline developer (hereinafter also referred to as a polarity conversion group).

Examples of the acid group (x) include a phenolic hydroxy group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

As the acid group, the fluorinated alcohol group (preferably a hexafluoroisopropanol group), the sulfonimide group, or the bis(alkylcarbonyl)methylene group is preferable.

Examples of the group (y) having a solubility in an alkaline developer that increases through decomposition by the action of the alkaline developer include a lactone group, a carboxyester group (—COO— or —OCO—), an acid anhydride group (—CO—O—CO—), an acid imide group (—NHCONH—), a carboxythioester group (—COS— or —SCO—), a carbonate ester group (—O—CO—O—), a sulfuric ester group (—$OSO_2O$— or $OSO_2$—), and a sulfonic ester group (—$SO_2O$—); the lactone group or the carboxyester group (—COO— or —OCO—) is preferable; and the carboxyester group (—COO— or —OCO—) is more preferable.

Examples of the repeating unit including a group selected from (y) include (1) a repeating unit in which a group selected from (y) is directly bonded to the main chain of a resin (for example, a repeating unit from an acrylic ester and a methacrylic ester), and (2) a repeating unit in which a group selected from (y) is bonded to the main chain of a resin via a linking group.

Furthermore, examples of the repeating unit having a lactone group include the same repeating units as the repeating unit having a lactone structure described earlier in the section of the resin P.

The repeating unit including a group selected from (y) is preferably in the form of (2) described above, and more preferably a repeating unit represented by General Formula (7).

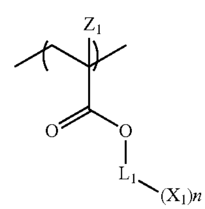

(7)

In General Formula (7), $Z_1$ represents a halogen atom, a hydrogen atom, an alkyl group, or a cycloalkyl group.

Examples of the halogen atom represented by $Z_1$ include a fluorine atom, a chlorine atom, a bromine atom, and an iodine atom, and among these, the fluorine atom is preferable.

Examples of the alkyl group represented by $Z_1$ include an alkyl group having 1 to 12 carbon atoms. The alkyl group may be either linear or branched. The alkyl group preferably has 1 to 6 carbon atoms, and more preferably has 1 to 3 carbon atoms. The cycloalkyl group preferably has 3 to 20 carbon atoms, and more preferably has 5 to 15 carbon atoms.

$L_1$ represents a (n+1)-valent linking group.

The (n+1) valent linking group represented by $L_1$ is not particularly limited, and examples thereof include a divalent or higher aliphatic hydrocarbon group having 1 to 20 carbon atoms, which may include a heteroatom.

Examples of the heteroatom include a nitrogen atom, an oxygen atom, and a sulfur atom. The heteroatom may be included, for example, in the form of —O—, —S—, —$SO_2$—, —$NR^A$—, —CO—, or a linking group formed by combination of two or more kinds thereof. Further, $R^A$ represents a hydrogen atom or an alkyl group having 1 to 20 carbon atoms.

Examples of the divalent or higher valent aliphatic hydrocarbon group having 1 to 20 carbon atoms, which may include a heteroatom, include a linear or branched alkylene group or cycloalkylene group having 1 to 20 carbon atoms, which may include a heteroatom, and a linear or branched alkylene group having 1 to 10 carbon atoms is preferable.

Xi represents a group represented by $*—Y_1—R_1$. $Y_1$ represents —CO—O— or —O—CO—. * represents a bonding position.

$R_1$ represents an electron-withdrawing group.

The electron-withdrawing group is not particularly limited, and examples thereof include an alkyl group (which may either linear or branched) or cycloalkyl group having 1 to 10 carbon atoms, which is substituted with at least one fluorine atom, and specifically include $—CF_3$, $—CF_2CF_3$, $—CH_2CF_3$, $—CHFCF_3$, and $—CH(CF_3)_2$. Among those, $—CH(CF_3)_2$ is preferable as the electron-withdrawing group from the viewpoint that the film thickness uniformity is more excellent.

n represents a positive integer.

n is not particularly limited as long as it is 1 or more, and an upper limit value thereof is, for example, 10.

Furthermore, in a case where n is 2 or more, a plurality of Xi's may be the same as or different from each other.

In a case where the hydrophobic resin includes a repeating unit including a group selected from (y), the content of the repeating unit is preferably 1% to 100% by mole, more preferably 3% to 98% by mole, and still more preferably 5% to 95% by mole with respect to all the repeating units in the hydrophobic resin.

In a case where the hydrophobic resin includes a repeating unit including a fluorine atom, the content of the repeating unit is preferably 10% to 100% by mole, more preferably 30% to 100% by mole, and still more preferably 30% to 95% by mole with respect to all the repeating units in the hydrophobic resin.

In addition, in a case where the hydrophobic resin includes a repeating units including a silicon atom, the content of the repeating unit is preferably 10% to 100% by mole, and more preferably 20% to 100% by mole with respect to all the repeating units in the hydrophobic resin.

It is preferable that the hydrophobic resin includes the above-mentioned repeating unit represented by General Formula (7) and another repeating unit other than the repeating unit represented by General Formula (7) from the viewpoint that the film surface uniformity is more excellent.

As such another repeating unit other than the repeating unit represented by General Formula (7), a repeating unit including a group selected from (y) and including the above-mentioned hydrophobic group (in other words, a repeating unit having a group having a solubility in an alkaline developer that increases through decomposition by the action of the above-mentioned alkaline developer, in which the repeating unit includes the above-mentioned hydrophobic group) is preferable; and a repeating unit including a group selected from the (y) and including one or more groups selected from the group consisting of a linear or branched alkyl group or cycloalkyl group having 6 or more carbon atoms, an aryl group having 9 or more carbon atoms, an aralkyl group having 10 or more carbon atoms, an aryl group substituted with at least one linear or branched alkyl group having 3 or more carbon atoms, and an aryl group substituted with at least one cycloalkyl group having 5 or more carbon atoms is preferable.

Furthermore, it is preferable that such another repeating unit other than the repeating unit represented by General Formula (7) does not include a fluorine atom.

In a case where the hydrophobic resin includes the repeating unit represented by General Formula (7) and another repeating unit other than the repeating unit represented by General Formula (7), the content of the repeating unit represented by General Formula (7) is preferably 95% by mole or less, more preferably 90% by mole or less, and still more preferably 85% by mole or less with respect to all the repeating units of the hydrophobic resin. Further, a lower limit thereof is not particularly limited, and is, for example, 10% by mole or more, and more preferably 30% by mole or more.

The weight-average molecular weight of the hydrophobic resin expressed in terms of standard polystyrene is preferably 1,000 to 100,000, and more preferably 1,000 to 50,000.

A total content of the residual monomers and/or oligomer components included in the hydrophobic resin is preferably 0.01% to 5% by mass, and more preferably 0.01% to 3% by mass. In addition, the dispersity (Mw/Mn) is preferably 1.0 to 5.0, and more preferably 1.0 to 3.0.

As the hydrophobic resin, known resins can be appropriately selected and used singly or as a mixture. For example, the known resins disclosed in paragraphs [0451] to [0704] of the specification of US2015/0168830A1 and paragraphs [0340] to [0356] of the specification of US2016/0274458A1 can be suitably used as the hydrophobic resin. In addition, the repeating units disclosed in paragraphs [0177] to [0258] of the specification of US2016/0237190A1 are also preferable as the repeating units constituting the hydrophobic resin.

Preferred examples of a monomer corresponding to the repeating unit constituting the hydrophobic resin are shown below.

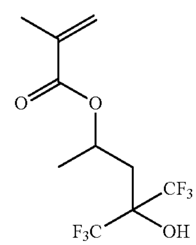

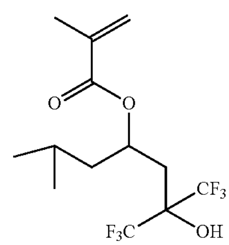

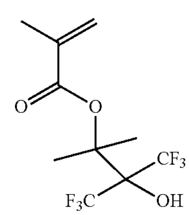

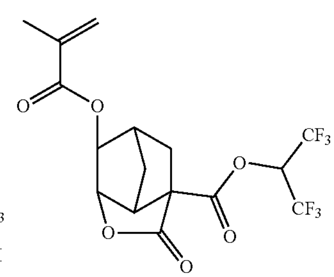

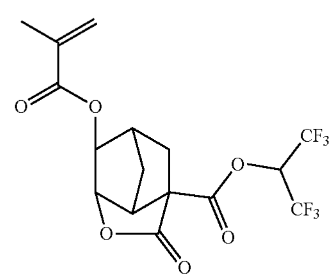

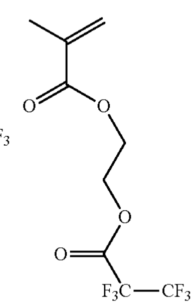

-continued
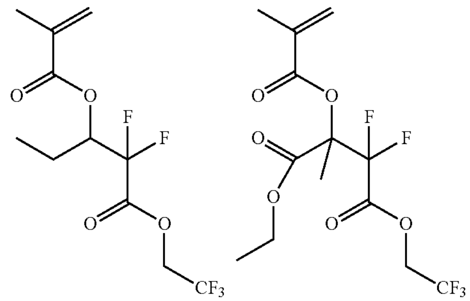
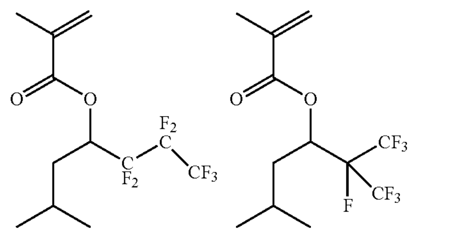
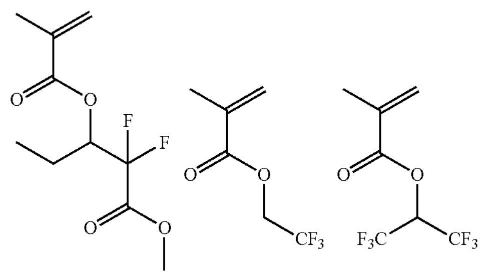
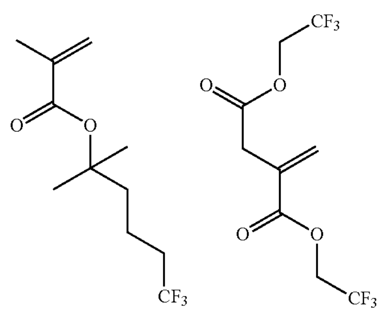
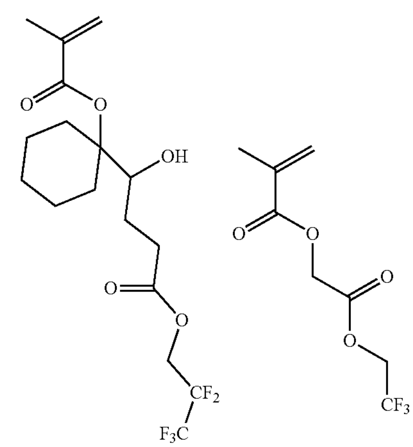
-continued
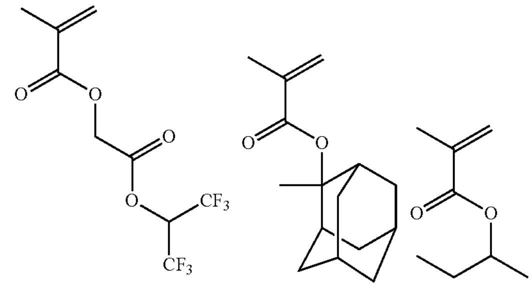
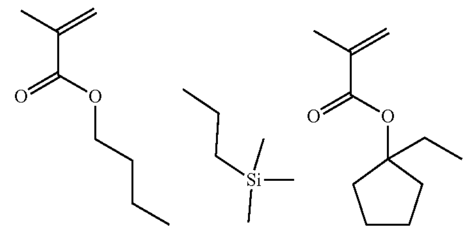
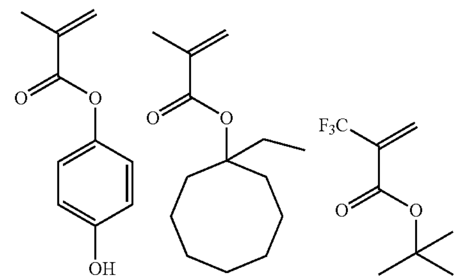
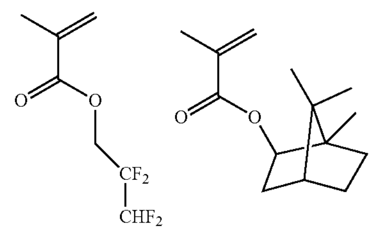
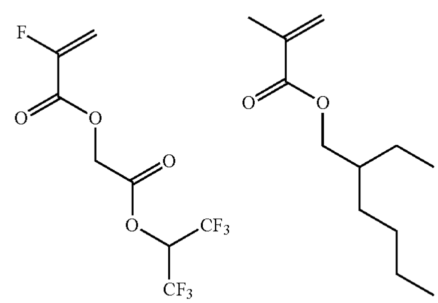
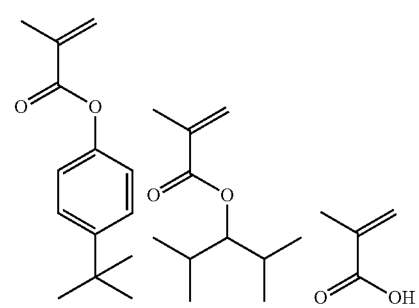

-continued

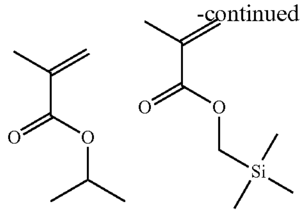

The hydrophobic resins may be used singly or in combination of two or more kinds thereof.

It is also preferable to use a mixture of two or more kinds of hydrophobic resins having different levels of surface energy from the viewpoint of satisfying both the immersion liquid followability and the development characteristics upon liquid immersion exposure.

In a case where the composition of the embodiment of the present invention contains the hydrophobic resin, the content of the hydrophobic resin in the composition of the embodiment of the present invention (in a case where the hydrophobic resins are present in a plural number, a total content thereof) is preferably 0.1% to 12.0% by mass, more preferably 0.2% to 10.0% by mass, and still more preferably 0.3% to 10.0% by mass with respect to the total solid content of the composition of the embodiment of the present invention.

[Solvent]

The composition of the embodiment of the present invention may include a solvent.

In the composition of the embodiment of the present invention, a known resist solvent can be appropriately used. For example, the known solvents disclosed in paragraphs [0665] to [0670] of the specification of US2016/0070167A1, paragraphs [0210] to [0235] of the specification of US2015/0004544A1, paragraphs [0424] to [0426] of the specification of US2016/0237190A1, and paragraphs [0357] to [0366] of the specification of US2016/0274458A1 can be suitably used.

Examples of the solvent which can be used in the preparation of the composition include organic solvents such as alkylene glycol monoalkyl ether carboxylate, alkylene glycol monoalkyl ether, alkyl lactic acid ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

As the organic solvent, a mixed solvent obtained by mixing a solvent having a hydroxy group in the structure and a solvent having no hydroxy group may be used.

As the solvent having a hydroxy group and the solvent having no hydroxy group, the above-exemplified compounds can be appropriately selected, but as the solvent having a hydroxy group, alkylene glycol monoalkyl ether or alkyl lactate is preferable, and propylene glycol monomethyl ether (PGME), propylene glycol monoethyl ether (PGEE), methyl 2-hydroxyisobutyrate, or ethyl lactate is more preferable. Further, as the solvent having no hydroxy group, alkylene glycol monoalkyl ether acetate, alkyl alkoxypropionate, a monoketone compound which may have a ring, a cyclic lactone, alkyl acetate, or the like is preferable, and among these, propylene glycol monomethyl ether acetate (PGMEA), ethyl ethoxypropionate, 2-heptanone, γ-butyrolactone, cyclohexanone, cyclopentanone, or butyl acetate is more preferable, and propylene glycol monomethyl ether acetate, γ-butyrolactone, ethyl ethoxypropionate, cyclohexanone, cyclopentanone, or 2-heptanone is still more preferable. As a solvent having no hydroxy group, propylene carbonate is also preferable.

A mixing ratio (mass ratio) of the solvent having a hydroxy group to the solvent having no hydroxy group is preferably 1/99 to 99/1, more preferably 10/90 to 90/10, and still more preferably 20/80 to 60/40. A mixed solvent including 50% by mass or more of the solvent having no hydroxy group is preferable from the viewpoint of coating evenness.

The solvent preferably includes propylene glycol monomethyl ether acetate. In this case, the solvent may be a single solvent of propylene glycol monomethyl ether acetate or a mixed solvent of two or more kinds including propylene glycol monomethyl ether acetate.

The concentration of solid contents in the composition of the embodiment of the present invention is preferably 1.0% to 10% by mass, more preferably 2.0% to 5.7% by mass, and still more preferably 2.0% to 5.3% by mass. That is, in a case where the composition includes the solvent, the content of the solvent in the composition is preferably adjusted so as to satisfy the suitable range of the concentration of the solid content. Furthermore, the concentration of solid contents is a mass percentage of other resist components excluding the solvent with respect to the total mass of the composition.

By setting the concentration of solid contents in the composition to an appropriate range to attain an appropriate viscosity and improving the coating property or the film-forming property, it is possible to adjust the film thickness of a resist film (actinic ray-sensitive or radiation-sensitive film) consisting of the composition of the embodiment of the present invention.

[Surfactant]

The composition of the embodiment of the present invention may include a surfactant.

The surfactant is preferably a fluorine-based and/or silicon-based surfactant (specifically a fluorine-based surfactant, a silicon-based surfactant, or a surfactant having both a fluorine atom and a silicon atom).

In a case where the composition of the embodiment of the present invention includes the surfactant, it is easy to obtain a pattern with good sensitivity and resolution and less adhesiveness and development defects in a case where an exposure light source of 250 nm or less, in particular, 220 nm or less is used.

Examples of the fluorine-based and/or silicon-based surfactants include the surfactants described in paragraph [0276] of the specification of US2008/0248425A.

In addition, another surfactant other than the fluorine-based and/or silicon-based surfactants described in paragraph [0280] of the specification of US2008/0248425A may also be used.

The surfactants may be used singly or in combination of two or more kinds thereof.

In a case where the composition of the embodiment of the present invention contains the surfactant, the content of the surfactant (in a case where the surfactants are present in a plural number, a total content thereof) is preferably 0.0001% to 2% by mass, and more preferably 0.0005% to 1% by mass with respect to the total solid content of the composition.

On the other hand, in a case where the content of the surfactant is 10 parts per million (ppm) by mass or more with respect to the total solid content of the composition, the uneven distribution of the hydrophobic resin on the surface is enhanced. As a result, the surface of the resist film can be made more hydrophobic, and the water following property during liquid immersion exposure is improved.

[Other Additives]

The composition of the embodiment of the present invention may further include a resin other than those described above, a crosslinking agent, an acid proliferation agent, a dye, a plasticizer, a photosensitizer, a light absorber, an alkali-soluble resin, a dissolution inhibitor, a dissolution accelerator, or the like.

<Preparation Method>

The composition of the embodiment of the present invention is preferably used by dissolving the components in a predetermined organic solvent (preferably the mixed solvent), and filtering the solution through a filter and applying it onto a predetermined support (substrate).

The pore size of a filter for use in filtration through the filter is preferably pore size of 0.1 μm or less, more preferably 0.05 μm or less, and still more preferably 0.03 μm or less. Further, in a case where the concentration of solid contents of the composition is high (for example, 25% by mass or more), the pore size of a filter used for filter filtration is preferably 3 μm or less, more preferably 0.5 μm or less, and still more preferably 0.3 μm or less. As the filter, a polytetrafluoroethylene-made, polyethylene-made, or nylon-made filter is preferable. In the filtration using a filter as shown in the specification of JP2002-062667A, circulating filtration may be performed or the filtration may be performed by connection of a plurality of kinds of filters in series or in parallel. In addition, the composition may be filtered in plural times. Furthermore, the composition may be subjected to a deaeration treatment or the like before or after filtration using a filter.

<Uses>

The composition of the embodiment of the present invention relates to an actinic ray-sensitive or radiation-sensitive resin composition having properties changed by undergoing a reaction upon irradiation with actinic rays or radiation. More specifically, the composition of the embodiment of the present invention relates to an actinic ray-sensitive or radiation-sensitive resin composition which is used in a step of manufacturing a semiconductor such as an integrated circuit (IC), for the manufacture of a circuit board for a liquid crystal, a thermal head, or the like, the manufacture of a mold structure for imprinting, other photofabrication steps, or production of a planographic printing plate or an acid-curable composition. A pattern formed in the present invention can be used in an etching step, an ion implantation step, a bump electrode forming step, a rewiring forming step, a microelectromechanical system (MEMS), or the like.

[Pattern Forming Method and Resist Film]

The present invention also relates to a pattern forming method using the actinic ray-sensitive or radiation-sensitive resin composition. Hereinafter, the pattern forming method of the embodiment of the present invention will be described. Further, the resist film (actinic ray-sensitive or radiation-sensitive film) of the embodiment of the present invention will be described together with the description of the pattern forming method.

The pattern forming method of the embodiment of the present invention has:

(i) a step of forming a resist film (actinic ray-sensitive or radiation-sensitive film) on a support using the above-described actinic ray-sensitive or radiation-sensitive resin composition (resist film forming step (film forming step)), (ii) a step of exposing the resist film (irradiating the resist film with actinic rays or radiation) (exposing step), and (iii) a step of developing the exposed resist film with a developer (developing step).

The pattern forming method of the embodiment of the present invention is not particularly limited as long as the method includes the steps (i) to (iii), and may further include the following steps.

In the pattern forming method of the embodiment of the present invention, the exposing method in the exposing step (ii) may be liquid immersion exposure.

The pattern forming method of the embodiment of the present invention preferably includes a prebaking (PB) step (iv) before the exposing step (ii).

The pattern forming method of the embodiment of the present invention preferably includes a post-exposure baking (PEB) step (v) after the exposing step (ii) and before the developing step (iii).

The pattern forming method of the embodiment of the present invention may include the exposing step (ii) a plurality of times.

The pattern forming method of the embodiment of the present invention may include the prebaking step (iv) a plurality of times.

The pattern forming method of the embodiment of the present invention may include the post-exposure baking step (v) a plurality of times.

In the pattern forming method of the embodiment of the present invention, the above-described resist film forming step (film forming step)(i), exposing step (ii), and developing step (iii) can be performed by a generally known method.

The thickness of the resist film is preferably 110 nm or less, and more preferably 95 nm or less, from the viewpoint of improving resolving power.

In addition, a resist underlayer film (for example, spin on glass (SOG), spin on carbon (SOC), and an antireflection film) may be formed between the resist film and the support, as desired. As a material constituting the resist underlayer film, known organic or inorganic materials can be appropriately used.

A protective film (topcoat) may be formed on the upper layer of the resist film. As the protective film, a known material can be appropriately used. For example, the compositions for forming a protective film disclosed in the specification of US2007/0178407A, the specification of US2008/0085466A, the specification of US2007/0275326A, the specification of US2016/0299432A, the specification of US2013/0244438A, or the specification of WO2016/157988A can be suitably used. The composition for forming a protective film preferably includes the above-mentioned acid diffusion control agent.

A protective film may be formed on the upper layer of the resist film including the above-mentioned hydrophobic resin.

The support is not particularly limited, and a substrate which is generally used in a step of manufacturing a semiconductor such as an IC, and a step for manufacturing a circuit board for a liquid crystal, a thermal head, or the like, and other lithographic steps of photofabrication can be used. Specific examples of the support include an inorganic substrate such as silicon, $SiO_2$, and SiN.

For any of the prebaking step (iv) and the post-exposure baking step (v), the baking temperature is preferably 70° C. to 130° C., and more preferably 80° C. to 120° C.

For any of the prebaking step (iv) and the post-exposure baking step (v), the baking time is preferably 30 to 300 seconds, more preferably 30 to 180 seconds, and still more preferably 30 to 90 seconds.

The baking may be performed using a unit included in an exposing device and a developing device, and may also be performed using a hot plate or the like.

A light source wavelength used in the exposing step is not limited, and examples thereof include infrared rays, visible light, ultraviolet rays, far ultraviolet rays, extreme ultraviolet rays (EUV), X-rays, and electron beams. Among those, far ultraviolet rays are preferable, and a wavelength thereof is preferably 250 nm or less, more preferably 220 nm or less, and still more preferably 1 to 200 nm. Specifically, a KrF excimer laser (248 nm), an ArF excimer laser (193 nm), an $F_2$ excimer laser (157 nm), X-rays, EUV (13 nm), or electron beams are preferable, and the KrF excimer laser, the ArF excimer laser, EUV, or the electron beams are more preferable.

In the developing step (iii), the developer may be either an alkaline developer or a developer including an organic solvent (hereinafter also referred to as an organic developer).

As the alkaline developer, a quaternary ammonium salt typified by tetramethylammonium hydroxide is usually used, but in addition to this, an aqueous alkaline solution such as an inorganic alkali, primary to tertiary amines, an alcoholamine, and a cyclic amine can also be used.

Furthermore, the alkaline developer may include an appropriate amount of alcohols and/or a surfactant. The alkali concentration of the alkaline developer is usually 0.1% to 20% by mass. The pH of the alkaline developer is usually 10 to 15.

A time period for performing development the using the alkaline developer is usually 10 to 300 seconds.

The alkali concentration, the pH, and the development time using the alkaline developer can be appropriately adjusted depending on a pattern formed.

The organic developer is preferably a developer including at least one organic solvent selected from the group consisting of a ketone-based solvent, an ester-based solvent, an alcohol-based solvent, an amide-based solvent, an ether-based solvent, and a hydrocarbon-based solvent.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butanoate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs [0715] to [0718] of the specification of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably, moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass with respect to the total amount of the developer.

The developer may include an appropriate amount of a known surfactant, as desired.

The content of the surfactant is usually 0.001% to 5% by mass, preferably 0.005% to 2% by mass, and still more preferably 0.01% to 0.5% by mass with respect to the total amount of the developer.

The organic developer may include the acid diffusion control agent.

Examples of the developing method include a method in which a substrate is dipped in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate rotated at a constant rate while scanning a developer jetting nozzle at a constant rate (a dynamic dispense method).

A combination of a step of performing development using an aqueous alkaline solution (an alkali developing step) and a step of performing development using a developer including an organic solvent (an organic solvent developing step) may be used. Thus, a finer pattern can be formed since a pattern can be formed by keeping only a region with an intermediate exposure intensity from not being dissolved.

It is preferable that the method includes a step of performing washing using a rinsing liquid (a rinsing step) after the developing step (iii).

As the rinsing liquid used in the rinsing step after the developing step with an alkaline developer, for example, pure water can be used. The pure water may include an appropriate amount of a surfactant. Moreover, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

The rinsing liquid used in the rinsing step after the developing step with a developer including an organic solvent is not particularly limited as long as the rinsing liquid does not dissolve the pattern, and a solution including a common organic solvent, or the like can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as the solvents described for the developer including an organic solvent.

As the rinsing liquid used in the rinsing step in this case, a rinsing liquid including a monohydric alcohol is more preferable.

Here, examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol.

The monohydric alcohol preferably has 5 or more carbon atoms, and examples thereof include 1-hexanol, 2-hexanol, 4-methyl-2-pentanol, 1-pentanol, 3-methyl-1-butanol, and methyl isobutyl carbinol.

The respective components in a plural number may be mixed or the components may also be used in admixture with an organic solvent other than the solvents.

A moisture content in the rinsing liquid used in the rinsing step after the developing step using the developer including the organic solvent is preferably 10% by mass or less, more preferably 5% by mass or less, and still more preferably 3% by mass or less. In a case where the moisture content is 10% by mass or less, good development characteristics are obtained.

The rinsing liquid after the developing step using the developer including the organic solvent may include an appropriate amount of the surfactant.

In the rinsing step, the developed substrate is subjected to a washing treatment using a rinsing liquid. A method for the washing treatment method is not particularly limited, but examples thereof include a method in which a rinsing liquid is continuously jetted on a substrate rotated at a constant rate (a rotation application method), a method in which a substrate is dipped in a tank filled with a rinsing liquid for a certain period of time (a dip method), and a method in which a rinsing liquid is sprayed on a substrate surface (a spray method). Among those, a method in which a washing treatment is carried out using the rotation application method, and a substrate is rotated at a rotation speed of 2,000 to 4,000 rotations per minute (rpm) after washing, thereby removing the rinsing liquid from the substrate is preferable. Furthermore, it is also preferable that the method includes a baking step after the rinsing step (postbaking). The developer and the rinsing liquid remaining between and inside the patterns are removed by the baking step. In the baking step after the rinsing step, the baking temperature is usually 40° C. to 160° C., and preferably 70° C. to 95° C., and the baking time is usually 10 seconds to 3 minutes, and preferably 30 seconds to 90 seconds.

It is preferable that various materials (for example, a resist solvent, a developer, a rinsing liquid, a composition for forming an antireflection film, and a composition for forming a topcoat) used in the actinic ray-sensitive or radiation-sensitive resin composition of the embodiment of the present invention, and the pattern forming method of the embodiment of the present invention include no impurities such as metal components, isomers, and residual monomers. The content of such impurities included in the various materials is preferably 1 ppm by mass or less, more preferably 100 parts per trillion (ppt) by mass or less, and still more preferably 10 ppt by mass or less, and it is particularly preferable that impurities are not substantially included (no higher than a detection limit of the measuring apparatus).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made, polyethylene-made, or nylon-made filter is preferable. As the filter, a filter which has been washed with an organic solvent in advance may be used. In the step of filtration using a filter, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step. As the filter, a filter having a reduced amount of eluates as disclosed in the specification of JP2016-201426A is preferable.

In addition to the filtration using a filter, removal of impurities using an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing material include the materials disclosed in the specification of JP2016-206500A.

In addition, examples of a method for reducing the impurities such as metals included in various materials include a method in which a raw material having a low metal content is selected as a raw material constituting various materials and the raw material constituting the various materials is subjected to filtration using a filter; and a method in which distillation under conditions suppressing contamination as much as possible by performing a lining with TEFLON (registered trademark), or the like in the inside of a device is performed. It is also preferable to carry out a glass lining treatment in all steps in a manufacturing facility for synthesizing various materials (a binder, a photoacid generator, and the like) of the resist component in order to reduce metals to a ppt order. Preferred conditions for the filtration using a filter performed on the raw materials constituting various materials are the same ones as the above-mentioned conditions.

In order to prevent impurities from being incorporated, it is preferable that various materials are stored in the container described in US2015/0227049A, JP2015-123351A, JP2017-013804A, and the like.

A method for improving the surface roughness of a pattern may be applied to a pattern formed by the pattern forming method of the embodiment of the present invention. Examples of the method for improving the surface roughness of a pattern include the method of treating a pattern by plasma of a hydrogen-containing gas, as disclosed in the specification of US2015/0104957A. In addition, known methods as described in the specification of JP2004-235468A, the specification of US2010/0020297A, and Proc. of SPIE Vol. 832883280N-1 "EUV Resist Curing Technique for LWR Reduction and Etch Selectivity Enhancement" may be applied.

In addition, a pattern formed by the method can be used as a core material (core) of the spacer process disclosed in, for example, the specification of JP1991-270227A (JP-H03-270227A) and the specification of US2013/0209941A.

[Method for Manufacturing Electronic Device]

Moreover, the present invention further relates to a method for manufacturing an electronic device, the method including the above-described pattern forming method. The electronic device manufactured by the method for manufacturing an electronic device of an embodiment of the present invention is suitably mounted on electric or electronic equipment (for example, home electronics, office automation (OA)-related equipment, media-related equipment, optical equipment, and telecommunication equipment).

EXAMPLES

Hereinbelow, the present invention will be described in more detail with reference to Examples. The materials, the amounts of materials used, the proportions, the treatment details, the treatment procedure, and the like shown in the Examples below may be modified as appropriate as long as the modifications do not depart from the spirit of the present invention. Therefore, the scope of the present invention should not be construed as being limited to Examples shown below.

Synthesis Example 1. Synthesis of Monomer

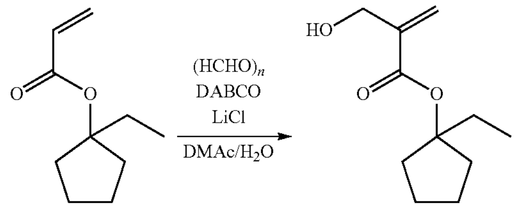

Paraformaldehyde (10.2 g), water (98 mL), 1,4-diazabicyclo[2.2.2]octane (DABCO, 22.9 g), dibutylhydroxytoluene (BHT, 0.09 g), and dimethylacetamide (DMAc, 235 mL) were mixed and stirred at room temperature. Lithium chloride (LiCl, 28.8 g) was added thereto. Since heat was generated high at this time, the mixture was cooled to 25° C. or lower in a water bath after the addition. After cooling, cyclopentylethyl acrylate (28.6 g) was added thereto, and the mixture was warmed to 45° C. and stirred for 9 hours.

Thereafter, a saturated aqueous ammonium chloride solution was added thereto, the aqueous solution was extracted three times with 400 mL of hexane/ethyl acetate=2/1 (Vol), the organic layers were combined, dried over sodium sulfate, and filtered, and the filtrate was then concentrated to obtain 28.3 g of a crude product.

The crude product was column-purified with 450 g of silica gel and a developer of hexane/ethyl acetate=4/1 (Vol) to obtain 19.0 g (56% yield) of a desired monomer. $^1$H-NMR, 400 MHz, δ (($CDCl_3$) ppm: 0.88 (3H, t, 7.5 Hz), 1.56-1.80 (6H, m), 2.02 (2H, q, 7.4 Hz)), 2.10-2.24 (2H, m), 2.38 (1H, t, 6.6 Hz), 4.30 (2H, d, 6.5 Hz), 5.73-5.78 (1H, in), 6.14-6.20 (1H, m).

Synthesis Example 2: Synthesis of Resin 83.40 parts by mass of cyclohexanone was heated to 80° C. under a nitrogen stream. While stirring this liquid, a mixed solution of 22.22 parts by mass of a monomer represented by Structural Formula D-1, 19.83 parts by mass of a monomer represented by Structural Formula E-1, 154.88 parts by mass of cyclohexanone, and 2.76 parts by mass of dimethyl 2,2'-azobisisobutyrate [V-601, manufactured by FUJIFILM Wako Pure Chemical Corporation] was added dropwise thereto over 6 hours. After the completion of dropwise addition, the mixture was further stirred at 80° C. for 2 hours. The reaction solution was left to be cooled, then reprecipitated with a large amount of heptane/ethyl acetate (mass ratio: 7:3), and filtered, and the obtained solid was vacuum-dried to obtain 30.70 parts by mass of a resin A-1 which is an acid-decomposable resin.

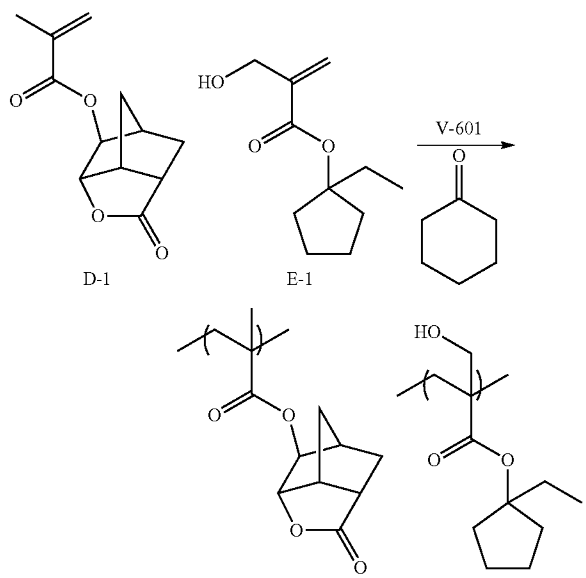

The weight-average molecular weight (Mw: expressed in terms of polystyrene) and the dispersity, determined from GPC (developing solvent: tetrahydrofuran) of the obtained resin A-1, were Mw=8,000 and Mw/Mn=1.66, respectively. The compositional ratio (molar ratio; corresponding in order from the left) measured by a $^{13}$C-nuclear magnetic resonance method (NMR) was 50/50 (% by mole).

Furthermore, the same operation as in Synthesis Examples 1 and 2 was performed to synthesize resins A-2 to A-21 described below, which are acid-decomposable resins.

<Acid-Decomposable Resin>

The structures of the acid-decomposable resins (A-1 to A-21, B-1, and B-2) used are shown below.

Furthermore, the weight-average molecular weights (Mw), the number-average molecular weights (Mn), and the dispersities (Mw/Mn) of the resins were measured by means of GPC (carrier: tetrahydrofuran (THF)) (an amount expressed in terms of polystyrene) described above. In addition, the compositional ratios (ratios in % by mole) of the resins were measured by means of $^{13}$C-nuclear magnetic resonance (NMR).

A-1

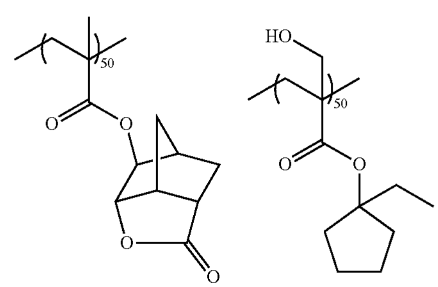

Mw = 8000
Mw/Mn = 1.66

-continued
A-2
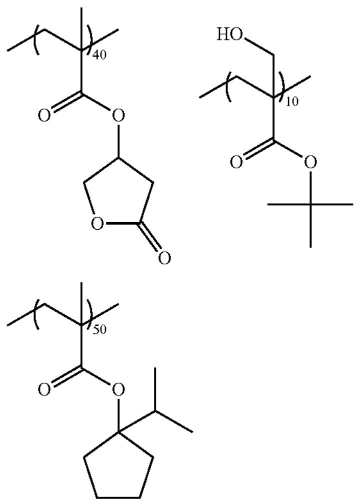
Mw = 9000
Mw/Mn = 1.63
A-3
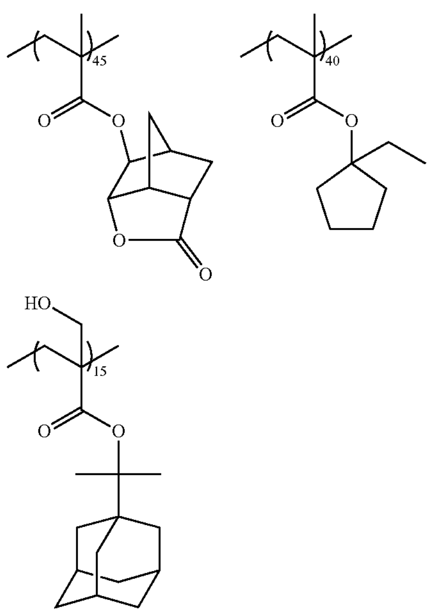
Mw = 11000
Mw/Mn = 1.71
A-4
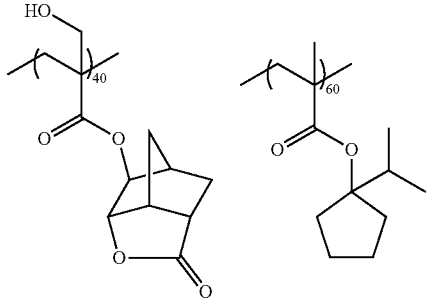
Mw = 8500
Mw/Mn = 1.64
-continued
A-5
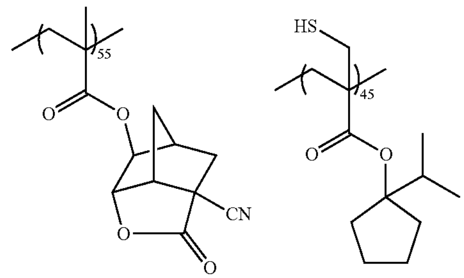
Mw = 7500
Mw/Mn = 1.64
A-6
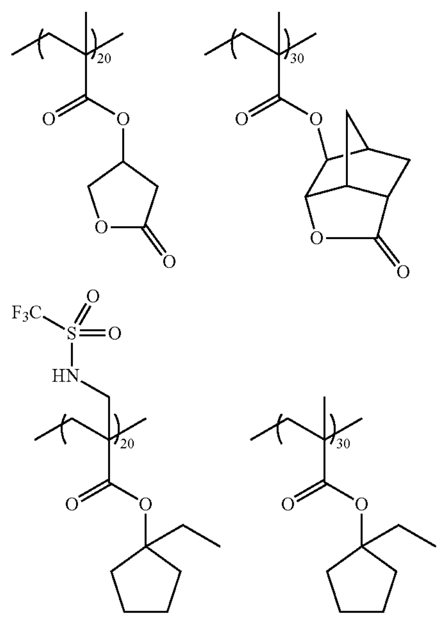
Mw = 9000
Mw/Mn = 1.63
A-7
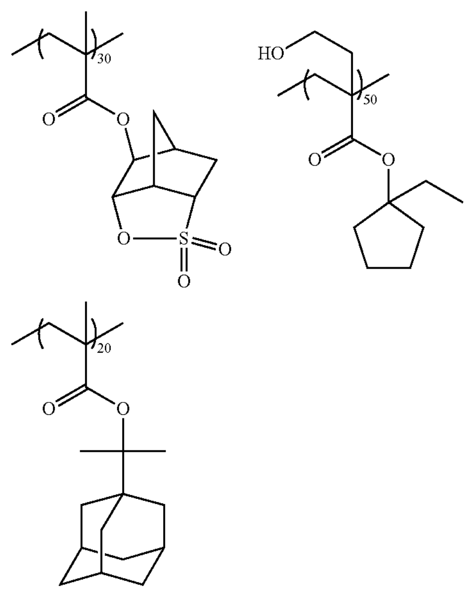
Mw = 8000
Mw/Mn = 1.63

-continued
A-8
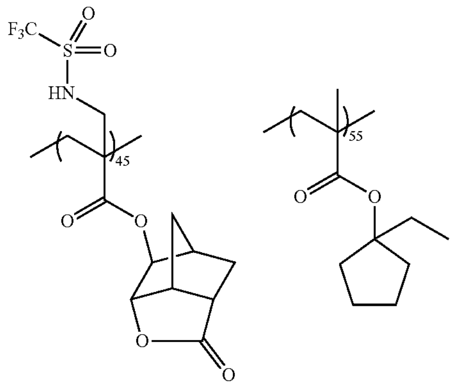
Mw = 13000
Mw/Mn = 1.68
A-9
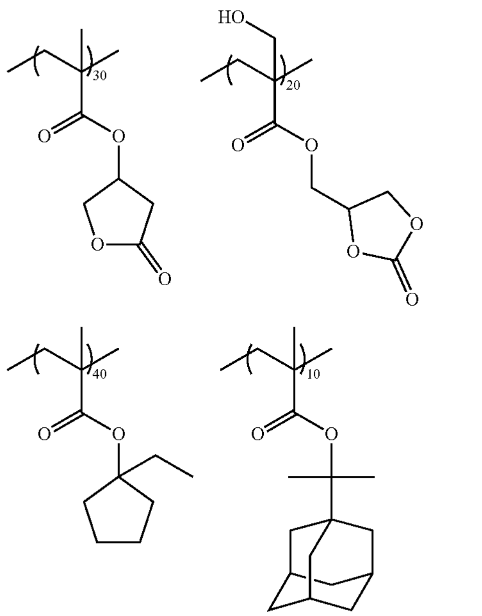
Mw = 8000
Mw/Mn = 1.62
A-10
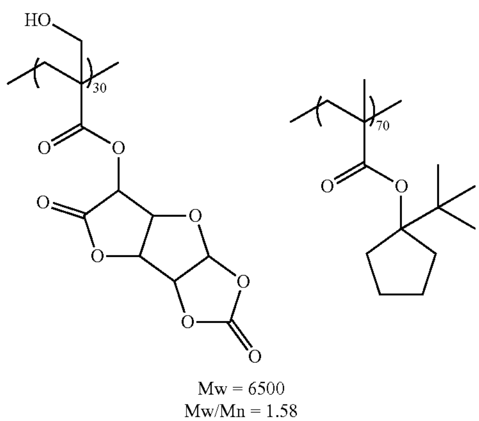
Mw = 6500
Mw/Mn = 1.58
-continued
A-11
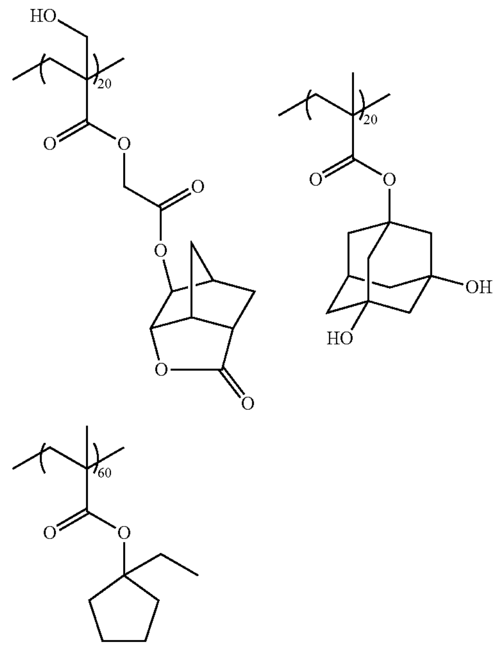
Mw = 8500
Mw/Mn = 1.62
A-12
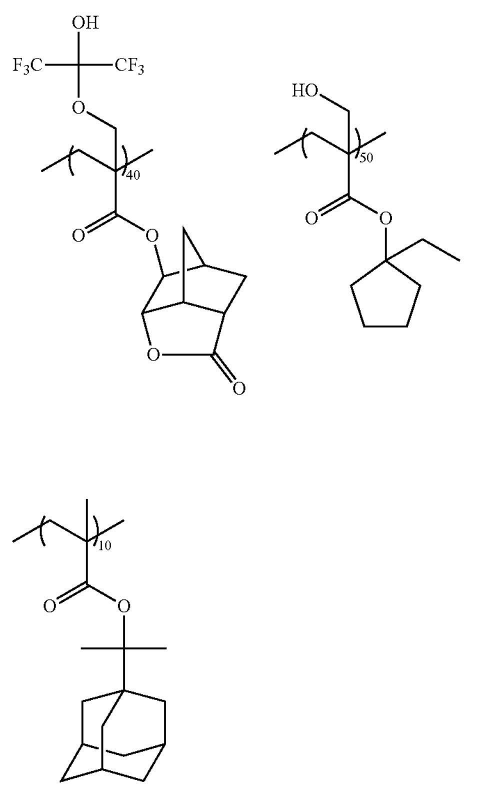
Mw = 9000
Mw/Mn = 1.65

-continued
A-13
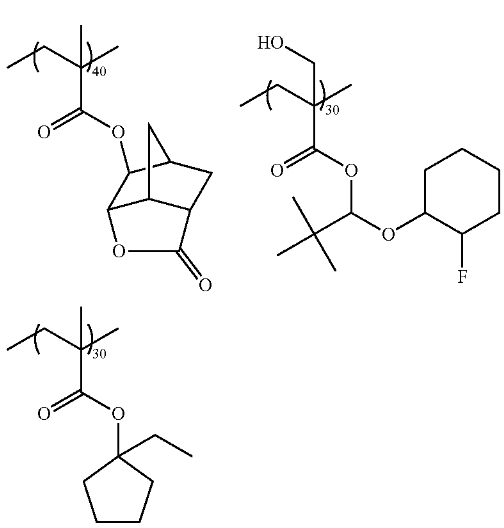
Mw = 12000
Mw/Mn = 1.62
A-14
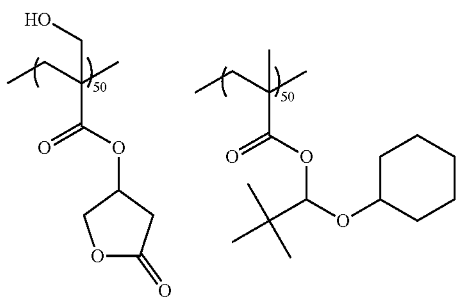
Mw = 10000
Mw/Mn = 1.70
A-15
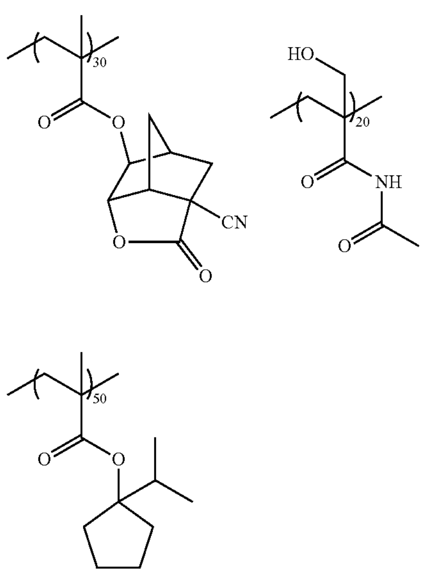
Mw = 6500
Mw/Mn = 1.55
-continued
A-16
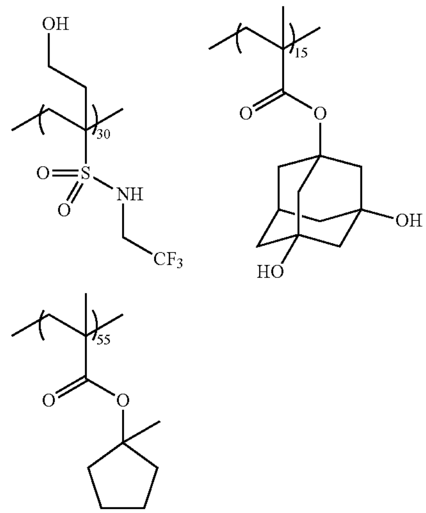
Mw = 8000
Mw/Mn = 1.73
A-17
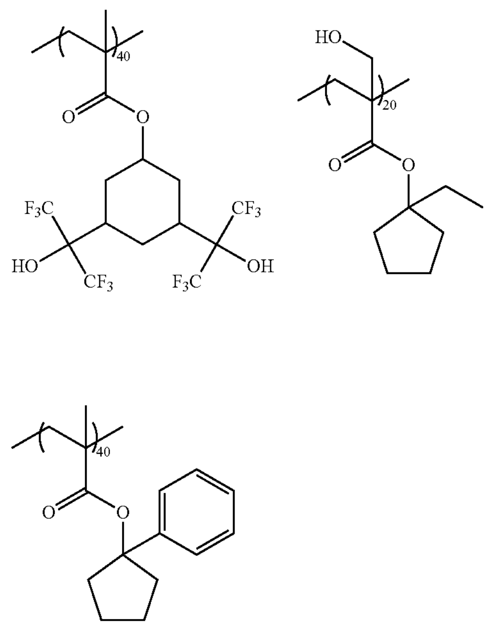
Mw = 8000
Mw/Mn = 1.60
A-18
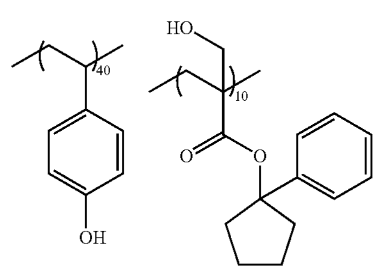

-continued
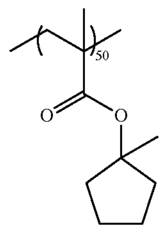
Mw = 7000
Mw/Mn = 1.62
A-19
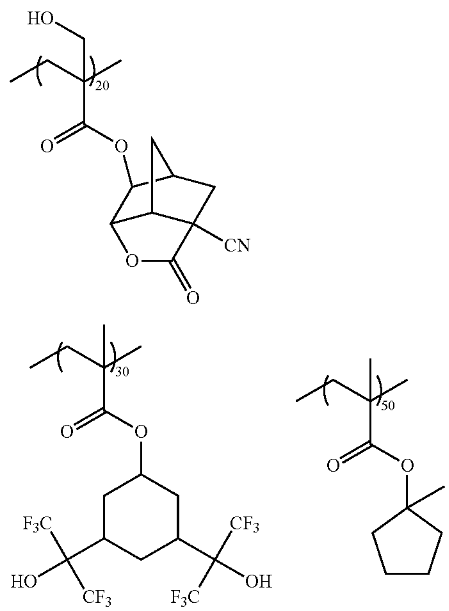
Mw = 5500
Mw/Mn = 1.52
A-20
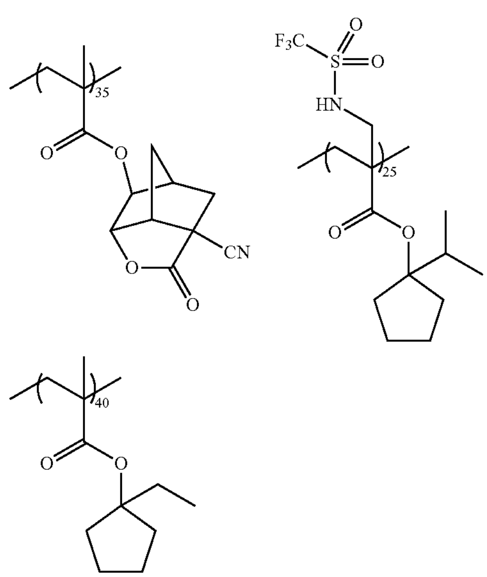
Mw = 12000
Mw/Mn = 1.70
-continued
A-21
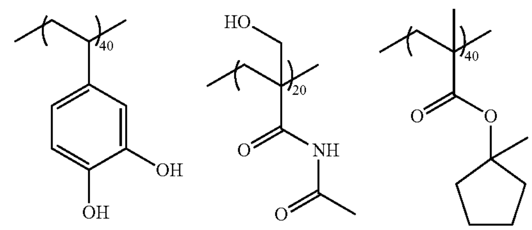
Mw = 7500
Mw/Mn = 1.61
B-1
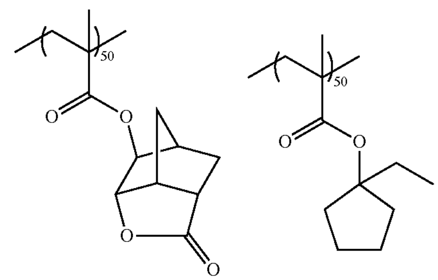
Mw = 8000
Mw/Mn = 1.65
B-2
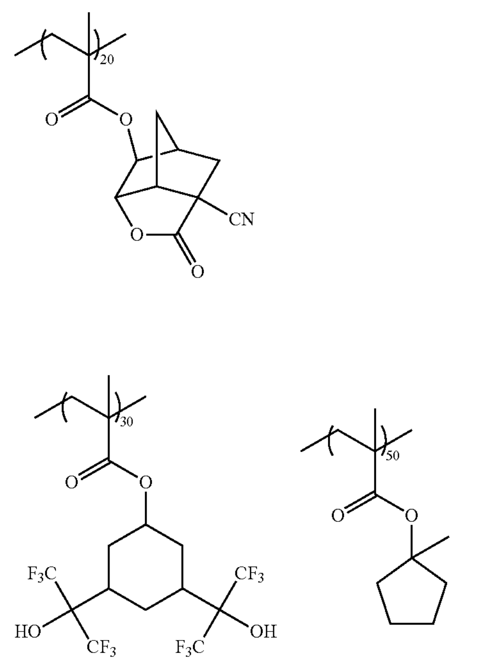
Mw = 8000
Mw/Mn = 1.58
Furthermore, the unit of the content ratio of each repeating unit of the resin is % by mole.
<Photoacid Generator>
The structures of the photoacid generators (PAG-1 to PAG-15) used are shown below.

-continued
PAG-1
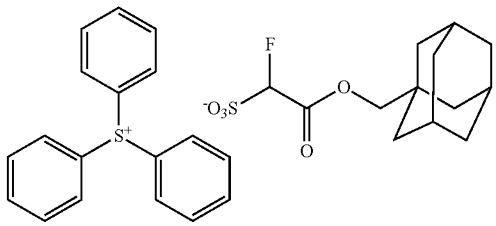
PAG-2
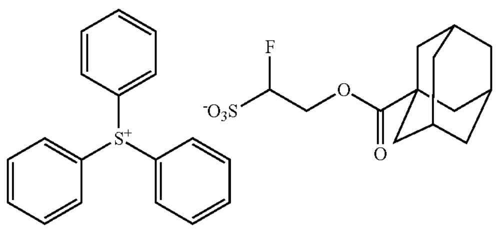
PAG-3
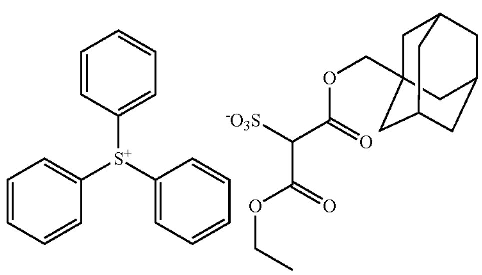
PAG-4
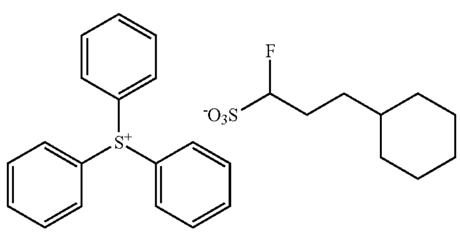
PAG-5
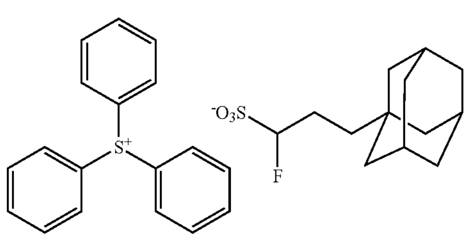
PAG-6
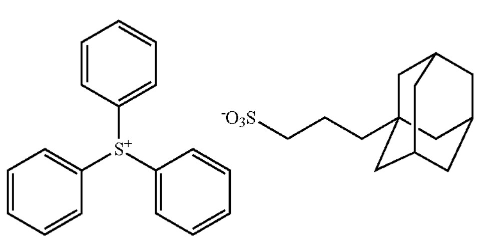
PAG-7
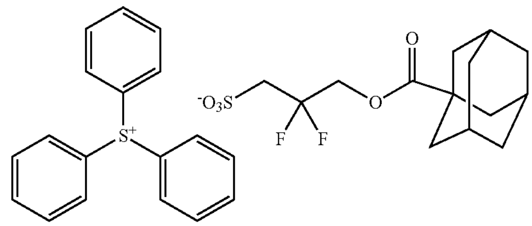
PAG-8
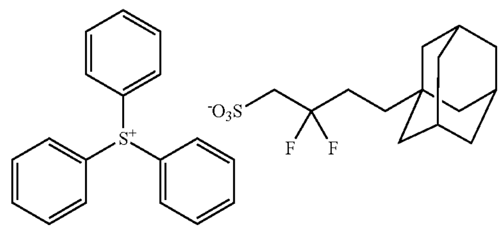
PAG-9
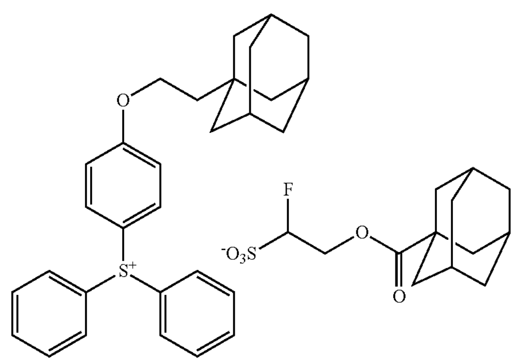
PAG-10
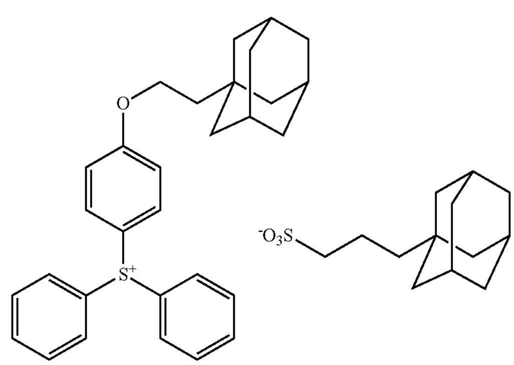
PAG-11
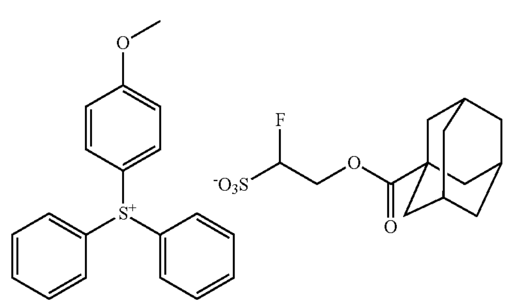

-continued
PAG-12
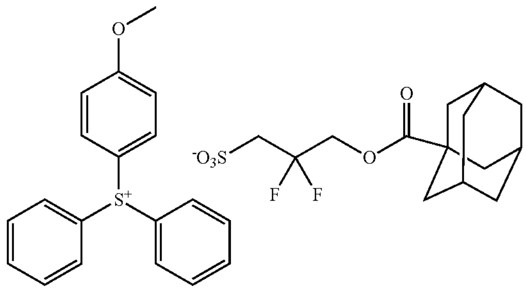
PAG-13
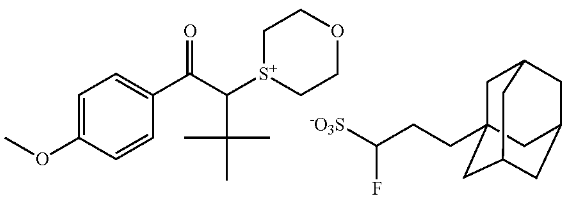
PAG-14
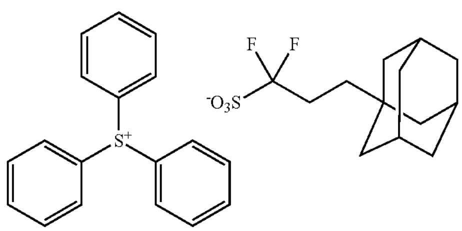
PAG-15
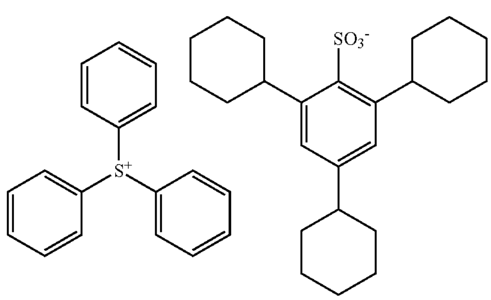
<Acid Diffusion Control Agent>
The structures of the acid diffusion control agents (N-1 to N-7) used are shown below.
N-1
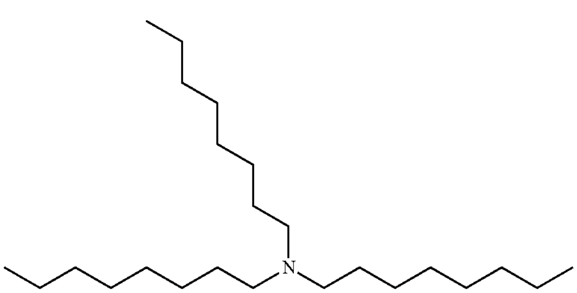
-continued
N-2
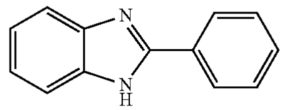
N-3
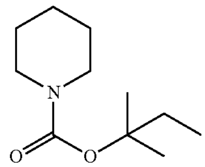
N-4
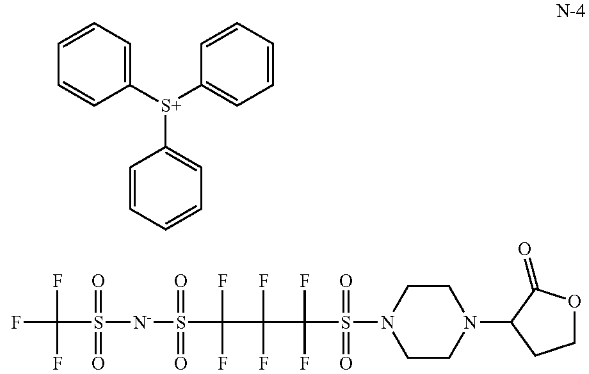
N-5
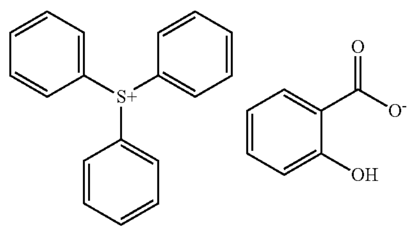
N-6
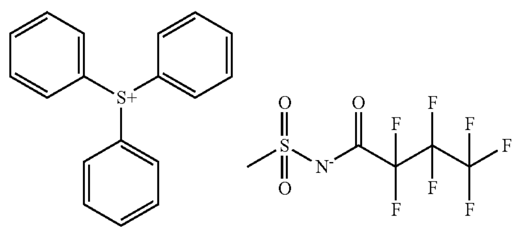
N-7
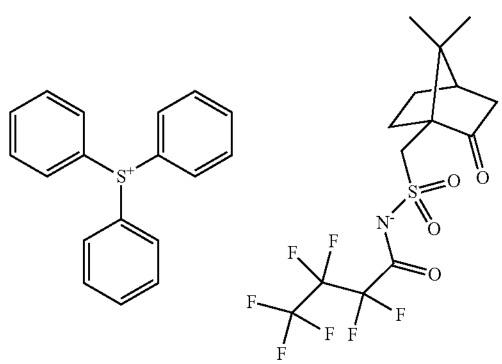
For PAG-1 to PAG-15, N-5, N-6, and N-7, the pKa's of acids (generated acids) generated therefrom are shown below.

TABLE 1

| Compound | pKa of acid generated |
|---|---|
| PAG-1 | −1.40 |
| PAG-2 | −0.81 |
| PAG-3 | −0.66 |
| PAG-4 | −0.05 |
| PAG-5 | −0.02 |
| PAG-6 | 1.87 |
| PAG-7 | 0.77 |
| PAG-8 | 1.05 |
| PAG-9 | −0.81 |
| PAG-10 | 1.87 |
| PAG-11 | −0.81 |
| PAG-12 | 0.77 |
| PAG-13 | −0.02 |
| PAG-14 | −1.90 |
| PAG-15 | −0.22 |
| N-5 | 3.01 |
| N-6 | 0.69 |
| N-7 | 0.15 |

In addition, the pKa's of conjugate acids for N-1 to N-4 are shown below.

TABLE 2

| Compound | pKa of conjugate acid |
|---|---|
| N-1 | 10.08 |
| N-2 | 11.72 |
| N-3 | 11.24 |
| N-4 | 4.20 |

<Hydrophobic Resin>

The structures of the hydrophobic resins (1b, 2b) used are shown below.

Furthermore, the weight-average molecular weights, the number-average molecular weights, and the dispersities of the resins were measured by means of GPC (carrier: tetrahydrofuran (THF)) (an amount expressed in terms of polystyrene) described above. In addition, the compositional ratio (%-by-mole ratio) of the resin was measured by $^{13}$C-NMR.

(1b)

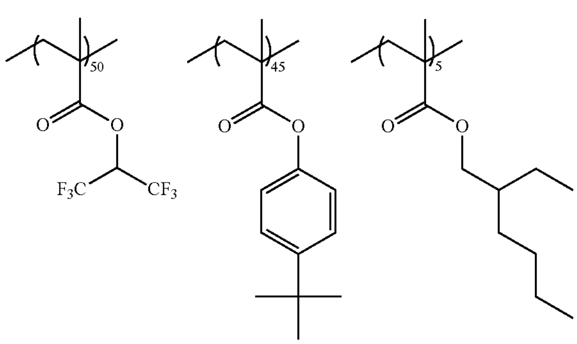

Mw = 7000
Mw/Mn = 1.3

-continued (2b)

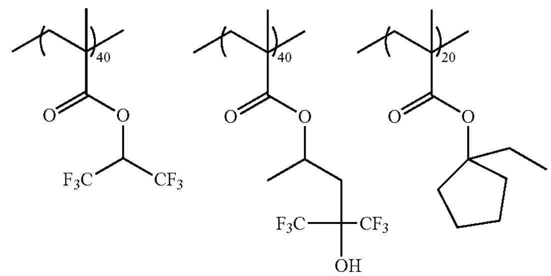

Mw = 18600
Mw/Mn = 1.57

Furthermore, the unit of the content ratio of each repeating unit of the resin is % by mole.

<Surfactant>

The surfactant used is shown below.

W-1: PolyFox PF-6320 (manufactured by OMNOVA Solutions Inc.; fluorine-based)

<Solvent>

The solvents used are shown below.

SL-1: Propylene glycol monomethyl ether acetate (PGMEA)

SL-2: Propylene glycol monomethyl ether (PGME)

SL-3: Cyclohexanone

SL-4: γ-Butyrolactone

[Preparation of Resist Composition]

The respective components shown in Tables 3 and 4 were added so as to have contents shown in Tables 3 and 4, and mixed such that the concentration of solid contents was 3% by mass. Then, the obtained mixed liquid was filtered through a polyethylene-made filter having a pore diameter of 0.03 μm to prepare an actinic ray-sensitive or radiation-sensitive resin composition (resist compositions). Furthermore, the solid content means all the components excluding the solvent.

[Pattern Formation and Evaluation]

—ArF Liquid Immersion Exposure: Formation of Positive Tone Pattern—

A composition for forming an organic antireflection film, ARC29SR (manufactured by Brewer Science, Inc.), was applied onto a silicon wafer and baked at 205° C. for 60 seconds to form an antireflection film having a film thickness of 95 nm. A resist composition shown in Table 3 was applied onto the obtained antireflection film and prebaked (PB) at 100° C. for 60 seconds to form a resist film having a film thickness of 85 nm.

The obtained wafer was exposed through a 6% halftone mask having a 1:1 line-and-space pattern with a line width of 44 nm by using an ArF excimer laser liquid immersion scanner (XT1700i, manufactured by ASML, NA 1.20, C-Quad, outer sigma: 0.900, inner sigma: 0.812, XY deflection). Ultrapure water was used as the immersion liquid. Thereafter, the wafer was post-exposure baked (PEB) at 100° C. for 60 seconds. Thereafter, the wafer was developed by puddling with a 2.38%-by-mass aqueous tetramethylammonium hydroxide (TMAH) solution for 30 seconds, and rotated at a rotation speed of 4,000 rpm for 30 seconds to form a 1:1 line-and-space pattern with a line width of 44 nm.

<Evaluation of Exposure Latitude (EL)>

An optimum exposure dose for reproducing a 1:1 line-and-space mask pattern with a line width of 44 nm was defined as a sensitivity (Eos) (mJ/cm$^2$).

Then, an exposure dose at which the line width was a width of 10% of 44 nm which is a desired value (that is, 39.6 nm and 48.4 nm) was determined, based on the determined optimum exposure dose ($E_{opt}$).

An exposure latitude (EL) defined by the following equation was calculated using the obtained exposure dose value.

$$EL\ (\%)=[[(\text{Exposure dose at which line width of line is 48.4 nm})-(\text{Exposure dose at which line width of line is 39.6 nm})]/E_{opt}]\times 100$$

The larger the EL value, the smaller the change in the line width due to a change in the exposure dose, and the better the EL performance of the resist film.

<Evaluation of Roughness Performance (Line Width Roughness; LWR)>

The 1:1 line-and-space pattern with a line width of 44 nm was observed from the top of the pattern with a critical-dimension scanning electron microscope (SEM, S-9380II, Hitachi High-Tech Corporation), the line width was measured at 50 points in the edge range of 2 μm in the longitudinal direction of the line pattern, a standard deviation was determined for the measurement variation, and 3a was calculated. A smaller value thereof indicates better performance.

TABLE 3

| | Acid-decomposable resin | | Photoacid generator | | | Acid diffusion control agent | |
|---|---|---|---|---|---|---|---|
| | Type | Content (g) | Type | Content (g) | pKa | Type | Content (g) |
| Example 1 | A-2 | 10 | PAG-1 | 2.0 | −1.40 | N-7 | 0.95 |
| Example 2 | A-4 | 10 | PAG-2 | 2.2 | −0.81 | N-6 | 0.80 |
| Example 3 | A-5 | 10 | PAG-3 | 2.0 | −0.66 | N-2 | 0.29 |
| Example 4 | A-8 | 10 | PAG-4 | 2.3 | −0.05 | N-3 | 0.30 |
| Example 5 | A-10 | 10 | PAG-5 | 2.0 | −0.02 | N-1 | 0.54 |
| Example 6 | A-12 | 10 | PAG-6 | 2.1 | 1.87 | N-4 | 1.22 |
| Example 7 | A-2/A-4 | 7/3 | PAG-7 | 2.6 | 0.77 | N-4 | 1.10 |
| Example 8 | A-14 | 10 | PAG-4/PAG-7 | 1.2/1.3 | −0.05/0.77 | N-4 | 1.51 |
| Example 9 | A-15 | 10 | PAG-8 | 2.3 | 1.05 | N-5 | 0.60 |
| Example 10 | A-1 | 10 | PAG-9 | 2.3 | −0.81 | N-7 | 0.95 |
| Example 11 | A-13 | 10 | PAG-13 | 2.0 | −0.02 | N-4 | 1.22 |
| Example 12 | A-2 | 10 | PAG-2 | 1.5 | −0.81 | — | — |
| Comparative Example 1 | B-1 | 10 | PAG-10 | 2.2 | 1.87 | N-2 | 0.29 |
| Comparative Example 2 | A-1 | 10 | PAG-14 | 2.2 | −1.90 | N-2 | 0.29 |

| | Hydrophobic resin | | Solvent | | Surfactant | | | | |
|---|---|---|---|---|---|---|---|---|---|
| | Type | Content (g) | Type | Mass ratio | Type | Content (g) | Developer | EL (%) | LWR (nm) |
| Example 1 | 1b | 0.05 | SL-1/SL-2 | 70/30 | — | — | TMAH | 15.1 | 2.6 |
| Example 2 | 1b | 0.05 | SL-1/SL-2 | 80/20 | — | — | TMAH | 15.2 | 2.5 |
| Example 3 | 1b | 0.05 | SL-1/SL-2 | 80/20 | — | — | TMAH | 15.1 | 2.5 |
| Example 4 | 2b | 0.05 | SL-1/SL-2 | 70/30 | W-1 | 0.03 | TMAH | 15.2 | 2.5 |
| Example 5 | 1b | 0.05 | SL-1/SL-2 | 90/10 | — | — | TMAH | 15.2 | 2.7 |
| Example 6 | 1b | 0.05 | SL-1/SL-3 | 80/20 | — | — | TMAH | 15.8 | 2.0 |
| Example 7 | 1b | 0 05 | SL-1/SL-2 | 80/20 | — | — | TMAH | 15.5 | 2.3 |
| Example 8 | 1b | 0 05 | SL-1/SL-2 | 80/20 | — | — | TMAH | 15.2 | 2.6 |
| Example 9 | — | — | SL-1/SL-3 | 80/20 | — | — | TMAH | 15.5 | 2.3 |
| Example 10 | 1b | 0.05 | SL-1/SL-2 | 80/20 | — | — | TMAH | 15.3 | 2.5 |
| Example 11 | 1b | 0.05 | SL-1/SL-2 | 80/20 | — | — | TMAH | 15.3 | 2.6 |
| Example 12 | 1b | 0.05 | SL-1/SL-2 | 80/20 | — | — | TMAH | 15.2 | 2.8 |
| Comparative Example 1 | 1b | 0.05 | SL-1/SL-2 | 70/30 | — | — | TMAH | 9.3 | 4.5 |
| Comparative Example 2 | 1b | 0 05 | SL-1/SL-2 | 70/30 | — | — | TMAH | 9.5 | 4.8 |

—ArF Liquid Immersion Exposure: Formation of Negative Tone Pattern—

An organic antireflection film ARC29SR (manufactured by Brewer Science, Inc.) was applied onto a silicon wafer and baked at 205° C. for 60 seconds to form an antireflection film having a film thickness of 98 nm, and the resist composition shown in Table 4 below was applied thereonto and baked at 100° C. for 60 seconds to form a resist film having a film thickness of 90 nm.

Using an ArF excimer laser liquid immersion scanner (manufactured by ASML, XT1700i, NA 1.20, C-Quad, outer sigma 0.98, inner sigma 0.89, XY deflection), the film was exposed through a mask pattern (6% halftone) for forming a pattern with a mask size of 45 nm and a pitch of 90 nm in the X direction and a mask size of 60 nm and a pitch of 120 nm in the Y direction. Ultrapure water was used as the immersion liquid. The film was heated at 100° C. in the table for 60 seconds, then developed with butyl acetate which is an organic developer for 30 seconds, and spin-dried to obtain a resist pattern (hole pattern).

<Evaluation of Exposure Latitude (EL)>

A hole size was observed with a critical-dimension scanning electron microscope (SEM, Hitachi, Ltd., S-9380II), and an optimum exposure dose in a case of resolving a hole pattern with an average hole size of 45 nm in the X direction was defined as a sensitivity ($E_{opt}$) (mJ/cm$^2$). Then, an exposure dose at which the hole size was 10% of 45 nm which is a desired value (that is, 40.5 nm and 49.5 nm) was determined, based on the obtained optimum exposure dose ($E_{opt}$). Then, an exposure latitude (EL) defined by the following equation was calculated. The larger the EL value, the smaller a change in the performance due to a change in the exposure dose, which is the better.

[EL (%)]=[(Exposure dose at which hole size is 40.5 nm)−(Exposure dose at which hole size is 49.5 nm)]/$E_{opt}$×100

<Evaluation of Pattern Critical Dimension Uniformity (CDU)>

Within one shot exposed at an optimum exposure dose, the hole sizes in the X direction of any 25 holes per region in 20 regions having a distance of 1 μm from each other (that is, 500 holes in total) were measured, a standard deviation thereof was determined, and 3σ was thus calculated. The smaller the value, the smaller a variation in dimensions, which indicates that the performance is good.

TABLE 4

| | Acid-decomposable resin | | Photoacid generator | | | Acid diffusion control agent | |
|---|---|---|---|---|---|---|---|
| | Type | Content (g) | Type | Content | pKa | Type | Content (g) |
| Example 13 | A-1 | 10 | PAG-8 | 2.3 | 1.05 | N-6 | 0.67 |
| Example 14 | A-3 | 10 | PAG-9 | 2.3 | −0.81 | N-4 | 1.33 |
| Example 15 | A-6 | 10 | PAG-10 | 2.2 | 1.87 | N-2 | 0.29 |
| Example 16 | A-7 | 10 | PAG-11 | 2.1 | −0.81 | N-4 | 1.33 |
| Example 17 | A-9 | 10 | PAG-12 | 2.1 | 0.77 | N-3 | 0.30 |
| Example 18 | A-16 | 10 | PAG-8 | 2.3 | 1.05 | N-4 | 1.15 |
| Example 19 | A-11 | 10 | PAG-13 | 2.0 | −0.02 | N-5 | 0.60 |
| Example 20 | A-1/A-3 | 5/5 | PAG-5/PAG-13 | 1.0/1.0 | −0.02/−0.02 | N-2 | 0.29 |
| Example 21 | A-4 | 10 | PAG-2 | 2.3 | −0.81 | N-7 | 0.98 |
| Example 22 | A-5 | 10 | PAG-5 | 2.5 | −0.02 | N-4 | 1.15 |
| Example 23 | A-10 | 10 | PAG-2 | 2.3 | −0.81 | N-4 | 1.33 |
| Example 24 | A-13 | 10 | PAG-2 | 2.3 | −0.81 | N-7 | 1.00 |
| Comparative Example 3 | B-1 | 10 | PAG-10 | 2.2 | 1.87 | N-2 | 0.29 |
| Comparative Example 4 | A-1 | 10 | PAG-14 | 1.8 | −1.90 | N-2 | 0.31 |

| | Hydrophobic resin | | Solvent | | Surfactant | | | | |
|---|---|---|---|---|---|---|---|---|---|
| | Type | Content (g) | Type | Mass ratio | Type | Content (g) | Developer | EL (%) | CDU (nm) |
| Example 13 | 2b | 0.05 | SL-1/SL-4 | 80/20 | — | — | Butyl acetate | 15.5 | 2.4 |
| Example 14 | 1b | 0.05 | SL-1/SL-2 | 70/30 | W-1 | 0.03 | Butyl acetate | 15.1 | 2.6 |
| Example 15 | 1b | 0.05 | SL-1 | — | — | — | Butyl acetate | 15.9 | 2.1 |
| Example 16 | 1b | 0.05 | SL-1/SL-2 | 70/30 | — | — | Butyl acetate | 14.7 | 2.5 |
| Example 17 | 1b | 0.05 | SL-1/SL-2 | 70/30 | — | — | Butyl acetate | 15.5 | 2.3 |
| Example 18 | — | — | SL-1/SL-2 | 70/30 | W-1 | 0.03 | Butyl acetate | 15.6 | 2.2 |
| Example 19 | 1b | 0.05 | SL-1/SL-2/SL-4 | 80/10/10 | — | — | Butyl acetate | 15.2 | 2.6 |
| Example 20 | 1b | 0.05 | SL-1/SL-2 | 80/20 | — | — | Butyl acetate | 15.3 | 2.7 |
| Example 21 | 1b | 0.05 | SL-1/SL-2 | 70/30 | — | — | Butyl acetate | 15.2 | 2.5 |
| Example 22 | 1b | 0.05 | SL-1/SL-2 | 70/30 | — | — | Butyl acetate | 15.3 | 2.5 |
| Example 23 | 1b | 0.05 | SL-1/SL-2 | 70/30 | — | — | Butyl acetate | 15.1 | 2.6 |
| Example 24 | 1b | 0.05 | SL-1/SL-2 | 70/30 | — | — | Butyl acetate | 15.4 | 2.8 |
| Comparative Example 3 | 1b | 0.05 | SL-1/SL-2 | 70/30 | — | — | Butyl acetate | 8.8 | 4.3 |
| Comparative Example 4 | 1b | 0.05 | SL-1/SL-2 | 70/30 | — | — | Butyl acetate | 9.1 | 4.2 |

[Preparation of Resist Composition]

The respective components shown in Table 5 were dissolved in a solvent such that a content shown in Table 5 was obtained, thereby preparing a solution having a concentration of solid contents of 1.6% by mass. Then, the obtained solution was filtered through a polyethylene filter having a pore size of 0.03 μm to prepare an actinic ray-sensitive or radiation-sensitive resin composition (resist composition).

[Resist Pattern Forming Method]

—EUV Exposure: Negative Tone Pattern or Formation of Positive Tone Pattern—

A resist composition shown in Table 5 was applied onto a silicon wafer on which AL412 (manufactured by Brewer Science, Inc.) had been formed as an underlayer film, and prebaked (PB) at 100° C. for 60 seconds to form a resist film having a film thickness of 30 nm.

The silicon wafer having the resist film thus obtained was subjected to patternwise irradiation using an EUV exposure device (manufactured by Exitech Ltd., Micro Exposure Tool, NA 0.3, Quadrupol, outer sigma 0.68, inner sigma 0.36). Further, a mask having a line size=20 nm and a line:space=1:1 was used as a reticle.

Thereafter, the wafer was post-exposure baked (PEB) at 105° C. for 60 seconds. Then, a negative tone developer (butyl acetate) or a positive tone developer (a 2.38%-by-mass aqueous tetramethylammonium hydroxide (TMAH) solution) was developed by puddling for 30 seconds, and rinsed with a negative tone rinsing liquid (FIRM Extreme 10 (manufactured by AZEM)) or a positive tone rinsing liquid (pure water). Thereafter, the wafer was rotated at a rotation speed of 4,000 rpm for 30 seconds to form a 1:1 line-and-space pattern having a line width of 20 nm.

<Evaluation of Exposure Latitude (EL)>

An exposure dose that reproduces a 1:1 line-and-space mask pattern with a line width of 20 nm was determined with a critical-dimension scanning electron microscope (SEM: CG-4100, manufactured by Hitachi High-Tech Corporation), and the value was defined as an optimum exposure dose $E_{opt}$.

Next, an exposure dose at which the line width of the line was ±10% of the target value of 20 nm (that is, 18 nm and 22 nm) was determined.

An exposure latitude (EL) defined by the following equation was calculated using the obtained exposure dose value.

The larger the EL value, the smaller the change in the line width due to a change in the exposure dose, and the better the EL performance of the resist film.

$$\text{EL }(\%)=[[(\text{Exposure dose at which line width of line is 22 nm})-(\text{Exposure dose at which line width of line is 18 nm})]/E_{opt}]\times 100$$

<Evaluation of Line Edge Roughness (LER)>

In the observation of the line-and-space resist pattern resolved at the optimum exposure dose in the sensitivity evaluation, the line-and-space resist pattern was observed from the top of the pattern using a critical-dimension scanning electron microscope (SEM (CG-4100 manufactured by Hitachi High-Tech Corporation)), and at this time, a distance from a center of the pattern to the edge was measured at any points, and a measurement variation thereof was evaluated with 3σ. A smaller value thereof indicates better performance.

TABLE 5

| | Acid-decomposable resin | | Photoacid generator | | | Acid diffusion control agent | |
|---|---|---|---|---|---|---|---|
| | Type | Content (g) | Type | Content (g) | pKa | Type | Content (g) |
| Example 25 | A-17 | 10 | PAG-1 | 2.0 | −1.40 | N-4 | 1.10 |
| Example 26 | A-18 | 10 | PAG-15 | 3.0 | −0.22 | N-2 | 0.29 |
| Example 27 | A-19 | 10 | PAG-15 | 3.0 | −0.22 | N-2 | 0.29 |
| Example 28 | A-20 | 10 | PAG-1/PAG-9 | 1.2/1.2 | −1.40/−0.81 | N-2 | 0.29 |
| Example 29 | A-21 | 10 | PAC-7 | 2.3 | 0.77 | N-6 | 0.80 |
| Example 30 | A-19 | 10 | PAG-12 | 3.2 | 0.77 | N-1 | 0.54 |
| Comparative Example 5 | B-2 | 10 | PAG-1 | 2.0 | −1.40 | N-4 | 1.10 |
| Comparative Example 6 | A-17 | 10 | PAG-14 | 2.3 | −1.90 | N-4 | 1.22 |
| Comparative Example 7 | B-2 | 10 | RAG-1 | 2.0 | −1.40 | N-4 | 1.10 |
| Comparative Example 8 | A-17 | 10 | PAG-14 | 2.3 | −1.90 | N-4 | 1.22 |

| | Hydrophobic resin | | Solvent | | Surfactant | | | | |
|---|---|---|---|---|---|---|---|---|---|
| | Type | Content (g) | Type | Mass ratio | Type | Content (g) | Developer | EL (%) | LER (nm) |
| Example 25 | — | — | SL-1/SL-2 | 70/30 | — | — | TMAH | 18.2 | 3.2 |
| Example 26 | — | — | SL-1/SL-2/SL-4 | 60/30/10 | — | — | TMAH | 17.9 | 3.5 |
| Example 27 | — | — | SL-1/SL-2 | 80/20 | W-1 | 0.03 | TMAH | 18.2 | 3.0 |
| Example 28 | 1b | 0.05 | SL-1/SL-2/SL-4 | 60/30/10 | — | — | Butyl acetate | 18.0 | 3.3 |

TABLE 5-continued

| | | | | | | | | | |
|---|---|---|---|---|---|---|---|---|---|
| Example 29 | — | — | SL-1/ SL-2/ SL-3 | 60/30/10 | — | — | Butyl acetate | 17.9 | 3.4 |
| Example 30 | — | — | SL-1/ SL-2/ SL-3 | 60/30/10 | — | — | Butyl acetate | 18.0 | 3.1 |
| Comparative Example 5 | — | — | SL-1/ SL-2 | 70/30 | — | — | TMAH | 9.2 | 5.2 |
| Comparative Example 6 | — | — | SL-1/ SL-2 | 70/30 | — | — | TMAH | 9.0 | 5.4 |
| Comparative Example 7 | — | — | SL-1/ SL-2 | 70/30 | — | — | Butyl acetate | 8.7 | 5.5 |
| Comparative Example 8 | — | — | SL-1/ SL-2 | 70/30 | — | — | Butyl acetate | 9.1 | 5.4 |

As seen from the results in Tables 3 to 5, the compositions of the embodiment of the present invention had an excellent EL, a small LWR, a small LER, and an excellent CDU in the formation of an ultrafine pattern.

INDUSTRIAL APPLICABILITY

According to the present invention, it is possible to provide an actinic ray-sensitive or radiation-sensitive resin composition which has an excellent EL, a small LWR, a small LER, and an excellent CDU in the formation of an ultrafine pattern (for example, a line-and-space pattern with a line width of 45 nm or a hole pattern with a hole size of 45 nm or less); and a resist film, a pattern forming method, and a method for manufacturing an electronic device, each using the actinic ray-sensitive or radiation-sensitive resin composition.

Although the present invention has been described in detail with reference to specific embodiments, it will be apparent to those skilled in the art that various changes and modifications can be made without departing from the spirit and the scope of the present invention.

What is claimed is:

1. An actinic ray-sensitive or radiation-sensitive resin composition comprising:

a resin P having a repeating unit represented by General Formula (P1); and a photoacid generator Aw, wherein the photoacid generator Aw is a compound that generates an acid having a pKa of −1.40 or more upon irradiation with actinic rays or radiation, the acid having a pKa of −1.40 or more is a sulfonic acid represented by any of General Formulae (Aw-1), (Aw-2), and (I) to (V), (P1)

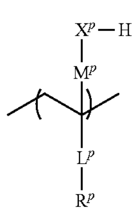

in General Formula (P1), $M^p$ represents a single bond or a divalent linking group, $L^p$ represents a divalent linking group, $X^p$ represents O, S, or $NR^{N1}$, $R^{N1}$ represents a hydrogen atom or a monovalent organic group, and $R^p$ represents a monovalent organic group, (Aw-1)

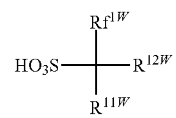

(Aw-2)

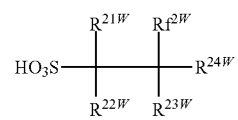

(I)

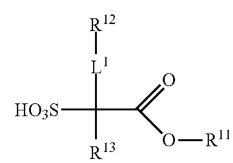

(II)

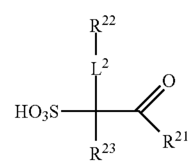

(III)

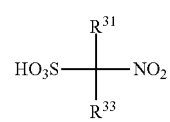

(IV)

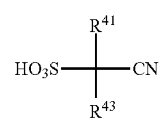

(V)

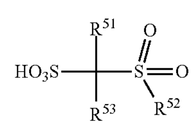

in General Formula (Aw-1), $R^{11W}$ represents a hydrogen atom or a monovalent organic group, $R^{12W}$ represents a monovalent organic group, and $Rf^{1W}$ represents a fluorine atom or a monovalent organic group including a fluorine atom, in General Formula (Aw-2), $R^{21W}$, $R^{22W}$, and $R^{23W}$ each independently represent a hydrogen atom, a fluorine atom, or a monovalent organic group, $R^{24W}$ represents a monovalent organic group, and $Rf^{2W}$ represents a fluorine atom or a monovalent organic group including a fluorine atom, in General Formula (I), $R^{11}$ and $R^{12}$ each independently represent a monovalent organic group, $R^{13}$ represents a hydrogen atom or a monovalent organic group, $L^1$ represents a group represented by —CO—O—, —CO—, —O—, —S—, —O—CO—, —S—CO—, or —CO—S—, and two selected from $R^{11}$, $R^{12}$ and $R^{13}$ may be bonded to each other to form a ring, in General Formula (II), $R^{21}$ and $R^{22}$ each independently represent a monovalent organic group, $R^{23}$ represents a hydrogen atom or a monovalent organic group, $L^2$ represents a group represented by —CO—, —O—, —S—, —O—CO—, —S—CO—, or —CO—S—, and two selected from $R^{21}$, $R^{22}$, and $R^{23}$ may be bonded to each other to form a ring, in General Formula (III), $R^{31}$ and $R^{33}$ each independently represent a hydrogen atom or a monovalent organic group, and $R^{31}$ and $R^{33}$ may be bonded to each other to form a ring, in General Formula (IV), $R^{41}$ and $R^{43}$ each independently represent a hydrogen atom or a monovalent organic group, and $R^{41}$ and $R^{43}$ may be bonded to each other to form a ring, and in General Formula (V), $R^{51}$, $R^{52}$, and $R^{53}$ each independently represent a hydrogen atom or a monovalent organic group, and two selected from $R^{51}$, $R^{52}$, and $R^{53}$ may be bonded to each other to form a ring.

2. The actinic ray-sensitive or radiation-sensitive resin composition according to claim 1, wherein a group represented by $L^p$-$R^p$ in General formula (P1) includes an acid-decomposable group.

3. The actinic ray-sensitive or radiation-sensitive resin composition according to claim 1, wherein a group represented by $L^p$-$R^p$ in General formula (P1) includes a polar group, and the polar group is at least one group selected from the group consisting of an ester group, a sulfonate group, a sulfonamide group, a carboxylic acid group, a sulfonic acid group, a carbonate group, a carbamate group, a hydroxy group, a sulfoxide group, a sulfonyl group, a ketone group, an imide group, an amide group, a sulfonimide group, a cyano group, a nitro group, and an ether group.

4. The actinic ray-sensitive or radiation-sensitive resin composition according to claim 1, wherein $L^p$ represents —CO—O—, —CO—, —$NR^{L1}$—, a divalent aromatic group, or a divalent linking group formed by combination thereof, provided that $R^{L1}$ represents a hydrogen atom or a monovalent organic group.

5. The actinic ray-sensitive or radiation-sensitive resin composition according to claim 1, wherein $M^p$ represents a single bond or an alkylene group having 1 to 5 carbon atoms.

6. The actinic ray-sensitive or radiation-sensitive resin composition according to claim 1, wherein the repeating unit represented by General Formula (P1) is a repeating unit represented by General Formula (P2) or (P3), (P2)

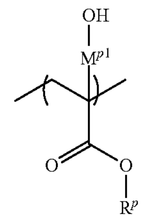

in General Formula (P2), $M^{p1}$ represents a single bond or an alkylene group having 1 to 5 carbon atoms, and $R^p$ represents a monovalent organic group, (P3)

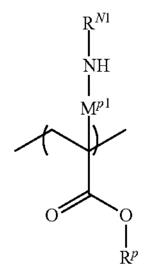

in General Formula (P3), $M^{p1}$ represents a single bond or an alkylene group having 1 to 5 carbon atoms, $R^p$ represents a monovalent organic group, and $R^{N1}$ represents a hydrogen atom or a monovalent organic group.

7. The actinic ray-sensitive or radiation-sensitive resin composition according to claim 6, wherein $R^p$ is represented by General Formula (RP-1) or (RP-2), (RP-1)

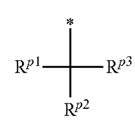

in General Formula (RP-1), $R^{p1}$ to $R^{p3}$ each independently represent an alkyl group, a cycloalkyl group, or an aryl group, any two of $R^{p1}$, $R^{p2}$, or $R^{p3}$ may be bonded to each other to form a ring structure, and

*represents a bonding site to the oxygen atom to which $R^p$ is bonded, (RP-2)

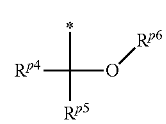

in General Formula (RP-2), $R^{p4}$ and $R^{p5}$ each independently represent a hydrogen atom, an alkyl group, or a cycloalkyl group, $R^{p6}$ represents an alkyl group or a cycloalkyl group, any two of $R^{p4}$, $R^{p5}$, or $R^{p6}$ may be bonded to each other to form a ring structure, and

*represents a bonding site to the oxygen atom to which $R^p$ is bonded.

8. The actinic ray-sensitive or radiation-sensitive resin composition according to claim 1, wherein the resin P further includes a repeating unit K1 having an acid-decomposable group, which is different from the repeating unit represented by General Formula (P1).

9. The actinic ray-sensitive or radiation-sensitive resin composition according to claim 1, wherein the resin P further includes a repeating unit K2 having a polar group, which is different from the repeating unit represented by General Formula (P1).

10. The actinic ray-sensitive or radiation-sensitive resin composition according to claim 1, further comprising at least one of:

a basic compound (DA);

a basic compound (DB) having basicity that is reduced or lost upon irradiation with actinic rays or radiation;

a compound (DC) that generates an acid having a pKa of 1.00 or more higher than the acid generated from the photoacid generator Aw;

a compound (DD) having a nitrogen atom and having a group that is eliminated by an action of an acid; or an onium salt compound (DE) having a nitrogen atom in a cationic moiety.

11. A resist film formed of the actinic ray-sensitive or radiation-sensitive resin composition according to claim 1.

12. A pattern forming method, comprising:

forming a resist film on a support using the actinic ray-sensitive or radiation-sensitive resin composition according to claim 1;

exposing the resist film; and developing the exposed resist film with a developer.

13. A method for manufacturing an electronic device, the method comprising the pattern forming method according to claim 12.

* * * * *